(12) United States Patent
Chiou et al.

(10) Patent No.: US 12,463,108 B2
(45) Date of Patent: Nov. 4, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Wen-Chih Chiou, Miaoli County (TW); Ping-Yin Hsieh, Hsinchu (TW); Ying-Ching Shih, Hsinchu (TW); Pu Wang, Hsinchu (TW); Li-Hui Cheng, New Taipei (TW); Yi-Huan Liao, Hsinchu (TW); Chih-Hao Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 741 days.

(21) Appl. No.: 17/738,014

(22) Filed: May 6, 2022

(65) Prior Publication Data
US 2023/0021005 A1   Jan. 19, 2023

Related U.S. Application Data

(60) Provisional application No. 63/223,054, filed on Jul. 18, 2021.

(51) Int. Cl.
*H01L 23/367* (2006.01)
*H01L 21/48* (2006.01)
(Continued)

(52) U.S. Cl.
CPC ...... *H01L 23/3675* (2013.01); *H01L 21/4882* (2013.01); *H01L 25/0655* (2013.01); *H01L 23/3736* (2013.01); *H01L 23/49816* (2013.01); *H01L 23/49822* (2013.01); *H01L 23/49833* (2013.01); *H01L 23/49838* (2013.01); *H01L 24/13* (2013.01); *H01L 24/16* (2013.01); *H01L 24/32* (2013.01); *H01L 24/73* (2013.01); *H01L 2224/13017* (2013.01);
(Continued)

(58) Field of Classification Search
None
See application file for complete search history.

(56) References Cited

U.S. PATENT DOCUMENTS 9,000,584 B2   4/2015   Lin et al.
9,048,222 B2   6/2015   Hung et al.
(Continued)

FOREIGN PATENT DOCUMENTS

TW   202145461   12/2021

OTHER PUBLICATIONS

"Office Action of Taiwan Counterpart Application", issued on Jun. 26, 2023, p. 1-p. 6.

*Primary Examiner* — Kyoung Lee
(74) *Attorney, Agent, or Firm* — JCIPRNET

(57) ABSTRACT

A semiconductor device includes a substrate, a package structure, a thermal interface material (TIM) structure, and a lid structure. The package structure is disposed on the substrate. The TIM structure is disposed on the package structure. The TIM structure includes a metallic TIM layer and a non-metallic TIM layer in contact with the metallic TIM layer, and the non-metallic TIM layer surrounds the metallic TIM layer. The lid structure is disposed on the substrate and the TIM structure.

20 Claims, 72 Drawing Sheets

(51) Int. Cl.
*H01L 23/00* (2006.01)
*H01L 25/065* (2023.01)
*H01L 23/373* (2006.01)
*H01L 23/498* (2006.01)

(52) U.S. Cl.
CPC ............ *H01L 2224/13019* (2013.01); *H01L 2224/13553* (2013.01); *H01L 2224/13582* (2013.01); *H01L 2224/16227* (2013.01); *H01L 2224/16238* (2013.01); *H01L 2224/32225* (2013.01); *H01L 2224/73204* (2013.01); *H01L 2924/1431* (2013.01); *H01L 2924/1434* (2013.01); *H01L 2924/1611* (2013.01); *H01L 2924/1616* (2013.01); *H01L 2924/16251* (2013.01); *H01L 2924/1632* (2013.01); *H01L 2924/182* (2013.01); *H01L 2924/3511* (2013.01); *H01L 2924/35121* (2013.01); *H01L 2924/37001* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2003/0067070 A1* | 4/2003 | Kwon ................ H01L 23/36 257/E23.101 |
| 2020/0161275 A1 | 5/2020 | Lin et al. |
| 2021/0020538 A1* | 1/2021 | Chen ................ H01L 23/552 |

* cited by examiner

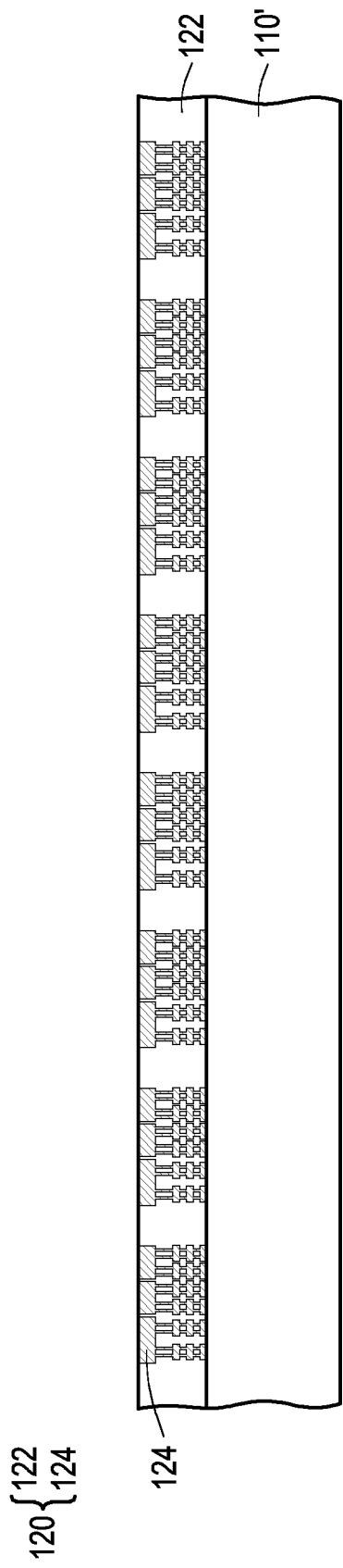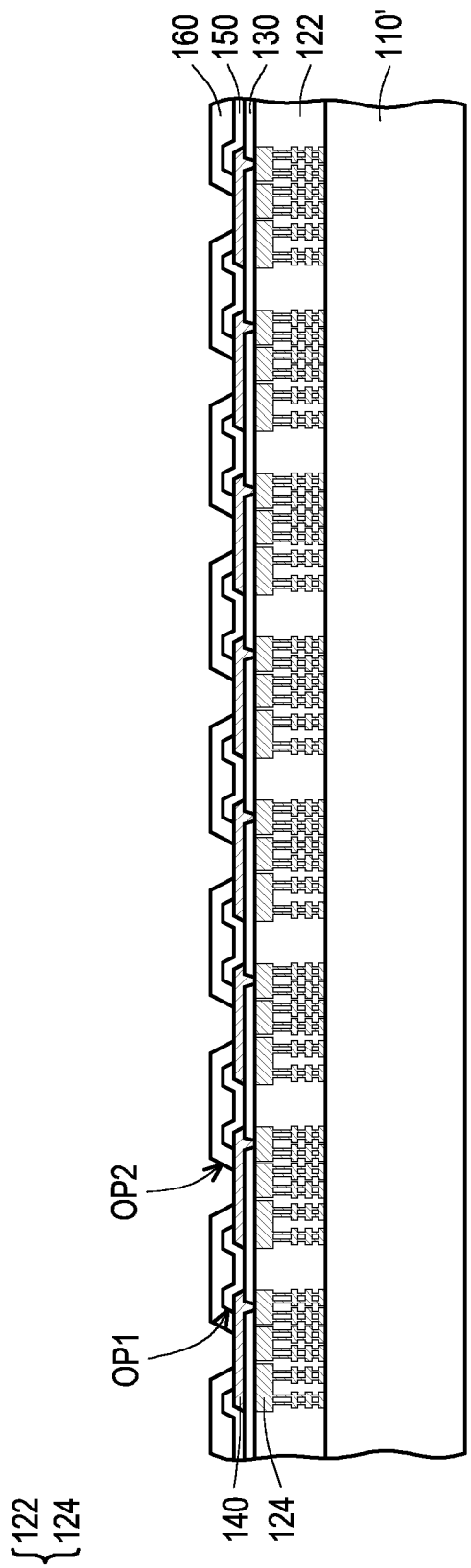

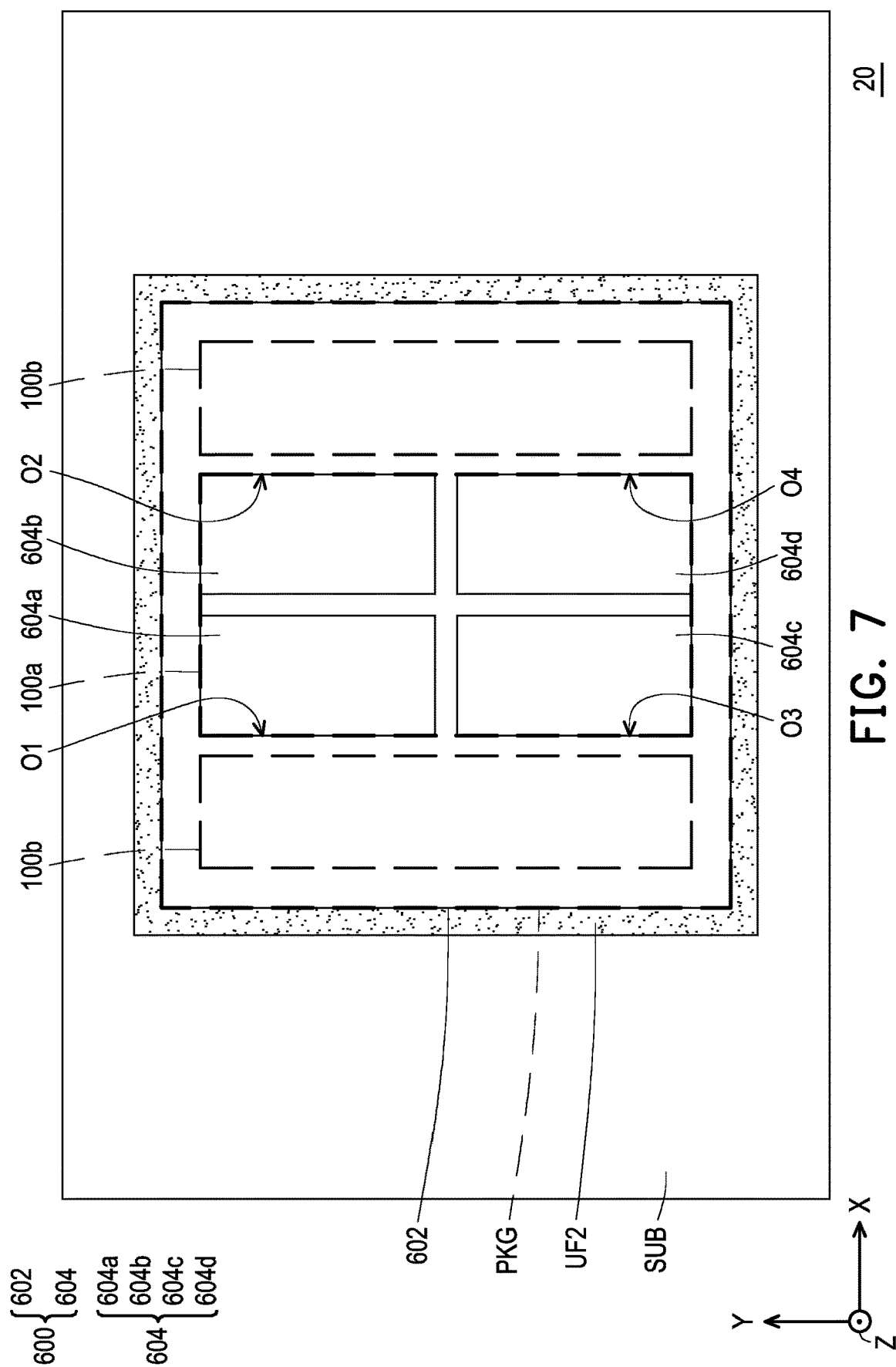

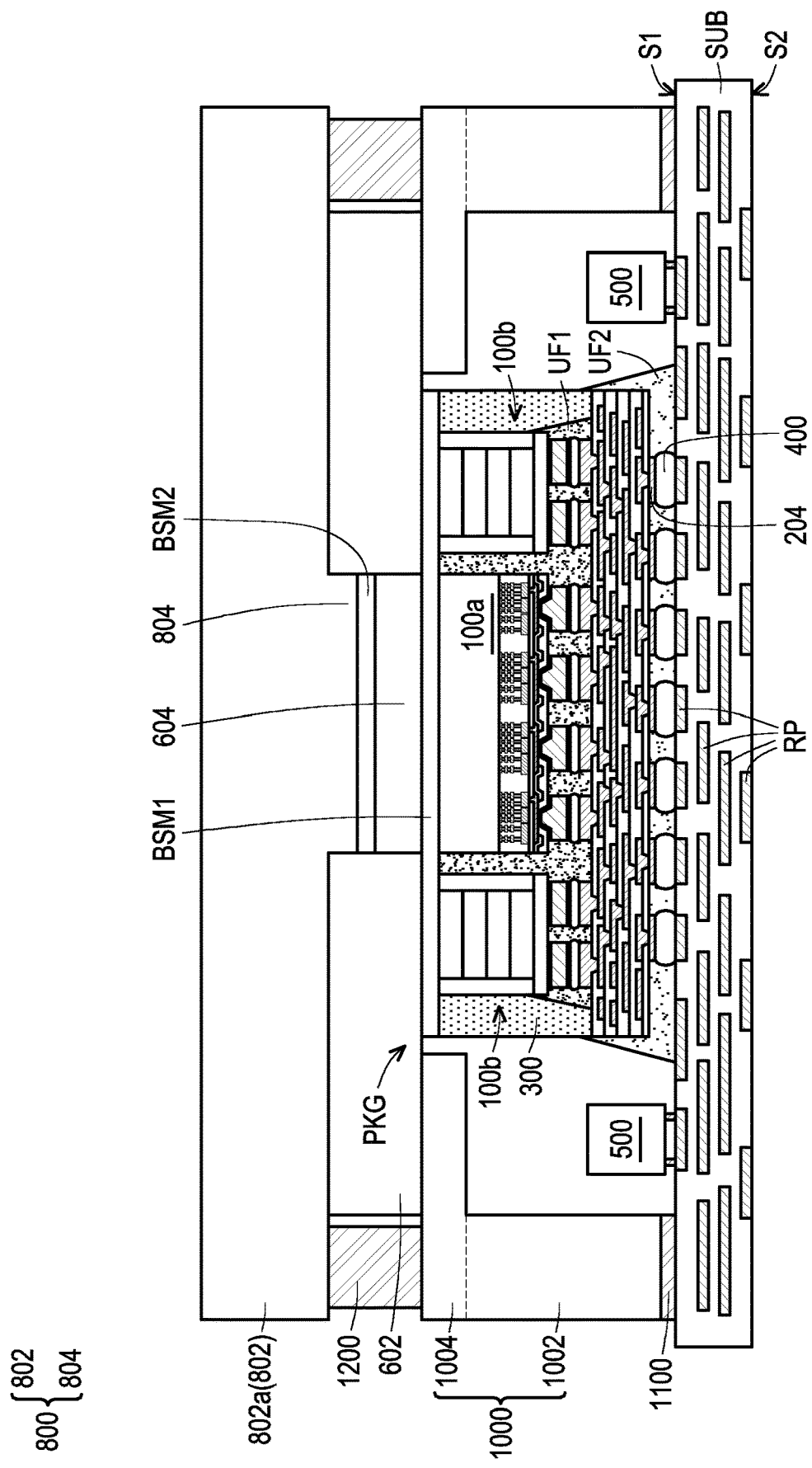

SEMICONDUCTOR DEVICE AND MANUFACTURING METHOD THEREOF

CROSS-REFERENCE TO RELATED APPLICATION

This application claims the priority benefits of U.S. provisional application Ser. No. 63/223,054, filed on Jul. 18, 2021. The entirety of the above-mentioned patent application is hereby incorporated by reference herein and made a part of this specification.

BACKGROUND

The semiconductor integrated circuit (IC) industry has experienced rapid growth. Over the course of this growth, functional density of the devices has generally increased by the device feature size. This scaling down process generally provides benefits by increasing production efficiency, lower costs, and/or improving performance. Such scaling down has also increased the complexities of processing and manufacturing IC. For these advances to be realized, developments in IC fabrication are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1H are schematic cross-sectional views illustrating a manufacturing process of a semiconductor die in accordance with some embodiments of the disclosure.

FIG. 7 is a simplified top view of a semiconductor device in accordance with some alternative embodiments of the disclosure.

FIG. 8A to FIG. 8E are schematic cross-sectional views illustrating a manufacturing process of a semiconductor device in accordance with some alternative embodiments of the disclosure.

DETAILED DESCRIPTION

Figure 1C:
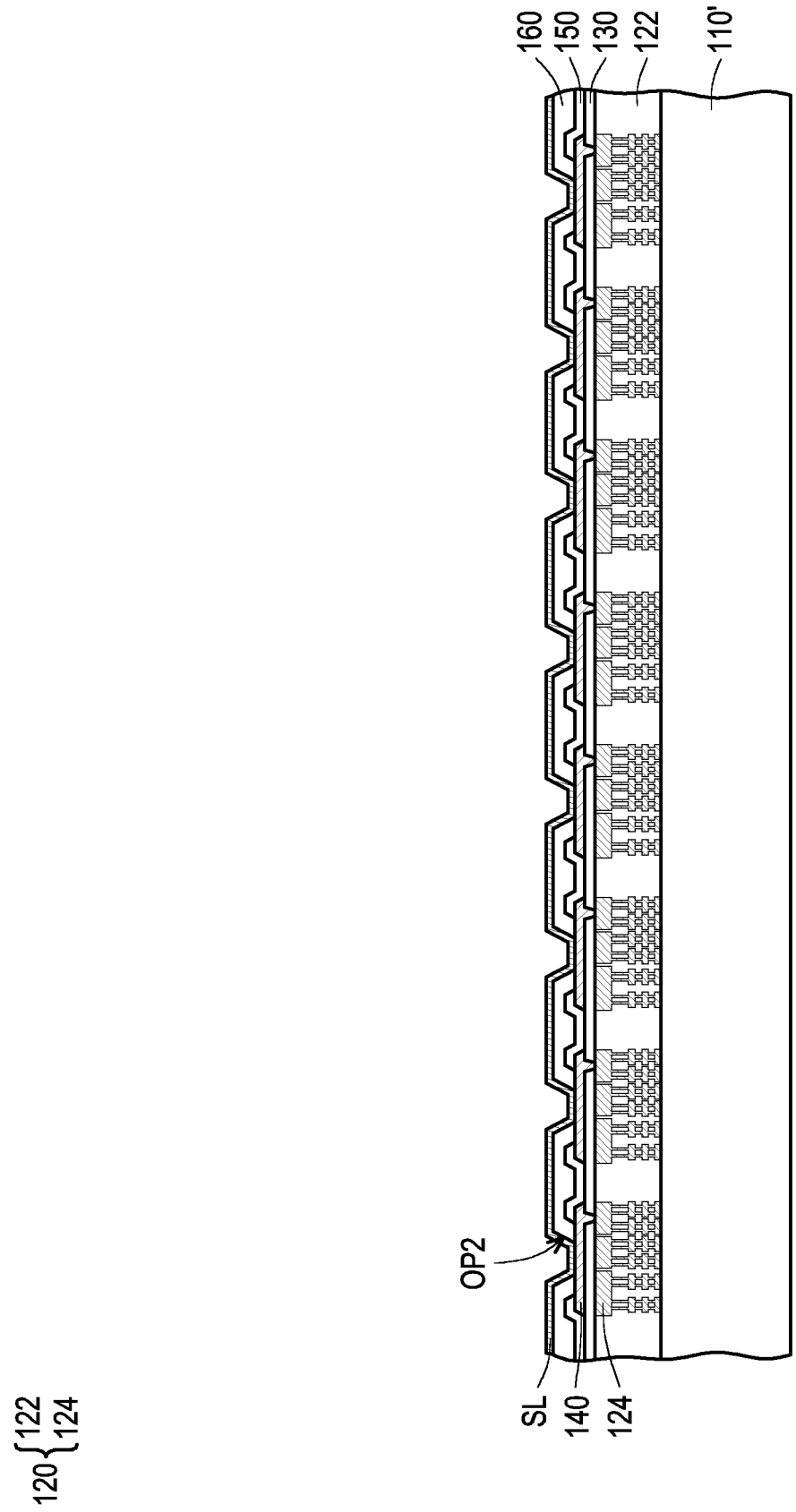

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views illustrating a manufacturing process of a semiconductor die 100a in accordance with some embodiments of the disclosure. Referring to FIG. 1A, a semiconductor wafer 110' is provided. In some embodiments, the semiconductor wafer 110' is made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor wafer 110' has active components (e.g., transistors or the like) and passive components (e.g., resistors, capacitors, inductors, or the like) formed therein.

In some embodiments, an interconnection structure 120 is formed on the semiconductor wafer 110'. In some embodiments, the interconnection structure 120 includes an inter-dielectric layer 122 and a plurality of patterned conductive layers 124. For simplicity, the inter-dielectric layer 122 is illustrated as a bulky layer in FIG. 1A, but it should be understood that the inter-dielectric layer 122 may be constituted by multiple dielectric layers. The patterned conductive layers 124 and the dielectric layers of the inter-dielectric layer 122 are stacked alternately. In some embodiments, two vertically adjacent patterned conductive layers 124 are electrically connected to each other through conductive vias sandwiched therebetween.

In some embodiments, the material of the inter-dielectric layer 122 includes polyimide, epoxy resin, acrylic resin, phenol resin, benzocyclobutene (BCB), polybenzoxazole (PBO), or other suitable polymer-based dielectric materials. The inter-dielectric layer 122 may be formed by suitable fabrication techniques, such as spin-on coating, chemical vapor deposition (CVD), plasma-enhanced chemical vapor deposition (PECVD), or the like. In some embodiments, the material of the patterned conductive layers 124 includes aluminum, titanium, copper, nickel, tungsten, and/or alloys thereof. The patterned conductive layers 124 may be formed by electroplating, deposition, and/or photolithography and etching. It should be noted that the number of the patterned conductive layers 124 and the dielectric layers in the inter-dielectric layer 122 shown in FIG. 1A is merely an exemplary illustration, and the disclosure is not limited. In some alternative embodiments, the number of the patterned conductive layers 124 and the number of the dielectric layers in the inter-dielectric layer 122 may be adjusted depending on the routing requirements.

Referring to FIG. 1B, a dielectric layer 130 is formed over the interconnection structure 120. In some embodiments, the material of the dielectric layer 130 includes polyimide, epoxy resin, acrylic resin, phenol resin, BCB, PBO, or any other suitable polymer-based dielectric material. The dielectric layer 130 may be formed by suitable fabrication techniques, such as spin-on coating, CVD, PECVD, or the like. In some embodiments, a plurality of openings is formed in the dielectric layer 130 to expose portions of the topmost patterned conductive layer 124. After the openings are formed, a plurality of conductive pads 140 is formed over the dielectric layer 130. For example, the conductive pads 140 are formed over the semiconductor wafer 110' and the interconnection structure 120, such that the interconnection structure 120 is located between the semiconductor wafer 110' and the conductive pads 140. In some embodiments, the locations of the conductive pads 140 correspond to the locations of the openings of the dielectric layer 130. For example, the conductive pads 140 extend into the openings of the dielectric layer 130 to render electrical connection between the conductive pads 140 and portions of the interconnection structure 120 (i.e., the patterned conductive layer 124). In some embodiments, the conductive pads 140 are aluminum pads, copper pads, or other suitable metal pads. The number and the shape of the conductive pads 140 may be selected based on demand.

After the conductive pads 140 are distributed over the dielectric layer 130, a passivation layer 150 and a post-passivation layer 160 are sequentially formed over the dielectric layer 130 and the conductive pads 140. In some embodiments, the passivation layer 150 has a plurality of contact openings OP1 which partially exposes the conductive pads 140. In some embodiments, the passivation layer 150 is a silicon oxide layer, a silicon nitride layer, a silicon oxy-nitride layer, or a dielectric layer formed by other suitable dielectric materials. As illustrated in FIG. 1B, the post-passivation layer 160 covers the passivation layer 150 and has a plurality of contact openings OP2. The conductive pads 140 are partially exposed by the contact openings OP2 of the post-passivation layer 160. In some embodiments, the post-passivation layer 160 is a polyimide layer, a PBO layer, or a dielectric layer formed by other suitable polymers. It should be noted that the post-passivation layer 160 may be optional in some embodiments.

Referring to FIG. 1C, after forming the post-passivation layer 160, a seed layer SL is conformally formed on the post-passivation layer 160. For example, at least a portion of the seed layer SL extends into the contact openings OP2 of the passivation layer 160 to be in physical with the conductive pads 140. The seed layer SL may be formed through a sputtering process, a physical vapor deposition (PVD) process, or the like. In some embodiments, the seed layer SL is constituted by two sub-layers (not shown). In such embodiments, the first sub-layer may include titanium, titanium nitride, tantalum, tantalum nitride, other suitable materials, or a combination thereof, and the second sub-layer may include copper, copper alloys, or other suitable choice of materials.

Figure 1D:
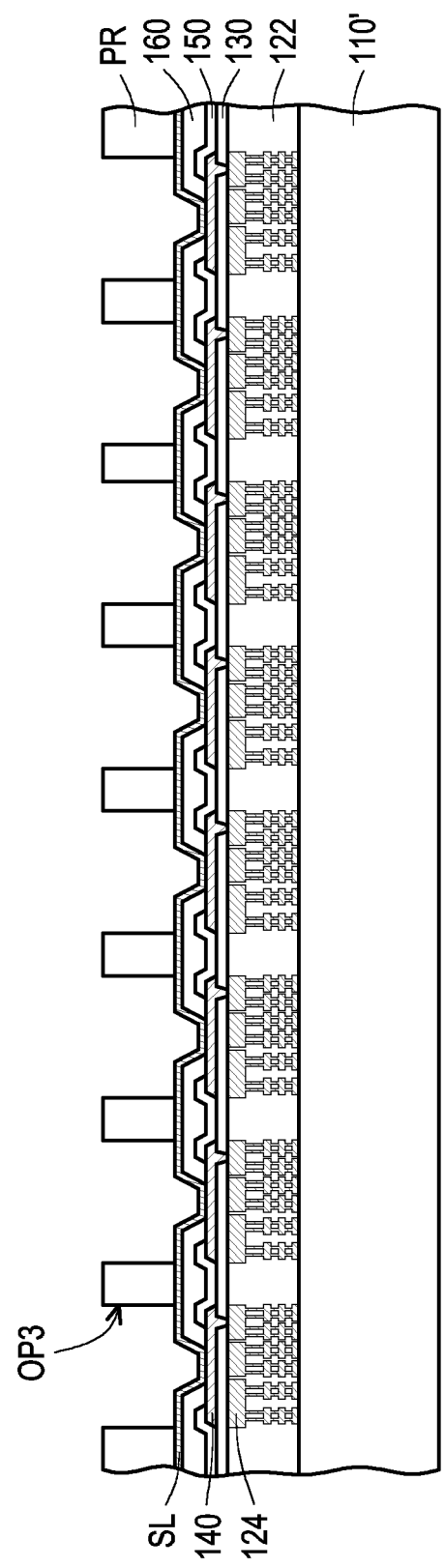

Referring to FIG. 1D, a patterned photoresist layer PR is formed over the seed layer SL. In some embodiments, the patterned photoresist layer PR is made of a photosensitive material. In some embodiments, the patterned photoresist layer PR has a plurality of openings OP3 partially exposing the seed layer SL above the contact pads 140. For example, the openings OP3 expose the seed layer SL located directly above the contact pads 140.

Figure 1E:
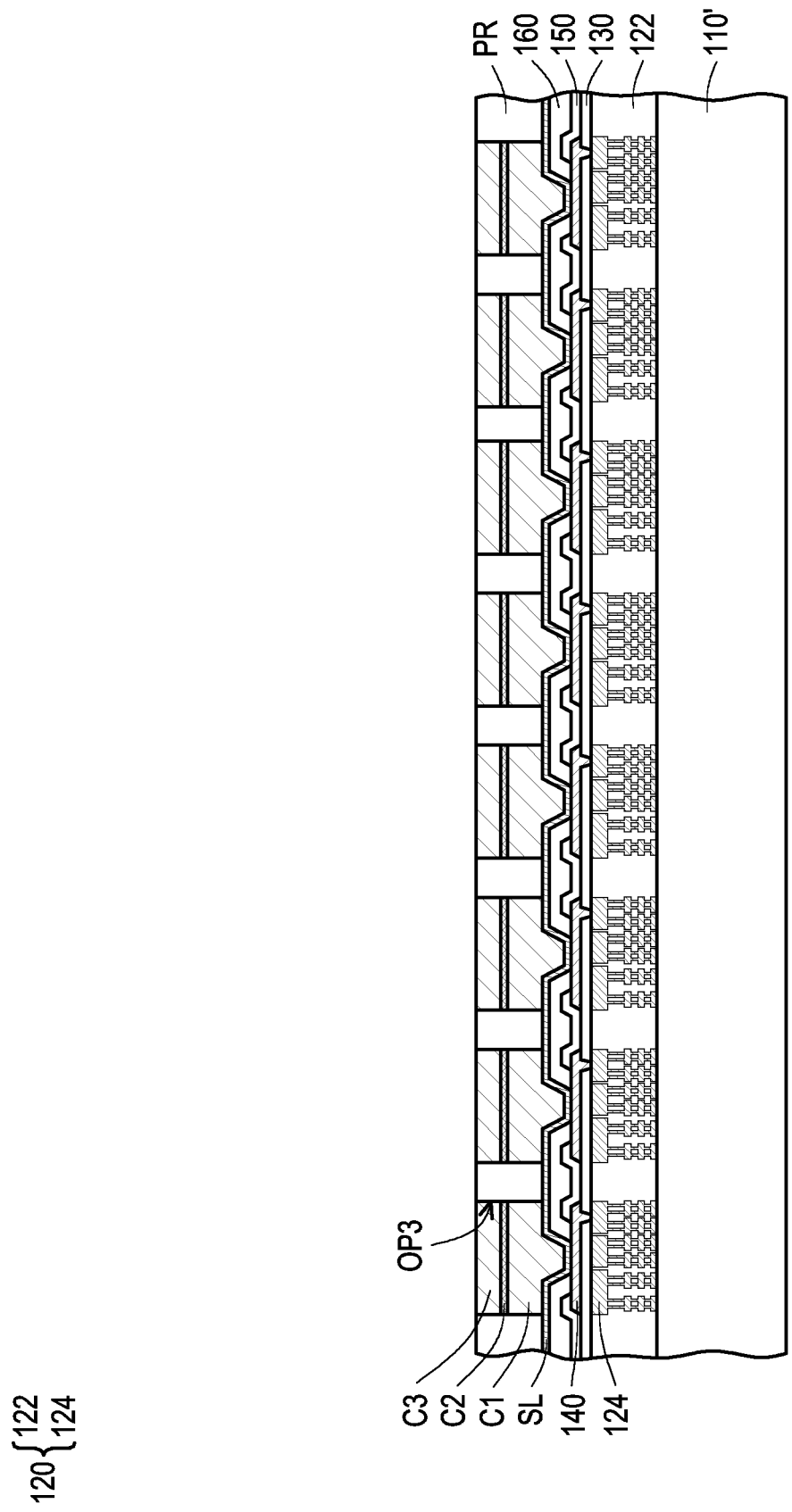

Referring to FIG. 1E, a first conductive layer C1, a second conductive layer C2, and a third conductive layer C3 are sequentially deposited onto the exposed seed layer SL. For example, the first conductive layer C1, the second conductive layer C2, and the third conductive layer C3 are filled into the openings OP3 of the patterned photoresist layer PR. In some embodiments, the first conductive layer C1, the second conductive layer C2, and the third conductive layer C3 are formed through the same technique. However, the disclosure is not limited thereto. In some alternative embodiments, the first conductive layer C1, the second conductive layer C2, and the third conductive layer C3 may be formed by different techniques. In some embodiments, the first conductive layer C1, the second conductive layer C2, and the third conductive layer C3 are formed through a plating process. The plating process is, for example, an electroplating process, an electroless-plating process, an immersion plating process, or the like. In some embodiments, the materials of the first conductive layer C1, the second conductive layer C2, and the third conductive layer C3 are different. For example, the first conductive layer C1 is made of aluminum, titanium, copper, tungsten, and/or alloys thereof; the second conductive layer C2 is made of nickel; and the third conductive layer C3 is made of solder. In some embodiments, a solder flux (not shown) may be applied onto the third conductive layer C3 for better adhesion. In some embodiments, the thickness of the first conductive layer C1 is greater than the thickness of the second conductive layer C2 and the thickness of the third conductive layer C3. And, the thickness of third conductive layer C3 is greater than the thickness of the second conductive layer C2.

Figure 1F:
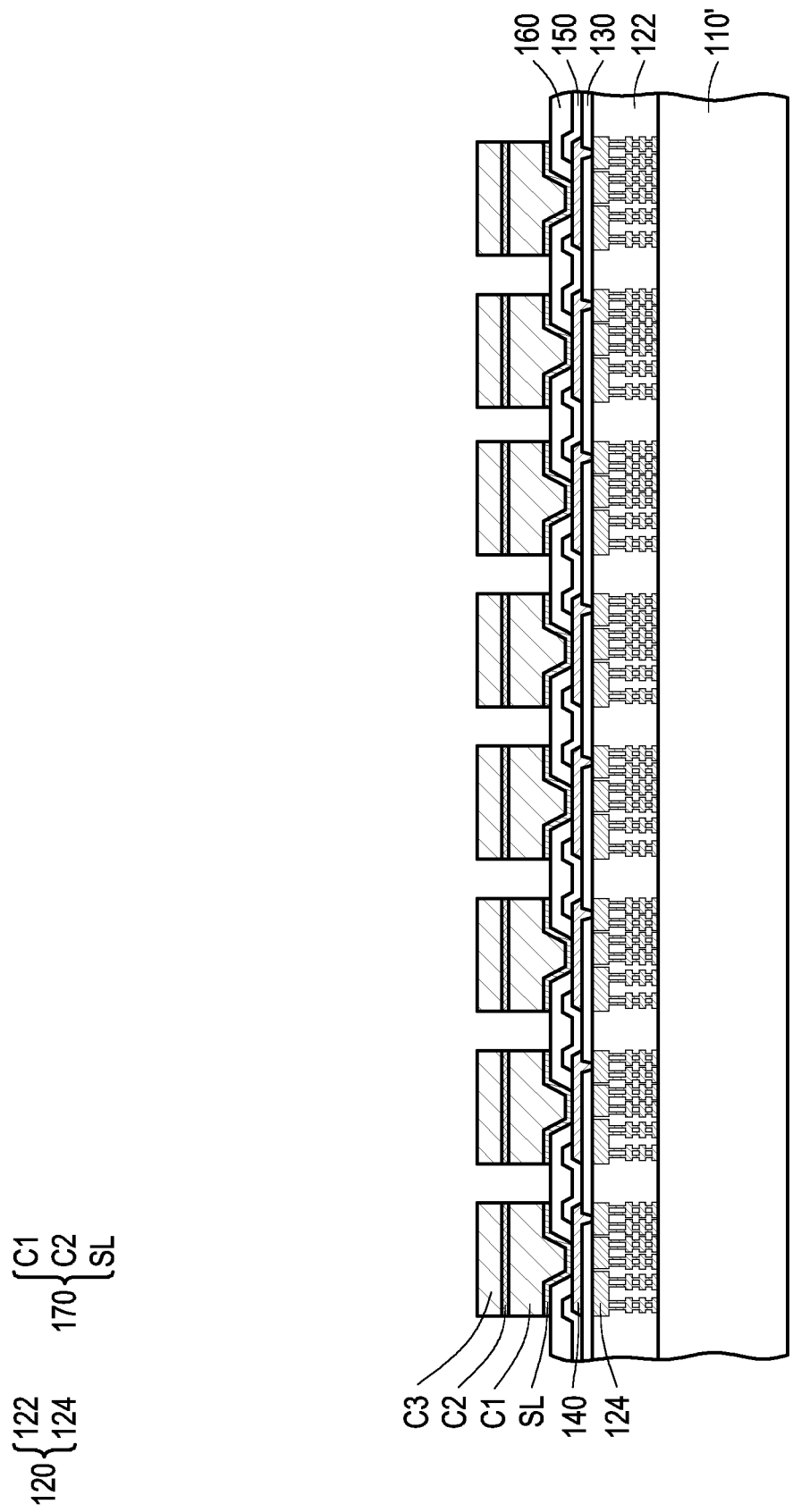

Referring to FIG. 1E and FIG. 1F, the patterned photoresist layer PR is removed. The patterned photoresist layer PR may be removed through an etching process, a stripping process, an ashing process, a combination thereof, or the like. Thereafter, by using the first conductive layer C1, the second conductive layer C2, and the third conductive layer C3 as hard masks, the seed layer SL that is uncovered by the first conductive layer C1, the second conductive layer C2, and the third conductive layer C3 is removed. In some embodiments, portions of the seed layer SL are removed through an etching process. After removal of portions of the seed layer SL, the remaining seed layer SL is located directly underneath the first conductive layer C1. That is to say, the seed layer SL is sandwiched between the contact pads 140 and the first conductive layer C1. In some embodiments, the remaining seed layer SL, the first conductive layer C1, and the second conductive layer C2 are collectively referred to as conductive posts 170.

Figure 1G:
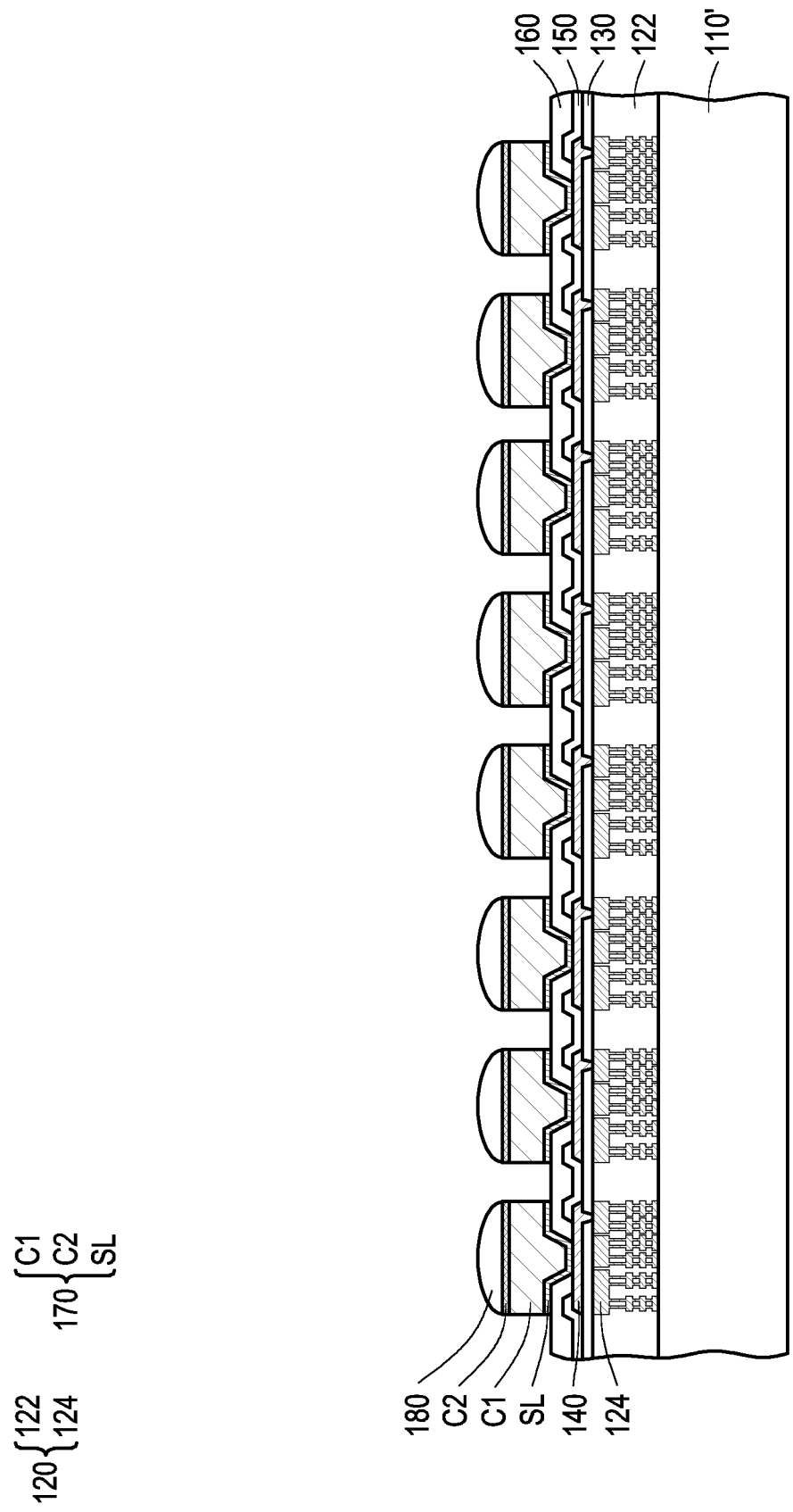

Referring to FIG. 1F and FIG. 1G, a reflow process is performed on the third conductive layer C3 to transform the third conducive layer C3 into conductive terminals 180. That is to say, the conductive terminals 180 are formed on the conductive posts 170. In some embodiments, the third conductive layer C3 is reshaped during the reflow process to form hemispherical conductive terminals 180.

Figure 1H:
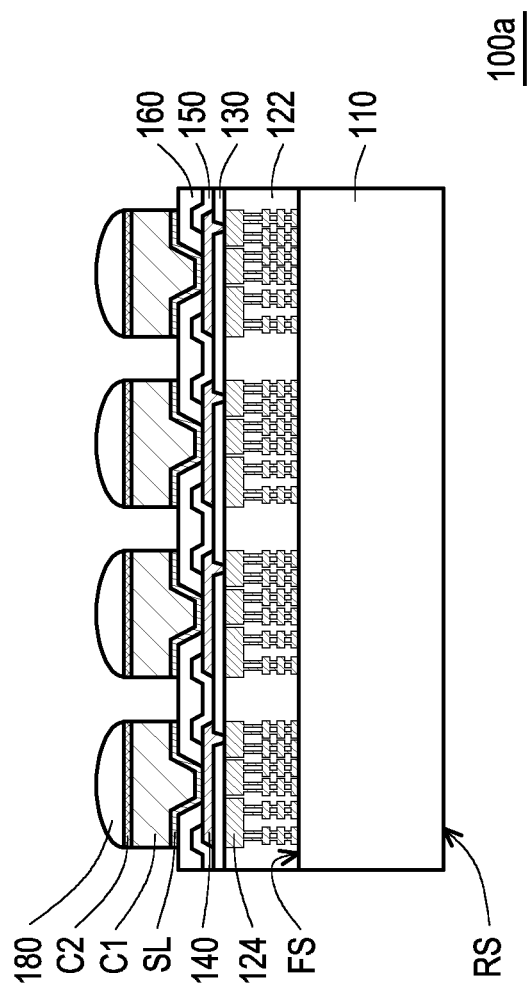

Referring to FIG. 1G and FIG. 1H, the structure illustrated in FIG. 1G is singulated to render a plurality of semiconductor dies 100a shown in FIG. 1H. In some embodiments, the singulation process typically involves dicing with a rotation blade and/or a laser beam. In other words, the singulation process includes a laser cutting process, a mechanical cutting process, a laser grooving process, other suitable processes, or a combination thereof. For example, a laser grooving process may be performed on the structure illustrated in FIG. 1G to form trenches (not shown) in the said structure. Thereafter, a mechanical cutting process may be performed on the locations of the trenches to cut through the said structure, so as to divide the semiconductor wafer 110' into semiconductor substrates 110 and to obtain the semiconductor dies 100a.

As illustrated in FIG. 1H, the semiconductor die 100a includes the semiconductor substrate 110, the interconnection structure 120, the dielectric layer 130, the conductive pads 140, the passivation layer 150, the post-passivation layer 160, the conductive posts 170, and the conductive terminals 180. In some embodiments, the semiconductor substrate 110 has a front surface FS and a rear surface RS opposite to the front surface FS. The interconnection structure 120 is disposed on the front surface FS of the semiconductor substrate 110. The dielectric layer 130, the conductive pads 140, the passivation layer 150, and the post-passivation layer 160 are sequentially disposed over the interconnection structure 120. The conductive posts 170 are disposed over the post-passivation layer 160 and are electrically connected to the conductive pads 140. The conductive terminals 180 are disposed on the conductive posts 170.

Further, as shown in FIG. 1H, although four conductive posts 170 and four conductive terminals 180 are presented in the semiconductor die 100a for illustrative purposes, those skilled in the art can understand that the number of the conductive posts 170 and the number of the conductive terminals 180 may be more than or less than what is depicted in FIG. 1H, and may be designated based on demand and/or design layout.

In some embodiments, the semiconductor die 100a is capable of performing logic functions. For example, the semiconductor die 100a may include or be a Central Process Unit (CPU) die, a Graphic Process Unit (GPU) die, a Field-Programmable Gate Array (FPGA), system-on-a-chip (SoC), or the like. In some embodiments, the semiconductor die 100a may be utilized in a package structure. For example, the semiconductor die 100a may be assembled with other components to form a package structure. The manufacturing process of the package structure utilizing the semiconductor die 100a will be described below.

FIG. 2A to FIG. 2F are schematic cross-sectional views illustrating a manufacturing process of a package structure PKG in accordance with some embodiments of the disclosure. FIG. 3 is a simplified top view of the package structure PKG in FIG. 2F. For simplicity and clarity of illustration, some elements are omitted in the simplified top view of FIG. 3, and these elements might not be located in the same plane.

Figure 2A:
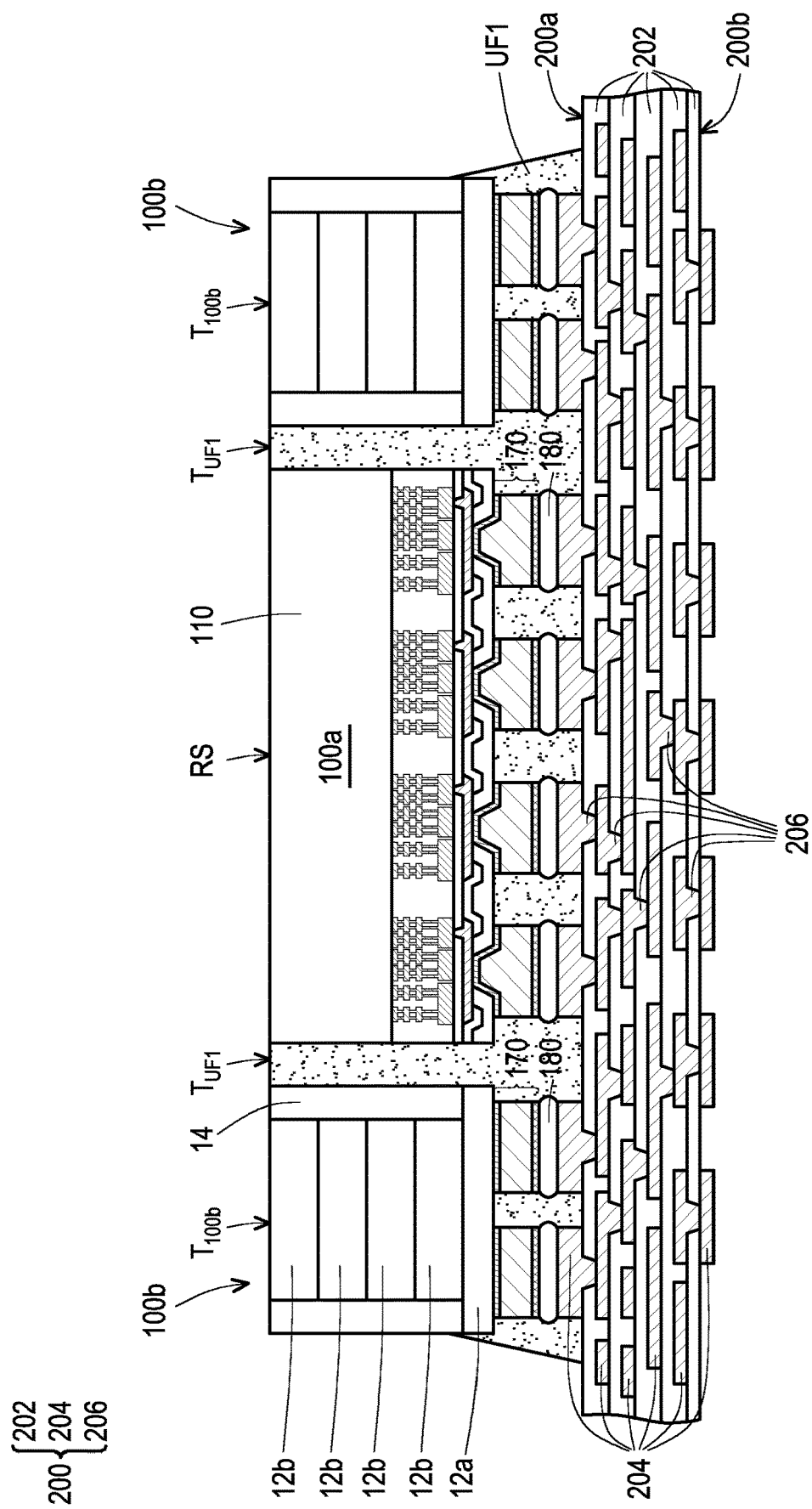
FIG. 2A to FIG. 2F are schematic cross-sectional views illustrating a manufacturing process of a package structure in accordance with some embodiments of the disclosure.
Figure 3:
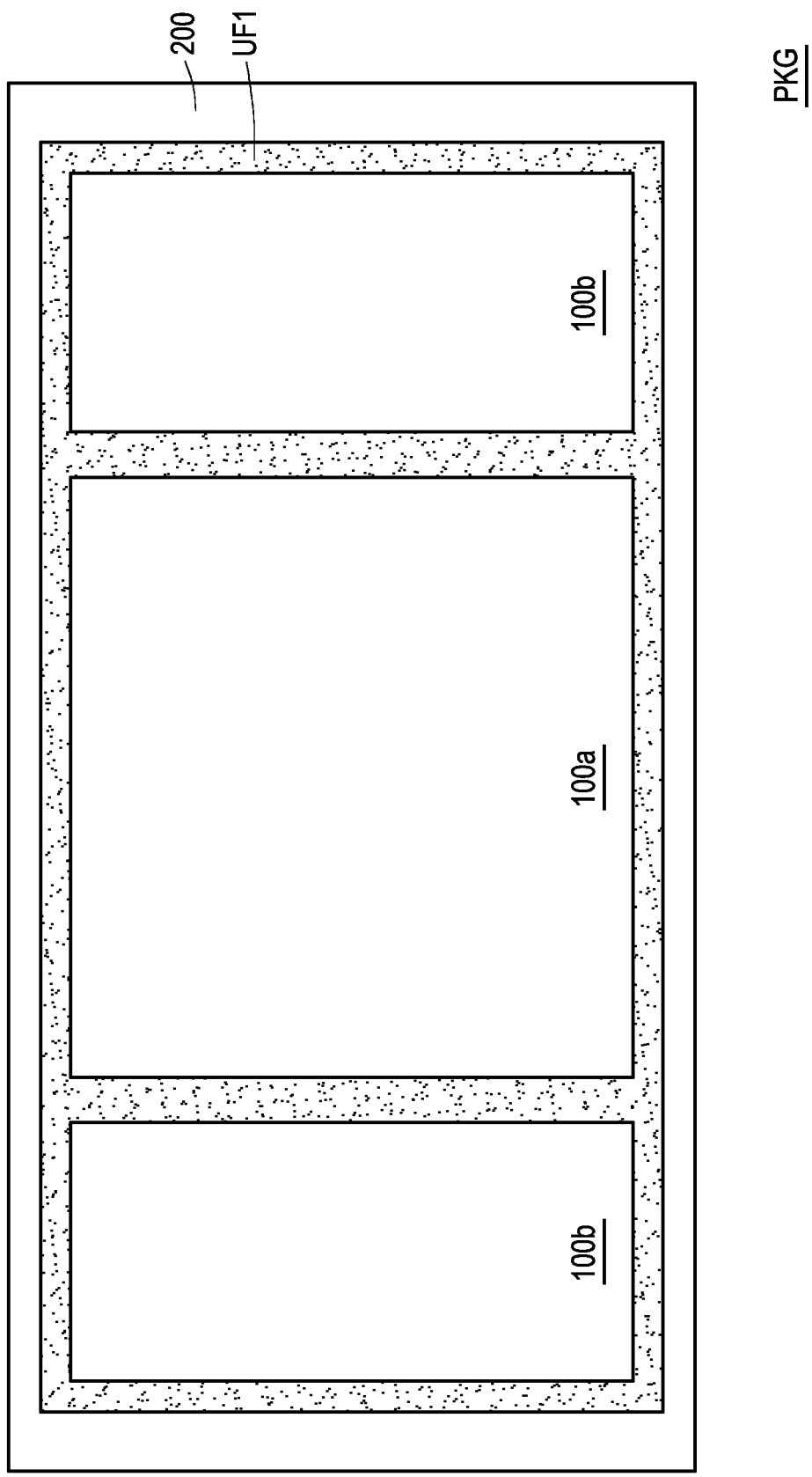
FIG. 3 is a simplified top view of the package structure in FIG. 2F.

Referring to FIG. 2A, an interposer 200 is provided. In some embodiments, the interposer 200 includes a plurality of dielectric layers 202, a plurality of conductive pattern layers 204, and a plurality of conductive vias 602. In some embodiments, the dielectric layers 202 and the conductive pattern layers 204 are stacked alternately. In some embodiments, the conductive vias 602 are embedded in the dielectric layers 202. In some embodiments, the conductive pattern layers 204 are interconnected with one another through the conductive vias 602. For example, the conductive vias 602 penetrate through the dielectric layers 202 to connect the conductive pattern layers 204. In some embodiments, each conductive pattern layer 204 includes a plurality of conductive patterns serving as redistribution wirings. In some embodiments, the conductive patterns of the outermost conductive pattern layers 204 (i.e., the topmost conductive pattern layer 204 and the bottommost conductive pattern layer 204) shown in FIG. 2A are referred to as under-ball metallurgy (UBM) patterns for ball mount. In some embodiments, the conductive pattern layers 204 transmit signals horizontally and the conductive vias 602 transmit signals vertically.

In some embodiments, the material of the dielectric layers 202 includes polyimide, epoxy resin, acrylic resin, phenolic resin, BCB, PBO, or any other suitable polymer-based dielectric material. In some embodiments, the dielectric layers 202 include resin mixed with filler. The dielectric layers 202 may be formed by suitable fabrication techniques, such as film lamination, spin-on coating, CVD, PECVD, or the like. In some embodiments, the material of the conductive pattern layers 204 and the conductive vias 602 includes aluminum, titanium, copper, nickel, tungsten, or alloys thereof. The conductive pattern layers 204 and the conductive vias 602 may be formed by electroplating, deposition, and/or photolithography and etching. In some embodiments, the conductive pattern layers 204 and the underlying conductive vias 602 are formed simultaneously. It should be noted that the number of the dielectric layers 202, the number of the conductive pattern layers 204, and the number of the conductive vias 602 illustrated in FIG. 2A are merely for illustrative purposes, and the disclosure is not limited thereto. In some alternative embodiments, fewer or more layers of the dielectric layers 202, the conductive pattern layers 204, and the conductive vias 602 may be formed depending on the circuit design.

In some embodiments, the interposer 200 has a first surface 200a and a second surface 200b opposite to the first surface 200a. The topmost conductive pattern layer 204 is exposed at the first surface 200a and the bottommost conductive pattern layer 204 is exposed at the second surface 200b. In some embodiments, the interposer 200 is a silicon-free substrate. In some embodiments, the interposer 200 is referred to an "organic interposer". The organic interposer is beneficial to reduce the total process cost of the package structure since the organic interposer is a low-cost interposer. In some embodiments, the critical dimension (e.g., line width or space width) of the organic interposer is closer to the critical dimension of at least one of the semiconductor chips.

Continue referring to FIG. 2A, at least one semiconductor die 100a shown in FIG. 1H and at least one semiconductor die 100b are bonded to the first surface 200a of the interposer 200. As shown in FIG. 2A and FIG. 3, two semiconductor dies 100b each are disposed aside and around one semiconductor die 100a. However, the disclosure is not limited thereto. Those skilled in the art can understand that the number of the semiconductor die 100a may be more than what is depicted in FIG. 2A and FIG. 3, the number of the semiconductor die 100b may be more than or less than what is depicted in FIG. 2A and FIG. 3, and may be designated based on demand and/or design layout. In some alternative embodiments, when more than one semiconductor die 100a and more than two semiconductor dies 100b are bonded to the interposer 200, the semiconductor dies 100b are disposed around each of the semiconductor dies 100a. In some embodiments, more than one identical semiconductor die 100a are bonded to the interposer 200. However, the disclosure is not limited thereto. In some alternative embodiments, different semiconductor dies 100a may be bonded to the interposer 200.

Further, as shown in FIG. 2A, the semiconductor die 100a and the semiconductor dies 100b are bonded to the first surface 200a of the interposer 200 through flip chip bonding. That is, each of the semiconductor die 100a and the semiconductor dies 100b is upside down, so that the conductive terminals 180 of each of the semiconductor die 100a and the semiconductor dies 100b face toward the interposer 200. In detail, as shown in FIG. 2A, the semiconductor die 100a and the semiconductor dies 100b are attached to the interposer 200 through the conductive terminals 180. For example, the conductive terminals 180 of the semiconductor die 100a and the semiconductor dies 100b are in physical contact with the topmost conductive pattern layer 204 exposed at the first surface 200a of the interposer 200 to render electrical connection between the semiconductor die 100a and the interposer 200 and electrical connection between the semiconductor dies 100b and the interposer 200. In some embodiments, after the conductive terminals 180 are attached to the topmost conductive pattern layer 204 of the interposer 200, a reflow process is performed to reshape the conductive terminals 180. Further, as shown in FIG. 2A, although two conductive posts 170 and two conductive terminals 180 are presented in the semiconductor die 100b for illustrative purposes, those skilled in the art can understand that the number of the conductive posts 170 and the number of the conductive terminals 180 of the semiconductor die 100b may be more than or less than what is depicted in FIG. 2A, and may be designated based on demand and/or design layout.

In some embodiments, the semiconductor die 100b is a memory die. For example, as shown in FIG. 2A, the semiconductor die 100b may include or be a high bandwidth memory (HBM) die or a hybrid memory cube (HMC) die. In such embodiments, as shown in FIG. 2A, the semiconductor die 100b includes a logic die 12a, a stack of memory dies disposed on the logic die 12a, and an encapsulant 14 laterally encapsulates the stack of memory dies, wherein the stack of memory dies includes a plurality of memory dies 12b. The number of the memory dies 12b may be less than or more than what is depicted in FIG. 2A, and may be designated based on the demand and/or design layout; the disclosure is not specifically limited thereto. In some embodiments, the stack of memory dies is bonded to the logic die 12a, and the memory dies 12b are bonded to each other. In some embodiments, the electrical connections between the logic die 12a and the memory dies 12b are established by through-substrate vias and micro-bump bonding. However, the disclosure is not limited thereto. In some alternative embodiments, the electrical connections between the logic die 12a and the memory dies 12b are established by through-substrate vias and metal-to-metal bonding of the hybrid bonding. In some alternative embodiments, the electrical connections between the logic die 12a and the memory dies 12b are established by redistribution structures and through insulator vias. In some embodiments, the material of the encapsulant 14 includes a molding compound, a molding underfill, a resin (such as epoxy resin, phenolic resin), or the like. In some alternative embodiments, the material of the encapsulant 14 include silicon oxide ($SiO_x$, where x>0), silicon oxynitride ($SiO_xN_y$, where x>0 and y>0), silicon nitride ($SiN_x$, where x>0), or other suitable dielectric material. In some embodiments, the material of the encapsulant 14 may further include filler particles (e.g., silica, clay or the like). In some embodiments, the encapsulant 14 is formed through an over-molding process. For example, the over-molding process is a compression molding process. In some alternative embodiments, the encapsulant 14 is formed through a film deposition process. For example, the film deposition process includes CVD, High-Density Plasma Chemical Vapor Deposition (HDPCVD), PECVD, atomic layer deposition (ALD), or combinations thereof. In some embodiments, as shown in FIG. 2A, a top surface $T_{100b}$ of the semiconductor die 100b is substantially coplanar with the rear surface RS of the semiconductor substrate 110 in the semiconductor die 100a.

Furthermore, as shown in FIG. 2A, the semiconductor die 100b is presented as a HBM die or a HMC die, but it is merely an example illustration. In some alternative embodiments, the semiconductor die 100b may be other types of memory die, such as dynamic random-access memory (DRAM) die, static random-access memory (SRAM) die or resistive random-access memory (RRAM) die. And, as shown in FIG. 2A, two identical semiconductor dies 100b are bonded to the interposer 200. However, the disclosure is not limited thereto. In some alternative embodiments, different semiconductor dies 100b may be bonded to the interposer 200.

In some embodiments, an underfill layer UF1 is formed over the interposer 200 to encapsulate the semiconductor die 100a and the semiconductor dies 100b. As shown in FIG. 2A, the underfill layer UF1 wraps around the conductive posts 170 and the conductive terminals 180 of the semiconductor die 100a and the semiconductor dies 100b, and the topmost conductive pattern layer 204 exposed at the first surface 200a and bonded with the conductive terminals 180 of the semiconductor die 100a and the semiconductor dies 100b. Owing to the underfill layer UF1, a bonding strength between the semiconductor die 100a and the interposer 200 and a bonding strength between the semiconductor die 100b and the interposer 200 are enhanced, thereby improving the reliability of the package structure PKG. In some embodiments, as shown in FIG. 2A, the underfill layer UF1 is formed to fill the spaces between the semiconductor die 100a and the semiconductor dies 100b. In detail, as shown in FIG. 2A and FIG. 3, the underfill layer UF1 completely covers inner sidewalls of the semiconductor die 100a and the semiconductor dies 100b, and partially covers outer sidewalls of the semiconductor die 100a and the semiconductor dies 100b. For example, as shown in FIG. 2A, the portions of the underfill layer UF1 located at the spaces between the semiconductor die 100a and the semiconductor dies 100b have a top surface $T_{UF1}$ that is substantially coplanar with the rear surface RS of the semiconductor substrate 110 in the semiconductor die 100a. However, the disclosure is not limited thereto. In some alternative embodiments, the top surface $T_{UF1}$ of the underfill layer UF1 may be located below or above the rear surface RS of the semiconductor substrate 110. In some embodiments, the underfill layer UF1 is formed by a capillary flow process after the semiconductor die 100a and the semiconductor dies 100b are attached the interposer 200. That is to say, the underfill layer UF1 is drawn by capillary action to flow through the spaces between the semiconductor die 100a and the semiconductor dies 100b, the space between the semiconductor die 100a and the interposer 200, and the spaces between the semiconductor dies 100b and the interposer 200. In some embodiments, the material of the underfill layer UF1 is an insulating material and includes a resin (e.g., epoxy resin), a filler material, a stress release agent (SRA), an adhesion promoter, other material, or a combination thereof. In some embodiments, the underfill layer UF1 is optional.

Figure 2B:
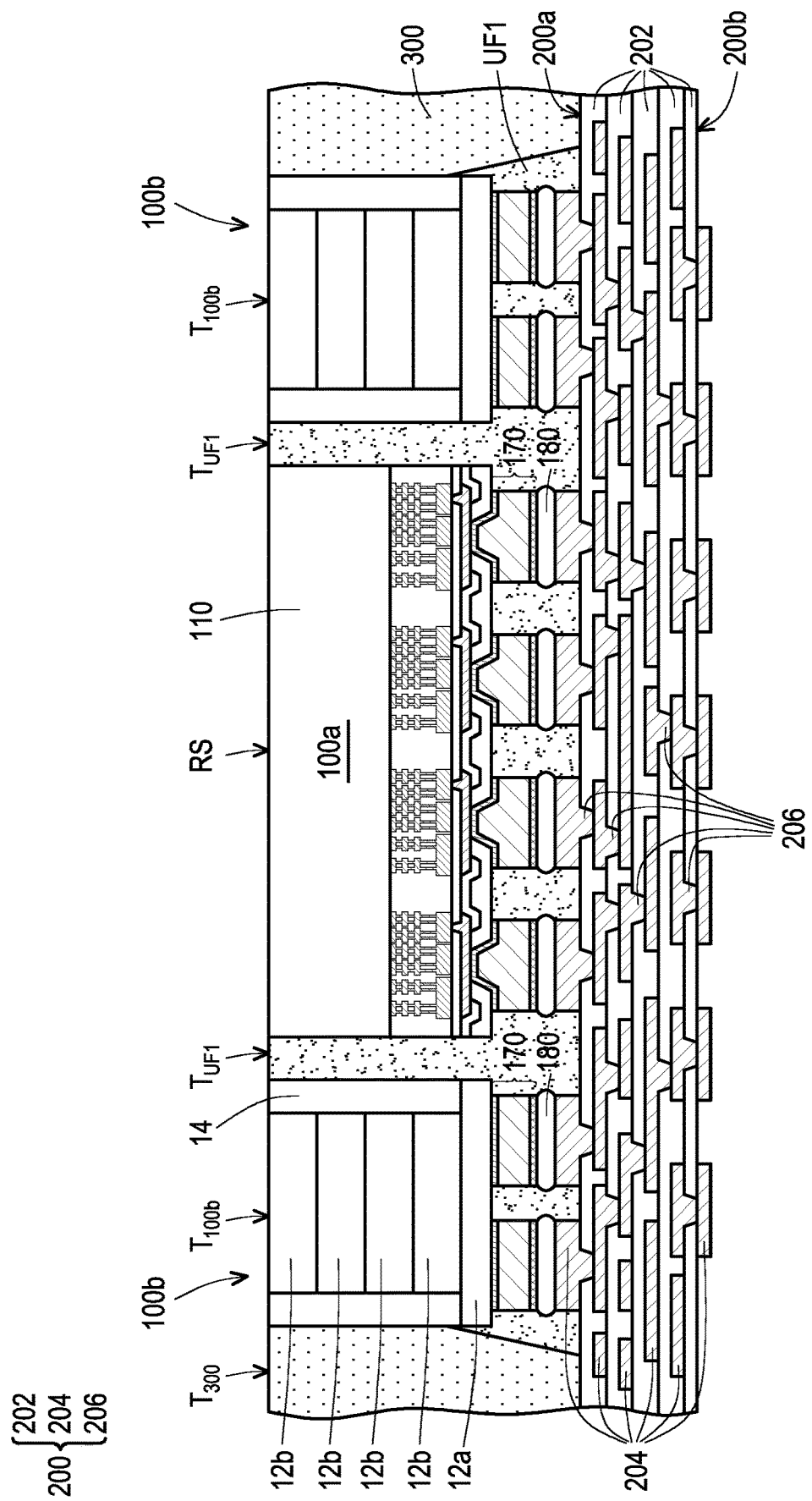

Referring to FIG. 2B, an encapsulant 300 is formed over the interposer 200 to encapsulate the semiconductor die 100a, the semiconductor dies 100b and the underfill layer UF1. For example, the encapsulant 300 laterally encapsulates the semiconductor die 100a, the semiconductor dies 100b and the underfill layer UF1. As illustrated in FIG. 2B, a top surface $T_{300}$ of the encapsulant 300 is substantially coplanar with the rear surface RS of the semiconductor substrate 110, the top surfaces $T_{100b}$ of the semiconductor dies 100b and the top surface $T_{UF1}$ of the underfill layer UF1. That is to say, the encapsulant 300 exposes the semiconductor substrate 110 of the semiconductor die 100a and the memory die 12b of the semiconductor die 100b. In some embodiments, the encapsulant 300 is a molding compound, a molding underfill, a resin (such as epoxy resin, phenolic resin), or the like. In some alternative embodiments, the material of the encapsulant 14 include silicon oxide ($SiO_x$, where x>0), silicon oxynitride ($SiO_xN_y$, where x>0 and y>0), silicon nitride ($SiN_x$, where x>0), or other suitable dielectric material. In some embodiments, the encapsulant 300 includes fillers. The fillers may be particles made of silica, aluminum dioxide, or the like. In some embodiments, the encapsulant 300 is formed by a molding process, an injection process, a film deposition process, a combination thereof, or the like. The molding process includes, for example, a transfer molding process, a compression molding process, or the like. The film deposition process includes, for example, CVD, HDPCVD, PECVD, ALD, or combinations thereof.

Figure 2C:
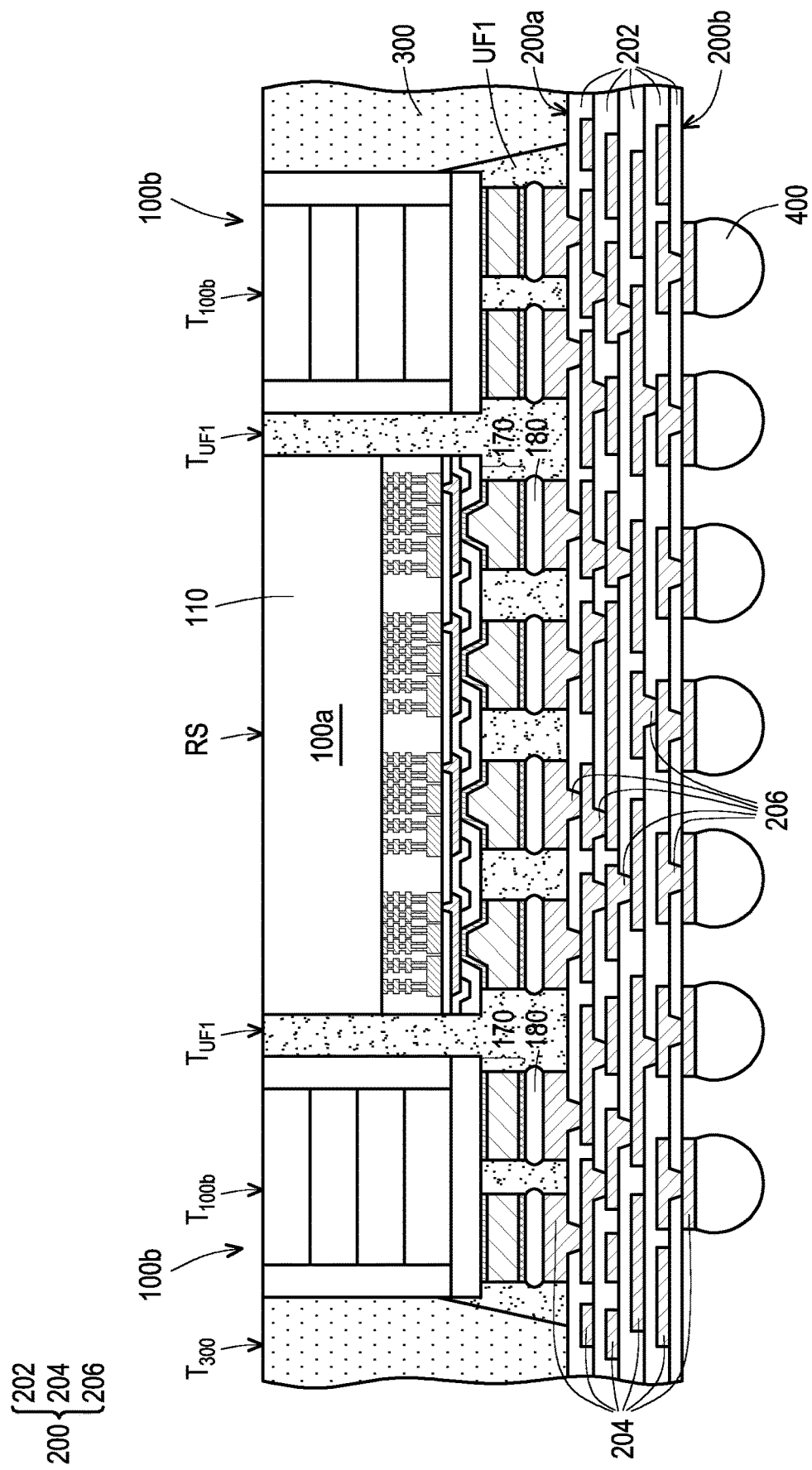

Referring to FIG. 2C, a plurality of conductive terminals 400 is formed on the second surface 200b of the interposer 200. In some embodiments, the conductive terminals 400 are controlled collapse chip connection (C4) bumps, solder balls, ball grid array (BGA) balls, or the like. The conductive terminals 400 may include a conductive material such as solder, copper, aluminum, gold, nickel, silver, palladium, tin, the like, or combinations thereof. In some embodiments, the electrical terminals 400 are formed by initially forming a layer of solder through evaporation, electroplating, printing, solder transfer, ball placement, or the like. Once the layer of solder has been formed on the structure, a reflow process may be performed in order to shape the material into the desired bump shapes. In some alternative embodiments, the electrical terminals 400 include metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, the conductive terminals 400 are in physical contact with the bottommost conductive pattern layer 204 exposed at the second surface 200b of the interposer 200. Further, as shown in FIG. 2C, although seven conductive terminals 400 are presented on the interposer 200 for illustrative purposes, those skilled in the art can understand that the number of the conductive terminals 400 may be more than or less than what is depicted in FIG. 2C, and may be designated based on demand and/or design layout.

Figure 2D:
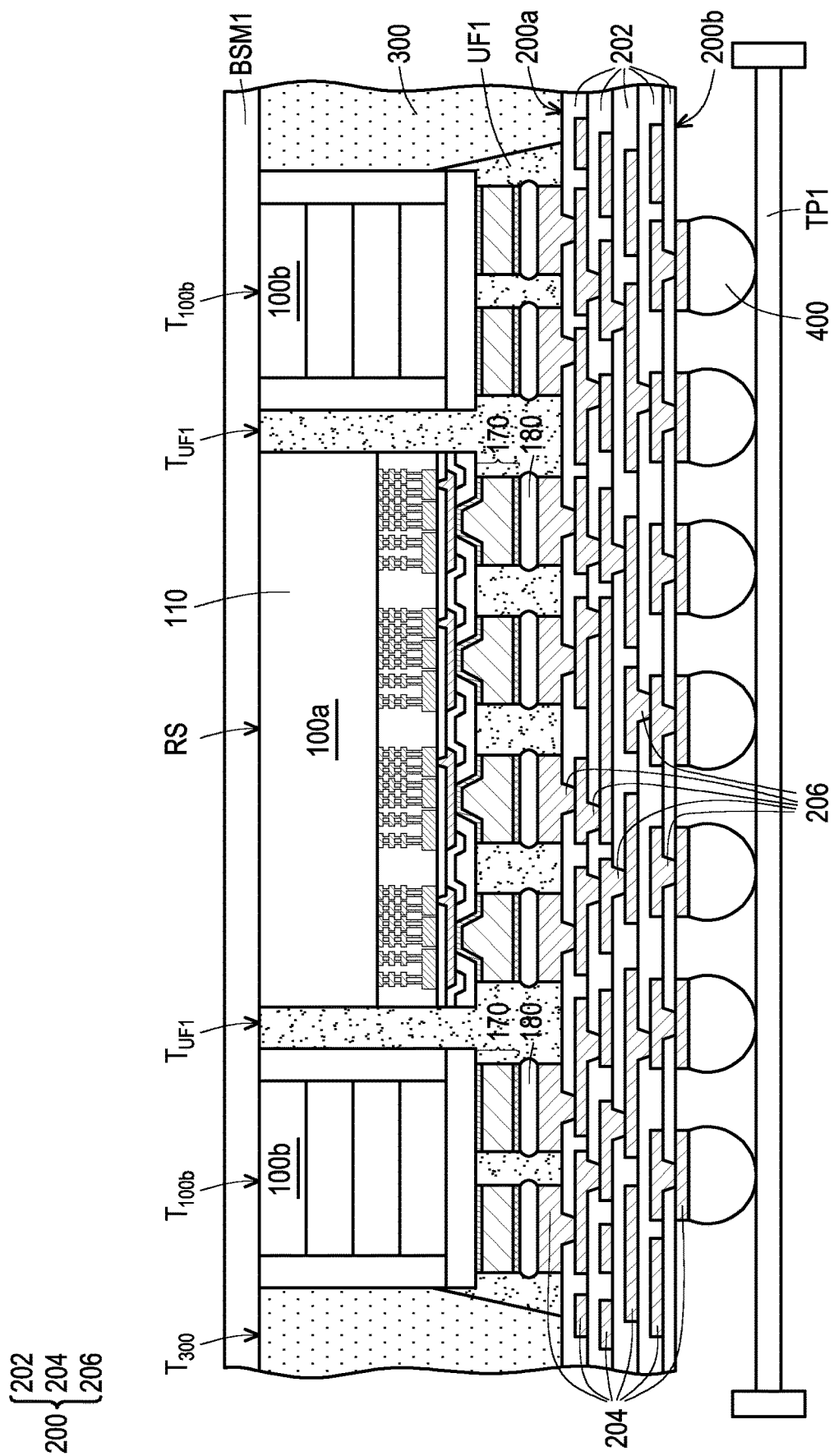

Referring to FIG. 2D, the structure illustrated in FIG. 2C is placed on a carrier TP1. The carrier TP1 may include a frame and a tape being held tightly by the frame. The tape of the carrier TP1 helps to provide support such that a conductive layer BSM1 is formed on the semiconductor die 100a, the semiconductor dies 100b and the encapsulant 300. In detail, as shown in FIG. 2D, the conductive layer BSM1 is in physical contact with the top surface $T_{300}$ of the encapsulant 300, the rear surface RS of the semiconductor substrate 110, the top surfaces $T_{100b}$ of the semiconductor dies 100b and the top surface $T_{UF1}$ of the underfill layer UF1. However, the disclosure is not limited to. In some alternative embodiments, the carrier TP1 may be a glass carrier, so as to perform a carrier bond process on conductive terminals 400. In some embodiments, the material of the conductive layer BSM1 includes metal, such as Al, Ti, Ni, V, Au, Ag or Cu. In some embodiments, the conductive layer BSM1 is formed by sputtering, electroplating, deposition, or dispensing process. In some embodiments, the thickness of the conductive layer BSM1 ranges from about 0.1 μm to about 10 μm.

Figure 2E:
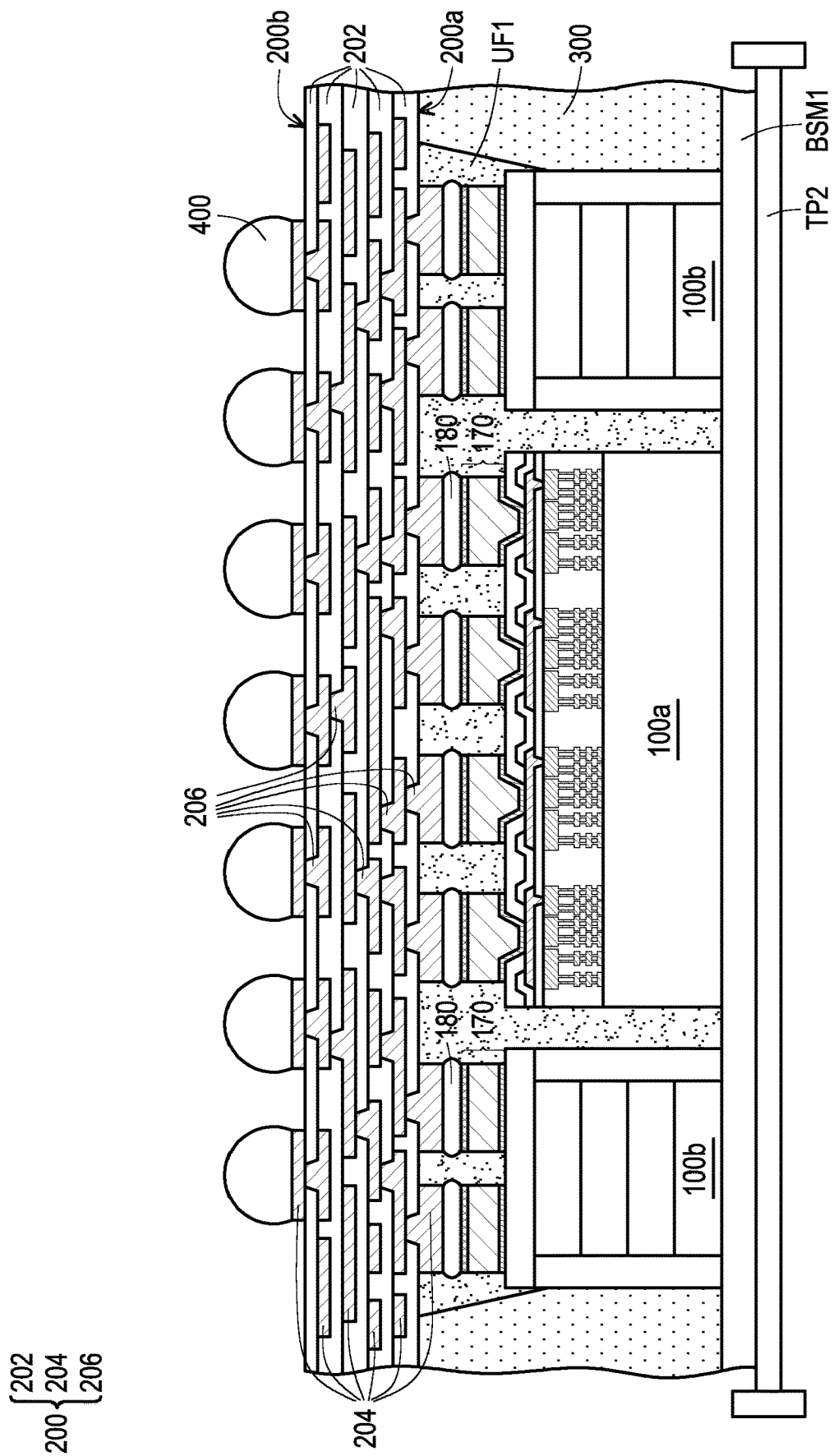
Figure 2F:
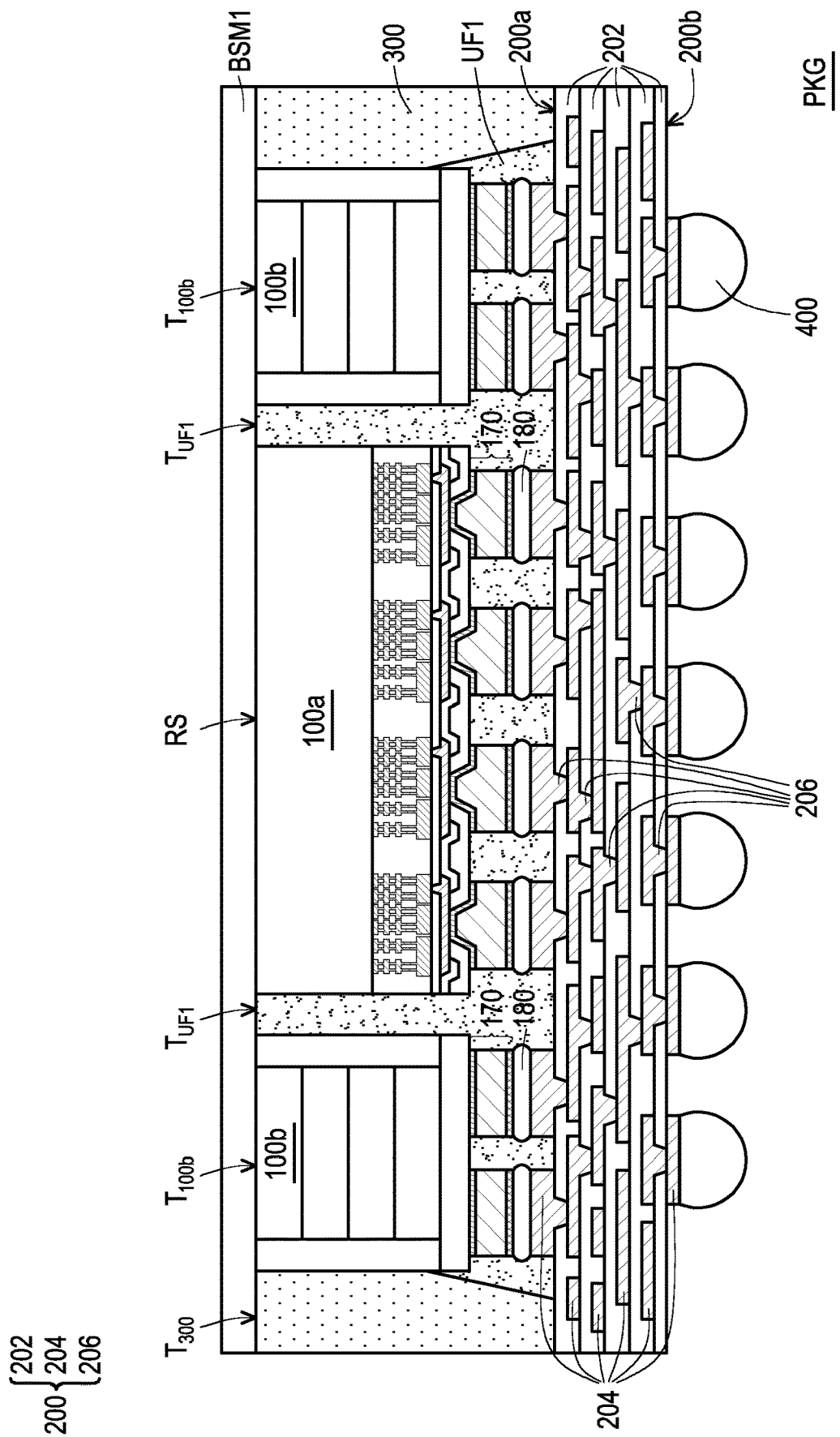

Referring to FIG. 2E, after the conductive layer BSM1 is formed, the structure illustrated in FIG. 2D is separated from the carrier TP1 and is flipped upside down to attach to a dicing carrier TP2. Similar to the carrier TP1, the dicing carrier TP2 may include a frame and a tape being held tightly by the frame. The tape of the dicing carrier TP2 helps to provide support such that a singulation process is performed on the encapsulant 300 and the interposer 200 to obtain the package structure illustrated in FIG. 2F. Although only one package structure PKG is presented in FIG. 2F for illustrative purposes, those skilled in the art can understand that after the singulation process is performed, a plurality of package structures PKG are obtained. In some embodiments, the singulation process typically involves dicing with a rotation blade and/or a laser beam. In other words, the singulation process includes a laser cutting process, a mechanical cutting process, a laser grooving process, other suitable processes, or a combination thereof. In some embodiments, since the interposer 200 is in wafer form, the package structure PKG is considered to be formed by a chip-on-wafer process, and also the package structure PKG is referred to as a chip-on-wafer package. In some embodiments, as shown in FIG. 2F, the top surface $T_{300}$ of the encapsulant 300, the rear surface RS of the semiconductor substrate 110, the top surfaces $T_{100b}$ of the semiconductor dies 100b and the top surface $T_{UF1}$ of the underfill layer UF1 are collectively referred to as the rear surface of the package structure PKG. That is to say, in the package structure PKG, the conductive layer BSM1 is in physical contact with the rear surface of the package structure PKG.

In some embodiments, the package structure PKG may be utilized in a semiconductor device. For example, the package structure PKG may be assembled with other components to form a semiconductor device. The manufacturing process of the semiconductor device utilizing the package structure PKG will be described below.

Figure 5:
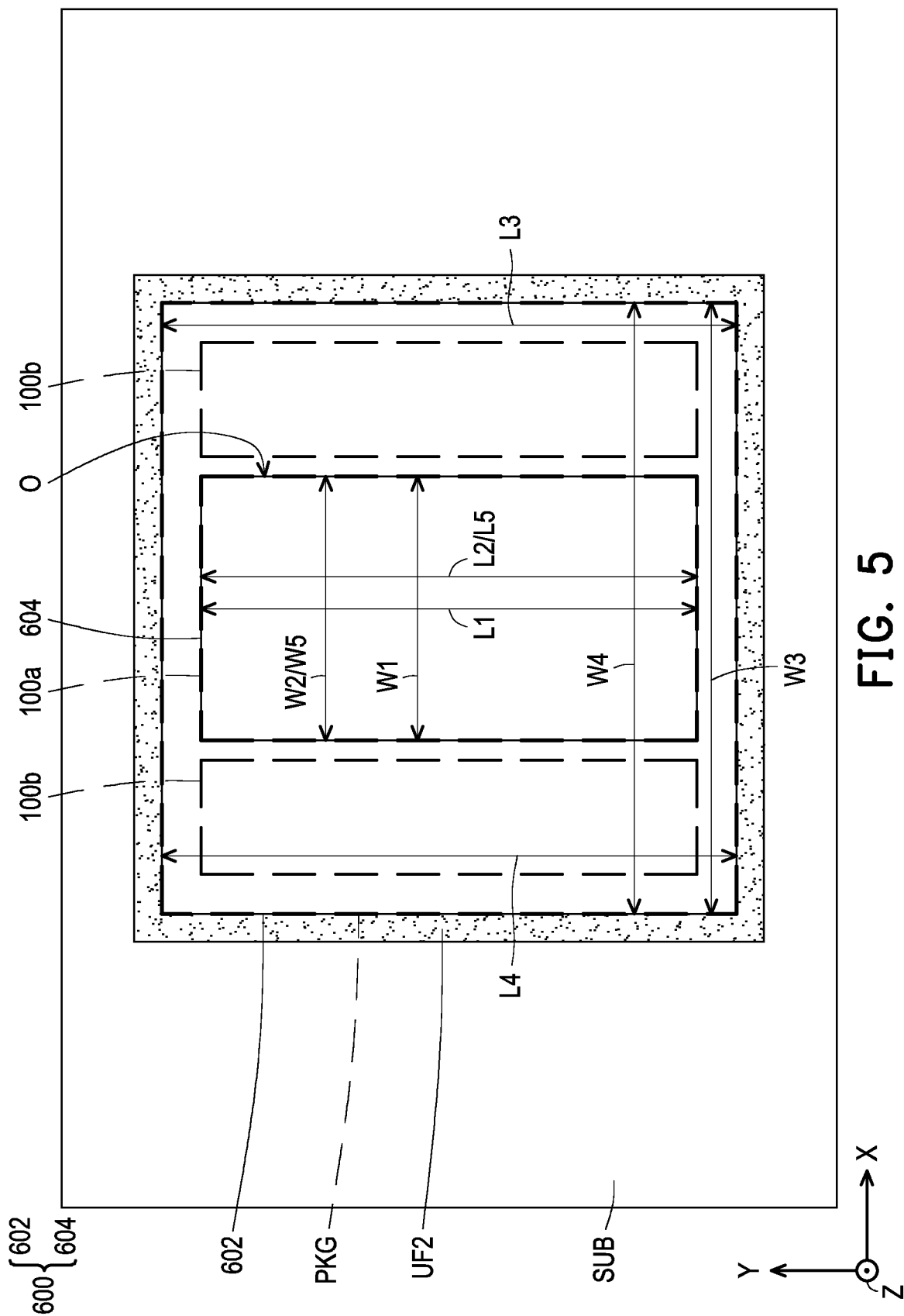
FIG. 5 is a simplified top view of the semiconductor device in FIG. 4C.
Figure 6A:
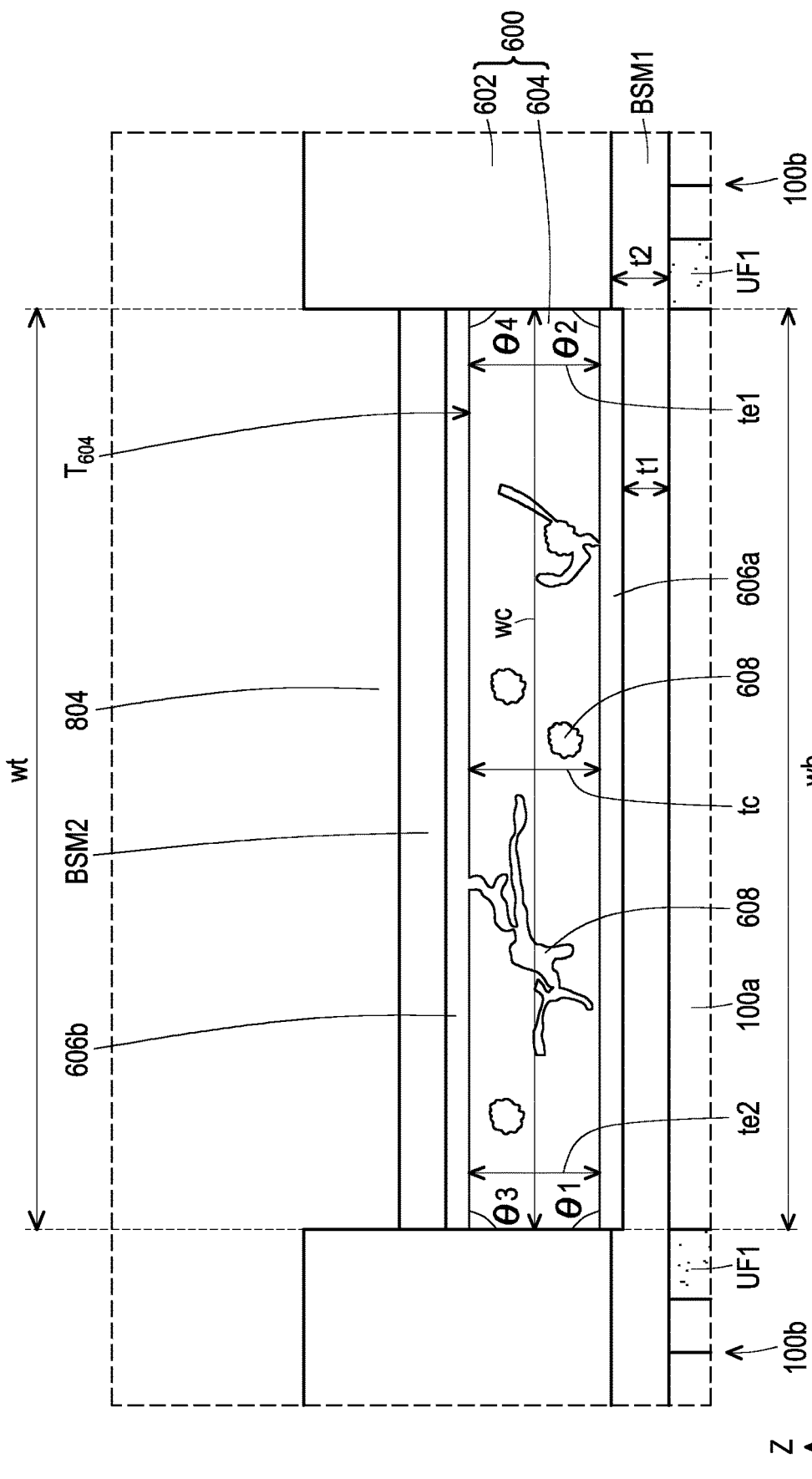
FIG. 6A is a schematic enlarged view illustrating a region in FIG. 4F in accordance with some embodiments of the disclosure.

FIG. 4A to FIG. 4F are schematic cross-sectional views illustrating a manufacturing process of a semiconductor device 10 in accordance with some embodiments of the disclosure. FIG. 5 is a simplified top view of the semiconductor device in FIG. 4C. FIG. 6A is a schematic enlarged view illustrating a region in FIG. 4F in accordance with some embodiments of the disclosure. For simplicity, some elements (e.g., surface devices) are omitted in the top view of FIG. 5.

Figure 4A:
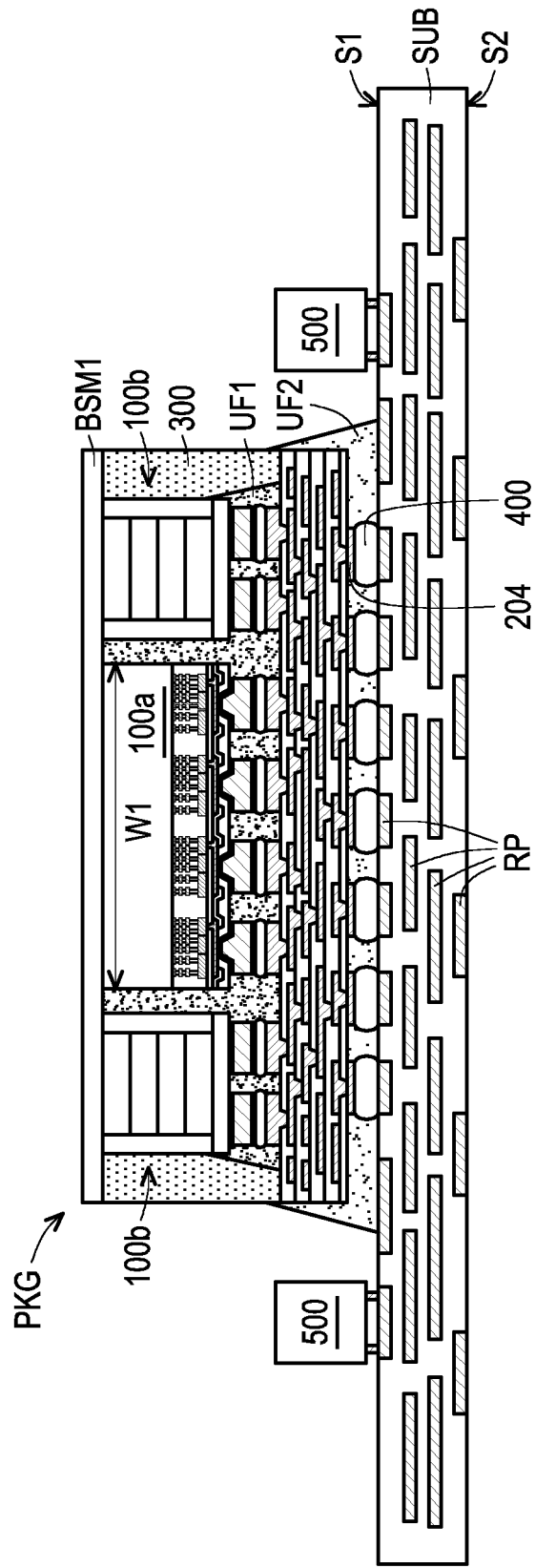
FIG. 4A to FIG. 4F are schematic cross-sectional views illustrating a manufacturing process of a semiconductor device in accordance with some embodiments of the disclosure.

Referring to FIG. 4A, a substrate SUB is provided. In some embodiments, the substrate SUB is a printed circuit board (PCB) or the like. In some embodiments, the substrate SUB is referred to as a circuit substrate. In some embodiments, the substrate SUB includes a plurality of routing patterns RP embedded therein. In some embodiments, the routing patterns RP are interconnected with one another. That is to say, the routing patterns RP are electrically connected to one another. As illustrated in FIG. 4A, the substrate SUB has a first surface S1 and a second surface S2 opposite to the first surface S1. In some embodiments, some of the routing patterns RP are exposed at the first surface S1 and some of the routing patterns RP are exposed at the second surface S2.

As illustrated in FIG. 4A, the package structure PKG in FIG. 2F is bonded to the first surface S1 of the substrate SUB. In some embodiments, the package structure PKG is attached to the substrate SUB through the conductive terminals 400. For example, the conductive terminals 400 of the package structure PKG are in physical contact with the routing patterns RP exposed at the first surface S1 of the substrate SUB to render electrical connection between the package structure PKG and the substrate SUB. In some embodiments, after the conductive terminals 400 are attached to the routing patterns RP of the substrate SUB, a reflow process may be performed to reshape the conductive terminals 400. Although the conductive layer BSM1 is already formed in the package structure PKG shown in FIG. 2F, the disclosure is not limited. In some alternative embodiments, the singulated package structure PKG does not include the conductive layer BSM1, and the conductive layer BSM1 is formed on the semiconductor die 100a, the semiconductor dies 100b and the encapsulant 300 of the said package structure PKG after the said package structure PKG is bonded to the substrate SUB. It is noted that the conductive layer BSM1 is utilized to promote adhesion between the subsequently formed metallic TIM layer (e.g., metallic TIM layer 604) and the package structure PKG, and generally is referred to as a backside metal layer.

In some embodiments, an underfill layer UF2 is formed between the package structure PKG and the first surface S1 of the substrate SUB. For example, the underfill layer UF2 wraps around the bottommost conductive pattern layer 204 and the conductive terminals 400 of the package structure PKG. In some embodiments, the underfill layer UF2 is utilized to protect these elements. Owing to the underfill layer UF2, a bonding strength between the package structure PKG and the substrate SUB is enhanced, thereby improving the reliability of the semiconductor device 10. In some embodiments, as shown in FIG. 4A and FIG. 5, the underfill layer UF2 further covers portions of each sidewall of the package structure PKG. In some embodiments, the material of the underfill layer UF2 is an insulating material and includes a resin (e.g., epoxy resin), a filler material, a SRA, an adhesion promoter, other material, or a combination thereof. In some embodiments, the underfill layer UF2 is optional.

As illustrated in FIG. 4A, a plurality of surface devices 500 is bonded to the first surface S1 of the substrate SUB. In some embodiments, the surface devices 500 are mounted on the routing patterns RP of the substrate SUB through a soldering process, a reflowing process, a combination thereof, or other suitable processes. In some embodiments, the surface device 500 includes a surface mount device (SMD) or an integrated passive device (IPD) that comprises passive devices such as resistors, inductors, capacitors, fuses, jumpers, combinations of these, or the like. As illustrated in FIG. 4A, the surface devices 500 are disposed aside the package structure PKG. For example, the surface devices 500 may be disposed to surround the package structure PKG. The number of the surface devices 500 is not limited to the embodiment, and may be selected based on the demand and design layout.

Figure 4B:
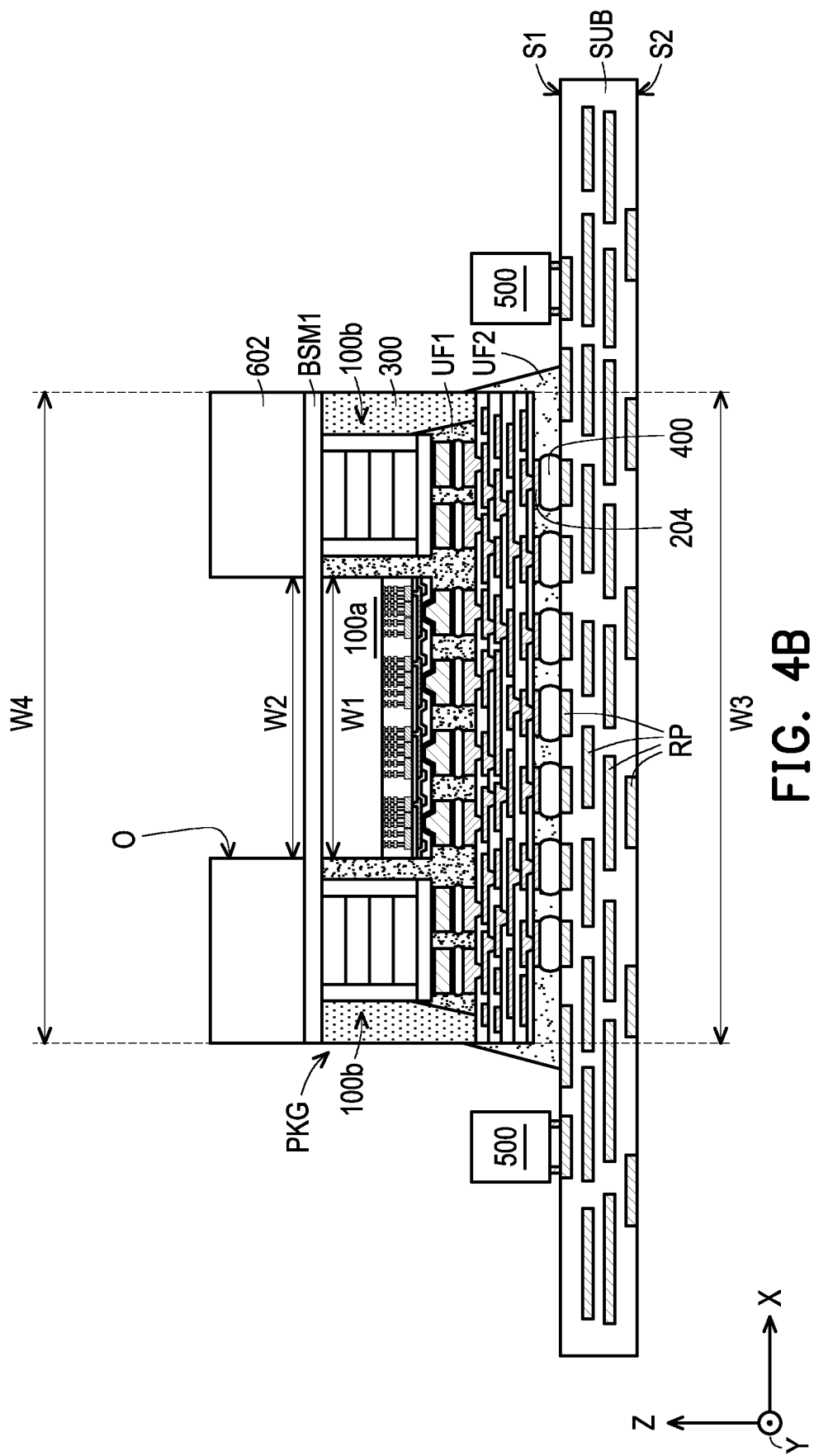

Referring to FIG. 4B, a non-metallic thermal interface material (TIM) layer 602 is formed on the conductive layer BSM1. In some embodiments, the non-metallic TIM layer 602 is in film type. In some embodiments, the non-metallic TIM layer 602 is formed on the conductive layer BSM1 through a lamination process or a pick-and-place process. In some embodiments, the material of the non-metallic TIM layer 602 includes AlN, BN, carbon nanotube, graphite, graphene, polyimide, polybenzoxazole (PBO), epoxy base polymer, silica base polymer, acrylic base polymer, or a combination thereof. In some embodiments, the non-metallic TIM layer 602 may further include fillers. The fillers may facilitate the thermal conduction of the non-metallic TIM layer 602. In some embodiments, the fillers are particles made of divinyl benzene crosslinked-polymers, aluminum, copper, silver, beryllium oxide, aluminum nitride, aluminum oxide, zinc oxide, or silicon dioxide. In some embodiments, the thermal conductivity of the non-metallic TIM layer 602 ranges from about 5 W/(m·K) to about 100 W/(m·K). In some embodiments, the Young's modulus of the non-metallic TIM layer 602 ranges from about 1 MPa to about 500 MPa.

As shown in FIG. 4B and FIG. 5, the non-metallic TIM layer 602 has an opening O exposing the underlying conductive layer BSM1. That is to say, the non-metallic TIM layer 602 is a patterned layer. In detail, as shown in FIG. 4B and FIG. 5, the sidewalls of the opening O defined by the non-metallic TIM layer 602 are substantially aligned with the side surfaces of the semiconductor die 100a. That is to say, as shown in FIG. 4B and FIG. 5, the dimension W1 of the semiconductor die 100a along the direction X is substantially equal to the dimension W2 of the opening O along the direction X, and the dimension L1 of the semiconductor die 100a along the direction Y perpendicular to the direction X is substantially equal to the dimension L2 of the opening O along the direction Y. However, the disclosure is not limited to. In some alternative embodiments, the dimension W1 of the semiconductor die 100a along the direction X may be greater than or less than the dimension W2 of the opening O along the direction X. Also, in some alternative embodiments, the dimension L1 of the semiconductor die 100a along the direction Y may be greater than or less than the dimension L2 of the opening O along the direction Y. From another point of view, the opening O of the non-metallic TIM layer 602 is formed to be corresponded to the location of the semiconductor die 100a. In some embodiments, the opening O of the non-metallic TIM layer 602 is formed by a mechanical cutting process or a punching process.

In some embodiments, as shown in FIG. 4B and FIG. 5, the outer side surfaces of the non-metallic TIM layer 602 are substantially aligned with the outer side surfaces of the package structure PKG. Also, as shown in FIG. 4B and FIG. 5, the outer side surfaces of the non-metallic TIM layer 602 are substantially aligned with the outer side surfaces of the encapsulant 300 in the package structure PKG. In detail, as shown in FIG. 4B and FIG. 5, the dimension W3 of the package structure PKG along the direction X is substantially equal to the dimension W4 of the non-metallic TIM layer 602 along the direction X, and the dimension L3 of the package structure PKG along the direction Y is substantially equal to the dimension L4 of the non-metallic TIM layer 602 along the direction Y. However, the disclosure is not limited to. In some alternative embodiments, the dimension W3 of the package structure PKG along the direction X may be greater than the dimension W4 of the non-metallic TIM layer 602 along the direction X. Also, in some alternative embodiments, the dimension L3 of the package structure PKG along the direction Y may be greater than the dimension L4 of the non-metallic TIM layer 602 along the direction Y. That is to say, the portion out of the region corresponding to the semiconductor die 100a of the package structure PKG is covered by the non-metallic TIM layer 602. From another point of view, the non-metallic TIM layer 602 is overlapped with the encapsulant 300 and the semiconductor dies 100b. For example, as shown in FIG. 4B and FIG. 5, a vertical projection of the non-metallic TIM layer 602 onto the substrate SUB is overlapped with vertical projections of the semiconductor dies 100b onto the substrate SUB.

Figure 4C:
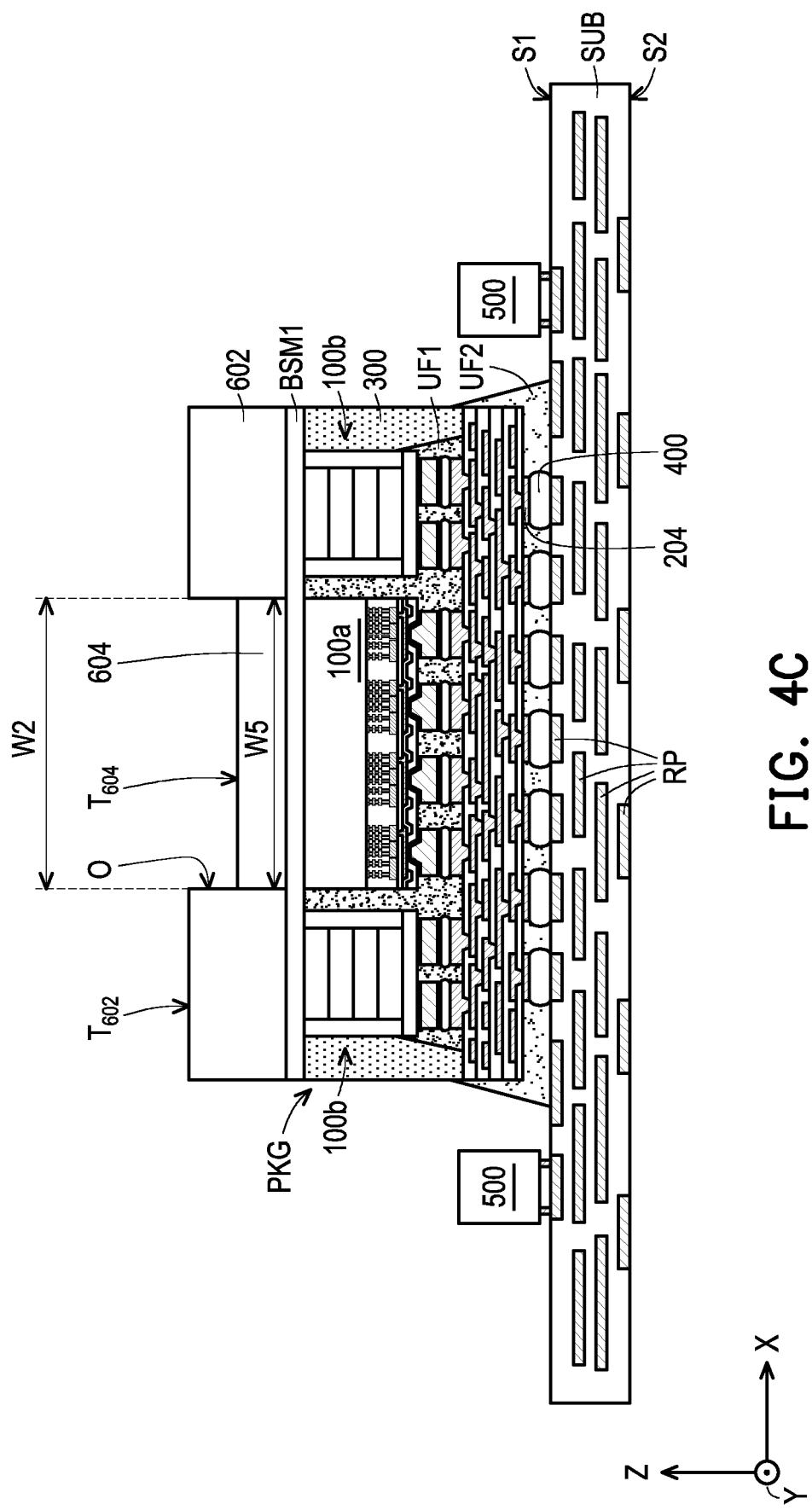

Referring to FIG. 4C, a metallic TIM layer 604 is formed on the conductive layer BSM1. In some embodiments, the metallic TIM layer 604 is in sheet type. In some embodiments, the metallic TIM layer 604 is formed on the conductive layer BSM1 through a pick-and-place process. In some embodiments, the material of the metallic TIM layer 604 is different from the material of the non-metallic TIM layer 602. In some embodiments, the material of the metallic TIM layer 604 is soldered type material. In some embodiments, the metallic TIM layer 604 is formed by purely metallic materials. For example, the metallic TIM layer 604 is free of organic material and polymeric material. In some embodiments, the material of the metallic TIM layer 604 includes indium, copper, tin, SAC305, InAg or a combination thereof. In some embodiments, the thermal conductivity of the metallic TIM layer 604 is higher than the thermal conductivity of the non-metallic TIM layer 602. In some embodiments, the thermal conductivity of the metallic TIM layer 604 ranges from about 10 W/(m·K) to about 90 W/(m·K). In some embodiments, the Young's modulus of the metallic TIM layer 604 ranges from about 5 GPa to about 70 GPa. In some embodiments, the metallic TIM layer 604 is formed to be thinner than the non-metallic TIM layer 602. For example, as illustrated in FIG. 4C, the top surface $T_{602}$ of the non-metallic TIM layer 602 is located at a level height higher than that of the top surface $T_{604}$ of the metallic TIM layer 604. However, the disclosure is not limited to. In some alternative embodiments, the metallic TIM layer 604 may be formed to be thicker than the non-metallic TIM layer 602. For example, the top surface $T_{602}$ of the non-metallic TIM layer 602 is located at a level height lower than that of the top surface $T_{604}$ of the metallic TIM layer 604. In some alternative embodiments, the metallic TIM layer 604 may be formed to have the same thickness as the non-metallic TIM layer 602. For example, the top surface $T_{602}$ of the non-metallic TIM layer 602 is substantially coplanar with the top surface $T_{604}$ of the metallic TIM layer 604.

As shown in FIG. 4C and FIG. 5, the metallic TIM layer 604 is formed and disposed in the opening O. For example, the metallic TIM layer 604 is completely located within the projection area of the opening O on the substrate SUB. From another point of view, as shown in FIG. 4C and FIG. 5, the metallic TIM layer 604 is formed to be surrounded/encircled by the non-metallic TIM layer 602. That is to say, the metallic TIM layer 604 is located within the area circled by the non-metallic TIM layer 602. In some embodiments, the contour of the metallic TIM layer 604 is substantially identical to the contour of the opening O. For example, as shown in FIG. 4C and FIG. 5, the side surfaces of the metallic TIM layer 604 are substantially aligned with the sidewalls of the opening O defined by the non-metallic TIM layer 602. That is to say, as shown in FIG. 4C and FIG. 5, the dimension W5 of the metallic TIM layer 604 along the direction X is substantially equal to the dimension W2 of the opening O along the direction X, and the dimension L5 of the metallic TIM layer 604 along the direction Y is substantially equal to the dimension L2 of the opening O along the direction Y. In other words, the metallic TIM layer 604 is in contact with the non-metallic TIM layer 602. However, the disclosure is not limited to. In some alternative embodiments, each of the side surfaces of the metallic TIM layer 604 is spaced a distance from the non-metallic TIM layer 602. For example, the dimension W5 of the metallic TIM layer 604 along the direction X is less than the dimension W2 of the opening O along the direction X, and the dimension L5 of the metallic TIM layer 604 along the direction Y is less than the dimension L2 of the opening O along the direction Y. In some embodiments, the distance ranges from about 0.5 micrometers to about 2 micrometers.

In some embodiments, the metallic TIM layer 604 is overlapped with the semiconductor die 100a. For example, as shown in FIG. 4C and FIG. 5, the vertical projection of the metallic TIM layer 604 onto the substrate SUB is completely overlapped with the vertical projection of the semiconductor die 100a onto the substrate SUB. However, the disclosure is not limited to. In some alternative embodiments, the vertical projection of the metallic TIM layer 604 onto the substrate SUB is partially overlapped with the vertical projection of the semiconductor die 100a onto the substrate SUB. From another point of view, the metallic TIM layer 604 is formed to be corresponded to the location of the semiconductor die 100a.

In some embodiments, for better adhesion, a flux (not shown) is disposed between the conductive layer BSM1 and the metallic TIM layer 604, and another flux (not shown) is applied onto the top surface $T_{604}$ of the metallic TIM layer 604. For example, before the metallic TIM layer 604 is placed on the conductive layer BSM1, a flux (not shown) is formed in the opening O; and after the metallic TIM layer 604 is placed on the conductive layer BSM1, another flux (not shown) is formed on the top surface $T_{604}$ of the metallic TIM layer 604. In some embodiments, the formation of the flux includes performing a jetting process or a dispensing process. In some embodiments, the material of the flux includes rosin or acids.

Figure 4D:
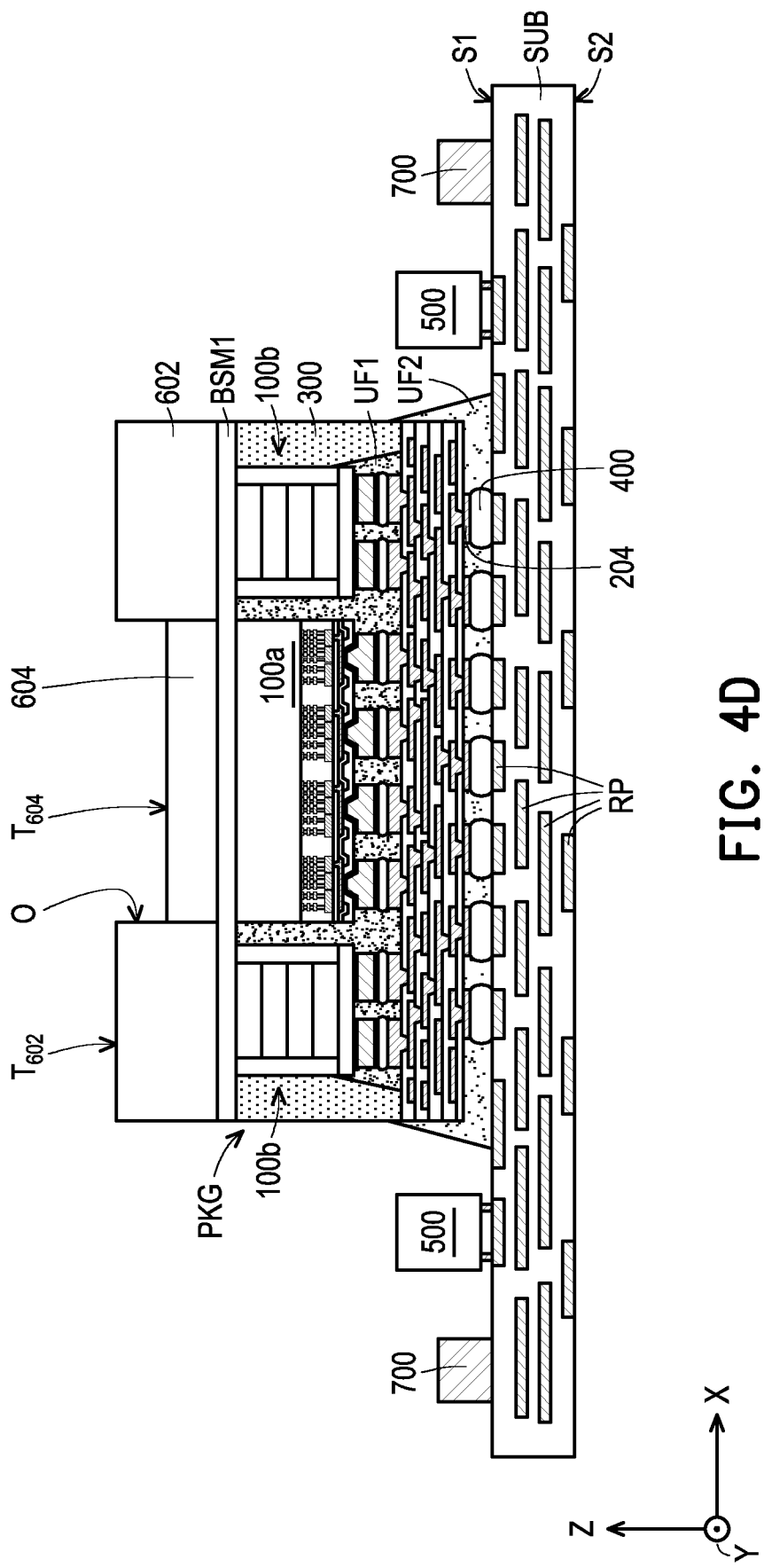

Referring to FIG. 4D, an adhesive layer 700 is formed on the first surface S1 of the substrate SUB. For example, the adhesive layer 700 is formed near edges of the first surface S1 of the substrate SUB to surround/encircle the package structure PKG, the underfill layer UF2, and the surface devices 500. In some embodiments, the adhesive layer 700 partially covers the first surface S1 of the substrate SUB. For example, the package structure PKG, the underfill layer UF2, and the surface devices 500 are physically isolated from the adhesive layer 700. In some embodiments, the adhesive layer 700 has a ring-like shape in the plane view such as the top view. In some embodiments, the pattern of the adhesive layer 700 may be designed based on the various design. For example, the adhesive layer 700 may have a linear shape, L shape, U shape, dot shape, etc. In some embodiments, the shape of the adhesive layer 700 depends on the shape of the substrate SUB. For example, when the substrate SUB is in wafer form (i.e., having a circular top view), the adhesive layer 700 exhibits a circular ring-like shape from the top view. For example, when the substrate SUB is in panel form (i.e., having a rectangular or squared top view), the adhesive layer 700 exhibits a rectangular or squared ring-like shape from the top view. In some embodiments, the adhesive layer 700 is applied onto the substrate SUB through a dispensing process, a spin-coating process, or the like. In some embodiments, the adhesive layer 700 has a thermal conductivity greater than about 0 W/m·K to 5 W/m·K. In some embodiments, the adhesive layer 700 includes an epoxy-based material. However, the disclosure is not limited to. In some alternative embodiments, other polymeric materials having adhering property may be utilized as the adhesive layer 700.

Figure 4E:
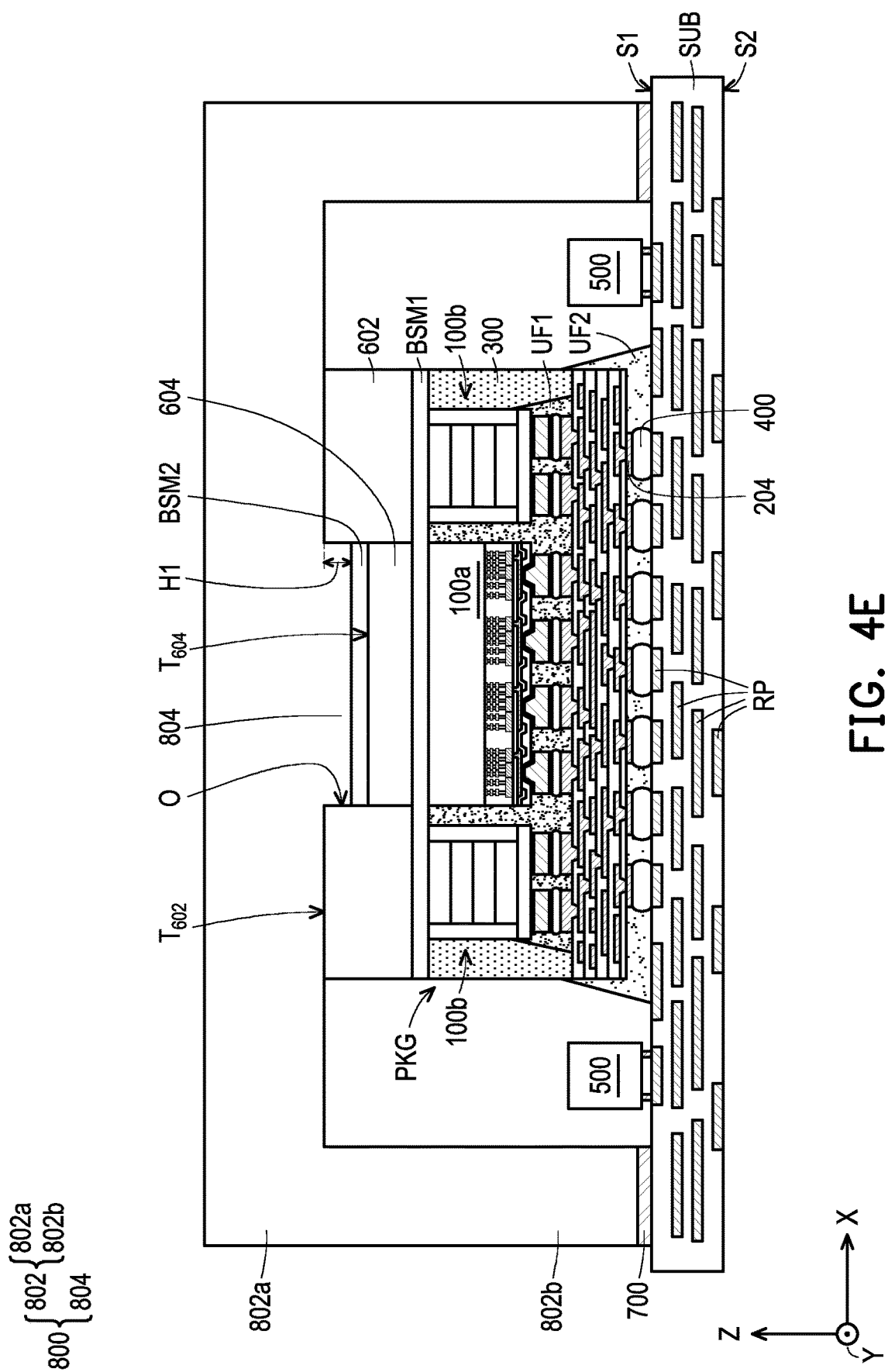

Referring to FIG. 4E, a lid structure 800 is placed over the substrate SUB, the package structure PKG, and the surface devices 500 such that the package structure PKG is located between the lid structure 800 and the substrate SUB. In some embodiments, prior to the attachment of the lid structure 800, a conductive layer BSM2 is formed on the lid structure 800. It is noted that the conductive layer BSM2 is utilized to promote adhesion between the metallic TIM layer 604 and the lid structure 800, and generally is referred to as a backside metal layer. In some embodiments, the material of the conductive layer BSM2 is the same as the material of the conductive layer BSM1. In alternative some embodiments, the material of the conductive layer BSM2 is different from the material of the conductive layer BSM1. In some embodiments, the material of the conductive layer BSM2 includes metal, such as Al, Ti, Ni, V, Au, Ag or Cu. In some embodiments, the conductive layer BSM2 is formed on the lid structure 800 through a plating, sputtering or dispensing process. In some embodiments, after the conductive layer BSM2 is formed on the lid structure 800, the lid structure 800 and the conductive layer BSM2 are placed above the metallic TIM layer 604, the non-metallic TIM layer 602 and the adhesive layer 700, such that the conductive layer BSM2 is in physical contact with the top surface $T_{604}$ of the metallic TIM layer 604, the lid structure 800 is in physical contact with the top surface $T_{602}$ of the non-metallic TIM layer 602 and the adhesive layer 700. However, the disclosure is not limited thereto. In some alternative embodiments, there is no conductive layer BSM2 formed on the lid structure 800. Thereafter, the lid structure 800 and the conductive layer BSM2 are pressed against the metallic TIM layer 604, the non-metallic TIM layer 602 and the adhesive layer 700. In some embodiments, pressing the lid structure 800 and the conductive layer BSM2 against the metallic TIM layer 604, the non-metallic TIM layer 602 and the adhesive layer 700 includes performing a heat clamping process, wherein the process temperature of the heat clamping process ranges from about 60° C. to about 300° C. Subsequently, a curing process is performed on the adhesive layer 700 and the non-metallic TIM layer 602 such that the lid structure 800 is attached to the substrate SUB and the package structure PKG respectively through the adhesive layer 700 and the non-metallic TIM layer 602. In detail, the curing process is performed on the adhesive layer 700 to securely fix the lid structure 800 onto the substrate SUB. In some embodiments, the process temperature of the curing process ranges from about 60° C. to about 300° C. However, the disclosure is not limited to. In some alternative embodiments, during the curing process, the lid structure 800 can be jointed to the package structure PKG through the metallic TIM layer 604. That is to say, in such embodiments, during the curing process, there is a good physical and metallurgical connection of the lid structure 800 to the package structure PKG. In such embodiments, the process temperature of the curing process ranges from about 160° C. to about 260° C. Further, in embodiments where the side surfaces of the metallic TIM layer 604 are spaced apart from the non-metallic TIM layer 602, during the curing process, the metallic TIM layer 604 can be melted to fill the opening O of the non-metallic TIM layer 602 and be in physical contact with the non-metallic TIM layer 602.

In some embodiment, the lid structure 800 is made of metal, plastic, ceramics, or the like. The metal for the lid structure 800 includes, but is not limited to, copper, stainless steel, solder, gold, nickel, molybdenum, NiFe or NiFeCr. In some embodiments, the thermal conductivity of the lid structure 800 ranges from about 80 W/(m·K) to about 450 W/(m·K). In some embodiments, the Young's modulus of the lid structure 800 ranges from about 50 GPa to about 200 GPa. In some embodiments, the lid structure 800 serves the function of heat dissipation. In other words, the heat generated during operation of the package structure PKG may be dissipated through the path created by the lid structure 800.

In some embodiments, the lid structure 800 has a body portion 802 and a protruding portion 804 connected to the body portion 802. In some embodiments, the body portion 802 is divided into a cover portion 802a and a leg portion 802b. As illustrated in FIG. 4E, an extending direction of the cover portion 802a is perpendicular to an extending direction of the leg portion 802b. From another point of view, in some embodiments, the cover portion 802a extends along the direction X and the direction Y, and the leg portion 802b extends along the direction Z. In some embodiments, the cover portion 802a is connected to the leg portion 802b. For example, the cover portion 802a and the leg portion 802b are integrally formed. In some embodiments, the leg portion 802b is attached to the substrate SUB through the adhesive layer 700 during the curing process. In some embodiments, the shape of the leg portion 802b depends on the shape of the substrate SUB. For example, when the substrate SUB is in wafer form (i.e., having a circular top view), the leg portion 802b exhibits a circular ring-like shape from the top view. For example, when the substrate SUB is in panel form (i.e., having a rectangular or squared top view), the leg portion 802b exhibits a rectangular or squared ring-like shape from the top view.

In some embodiments, the protruding portion 804 is connected to the cover portion 802a of the body portion 802. For example, the protruding portion 804 protrudes out from a surface of the cover portion 802a. As illustrated in FIG. 4E, the protruding portion 804 is shorter than the leg portion 802b of the body portion 802. In some embodiments, the protruding portion 804 and the body portion 802 are integrally formed. For example, the material of the protruding portion 804 is the same as the material of the body portion 802. However, the disclosure is not limited thereto. In some alternative embodiments, the protruding portion 804 may be installed on the body portion 802. For example, the material of the protruding portion 804 may be different from the material of the body portion 802. In some embodiments, the conductive layer BSM2 is formed on the protruding portion 804. In detail, as illustrated in FIG. 4E, the conductive layer BSM2 and the protruding portion 804 are disposed in the opening O of the non-metallic TIM layer 602. From another point of view, as illustrated in FIG. 4E, the protruding portion 804 extends into the opening O of the non-metallic TIM layer 602. In some embodiments, the contour of the protruding portion 804 is substantially identical to the contour of the opening O. In some embodiments, during the curing process, the cover portion 802a is attached to the package structure PKG through the protruding portion 804 and the metallic TIM layer 604 attached thereto. In other words, the metallic TIM layer 604 is sandwiched between the protruding portion 804 of the lid structure 800 and the package structure PKG, and sandwiched between the cover portion 802a of the body portion 802 of the lid structure 800 and the package structure PKG. In some embodiments, the height H1 of the protruding portion 804 ranges from about 50 micrometers to about 100 micrometers.

By arranging the protruding portion 804 of the lid structure 800 extending into the opening O of the non-metallic TIM layer 602, the metallic TIM layer 604 can be well confined by the protruding portion 804 and the non-metallic TIM layer 602 within the opening O and therefore the metallic TIM layer 604 can be prevent from bleeding/overflowing to undesired components during the curing process or the reflow process subsequently performed. However, the disclosure is not limited thereto. In some alternative embodiments where the metallic TIM layer 604 is thicker than the non-metallic TIM layer 602, or the metallic TIM layer 604 has the same thickness as the non-metallic TIM layer 602, the protruding portion 804 may be omitted, and the conductive layer BSM2 is directly formed on the cover portion 802a.

As illustrated in FIG. 4E, the lid structure 800 and the substrate SUB together encloses the package structure PKG and the surface devices 500. In other words, the lid structure 800 is formed to accommodate the package structure PKG and/or the surface devices 500. For example, the lid structure 800 may exhibit an upside down U-shape in a cross-sectional view, as shown in FIG. 4E. In some embodiments, the leg portion 802b of the lid structure 800 is spatially separated from the package structure PKG, the underfill layer UF2, and the surface devices 500. In some embodiments, the cover portion 802a of the lid structure 800 is disposed over the package structure PKG and is spatially separated from the substrate SUB.

Figure 4F:
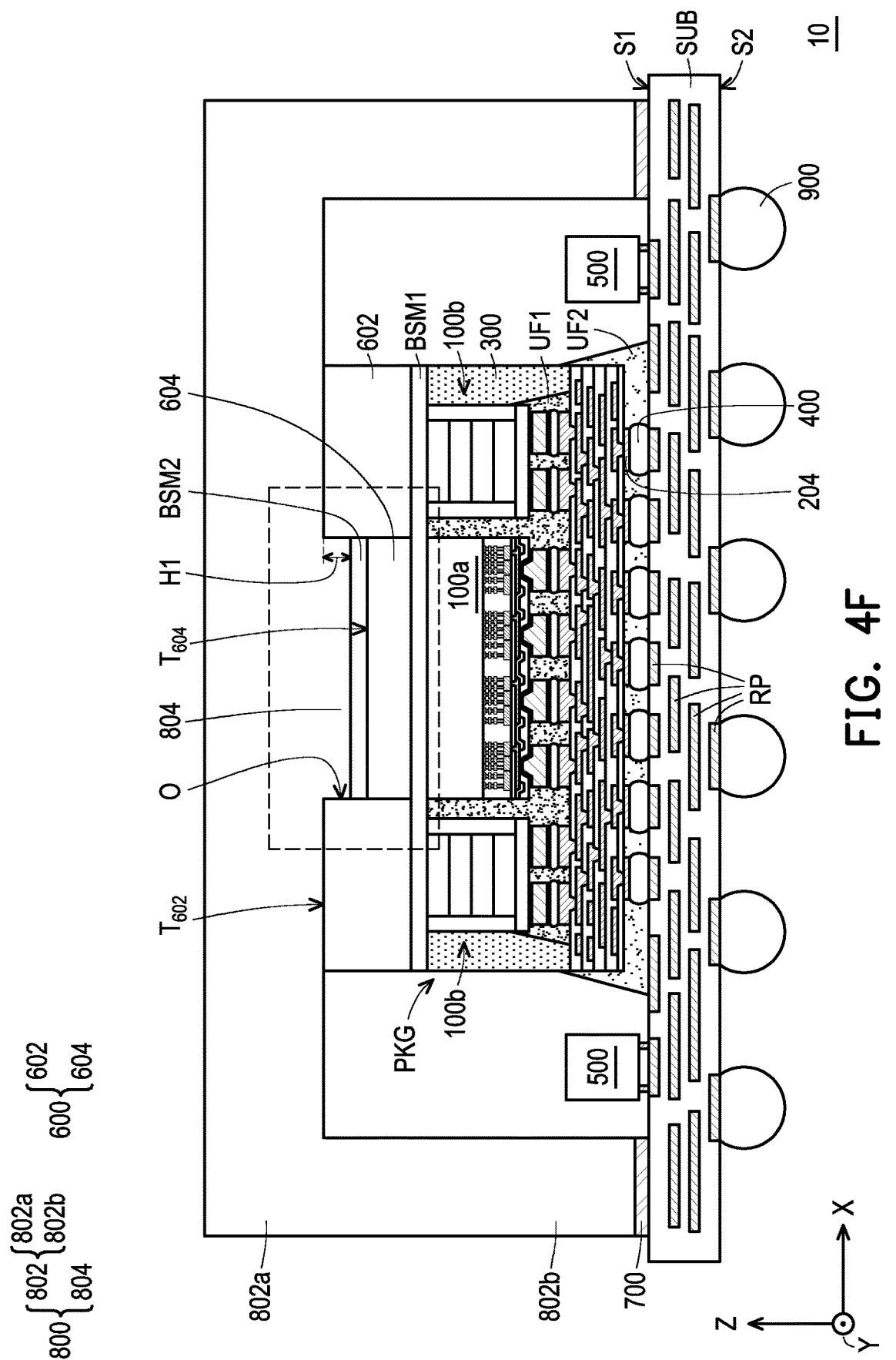

Referring to FIG. 4F, a plurality of conductive terminals 900 is formed on the second surface S2 of the substrate SUB. In some embodiments, the conductive terminals 900 are solder balls, ball grid array (BGA) balls, or the like. In some embodiments, the conductive terminals 900 are made of a conductive material with low resistivity, such as Sn, Pb, Ag, Cu, Ni, Bi, or an alloy thereof. In some embodiments, the conductive terminals 900 are in physical contact with the routing patterns RP exposed at the second surface S2 of the substrate SUB. In some embodiments, the conductive terminals 900 are used to physically and electrically connect the substrate SUB to other devices, packages, connecting components, and the like. That is to say, the conductive terminals 900 are used for providing physical and/or electrical connection to external components. As shown in FIG. 4F, the conductive terminals 900 and the package structure PKG are respectively located on two opposite sides of the substrate SUB, where some of the conductive terminals 900 are electrically connected to the package structure PKG through the routing patterns RP and the conductive terminals 400.

In some embodiments, the conductive terminals 900 are formed on the second surface S2 of the substrate SUB by a ball placement process and a reflow process. In some embodiments, the reflow process may be performed to reshape the conductive terminals 900 and thus there are good physical and metallurgical connections of the conductive terminals 900 to the substrate SUB. In some embodiments, during the reflow process, the lid structure 800 can be jointed to the package structure PKG through the metallic TIM layer 604. That is to say, in such embodiments, during the reflow process, there is a good physical and metallurgical connection of the lid structure 800 to the package structure PKG. From another point of view, the metallurgical connection between the lid structure 800 and the package structure PKG may be rendered during the curing process mentioned-above and/or the reflow process of the conductive terminals 900. Further, in embodiments where the side surfaces of the metallic TIM layer 604 are spaced apart from the non-metallic TIM layer 602, during the reflow process, the metallic TIM layer 604 can be melted to fill the opening O of the non-metallic TIM layer 602 and be in physical contact with the non-metallic TIM layer 602.

Continue referring to FIG. 4F, after the conductive terminals 900 are formed, the semiconductor device 10 is obtained. In the semiconductor device 10, the lid structure 800 is attached to the substrate SUB through the adhesive layer 700 and is bonded/jointed to the package structure PKG through the metallic TIM layer 604. As shown in FIG. 4F and FIG. 6A, in the semiconductor device 10, an inter-metallic compound (IMC) layer 606a, an IMC layer 606b and IMC structures 608 are formed due to a metallurgical reaction between the metallic TIM layer 604 and the conductive layer BSM1 as well as between the metallic TIM layer 604 and the conductive layer BSM2. As shown in FIG. 6A, the IMC layer 606a is formed at the interface between the metallic TIM layer 604 and the conductive layer BSM1. In some embodiments, the IMC layer 606a is the compound of the material in the metallic TIM layer 604 with the surface layer of the conductive layer BSM1. That is to say, a portion of the metallic TIM layer 604 and a portion of the conductive layer BSM1 undergo a metallurgical reaction to form the IMC layer 606a. With such configuration, the thickness t1 of the conductive layer BSM1 under the metallic TIM layer 604 is less than the thickness t2 of the conductive layer BSM1 under the non-metallic TIM layer 602, as shown in FIG. 6A. In some embodiments, the difference between the thickness t2 and the thickness t1 ranges from about 1000 Å to about 2000 Å. As shown in FIG. 6A, the IMC layer 606b is formed at the interface between the metallic TIM layer 604 and the conductive layer BSM2. In some embodiments, the IMC layer 606b is the compound of the material in the metallic TIM layer 604 with the surface layer of the conductive layer BSM2. That is to say, a portion of the metallic TIM layer 604 and a portion of the conductive layer BSM2 undergo a metallurgical reaction to form the IMC layer 606b. In embodiments where the metallic TIM layer 604 includes tin, the thickness of the IMC layer 606a or the IMC layer 606b ranges from about 1 μm to about 2 μm. In embodiments where the metallic TIM layer 604 includes indium, the thickness of the IMC layer 606a or the IMC layer 606b ranges from about 10 Å to about 6000 Å. It is noted that due to the presence of the IMC layer 606a and the IMC layer 606b, the bonding strength between the metallic TIM layer 604 and the lid structure 800 is ensured.

Further, as shown in FIG. 6A, the IMC structures 608 distribute within the metallic TIM layer 604. In some embodiments, some of the IMC structures 608 extend into the metallic TIM layer 604 from the IMC layer 606a or the IMC layer 606b. In some embodiments, some of the IMC structures 608 are formed due to the diffusion of the material of the conductive layer BSM1 and/or the conductive layer BSM2 into the metallic TIM layer 604. In some embodiments, the IMC structures 608 include IMC blocks, sticks, branches, grains or other structures. In embodiments where the metallic TIM layer 604 includes indium, the size of the IMC structure 608 ranges from about 0.1 μm to about 2 μm. It is noted that due to the presence of the IMC structures 608, the bonding strength between the metallic TIM layer 604 and the lid structure 800 is ensured.

In some embodiments, in the semiconductor device 10, the metallic TIM layer 604 and the non-metallic TIM layer 602 are collectively referred to as a TIM structure 600 over the package structure PKG. That is to say, the TIM structure 600 of the semiconductor device 10 includes two portions having different materials (e.g., including metallic material and non-metallic material). From another point of view, a heat dissipation area of the lid structure 800 is divided to metallic joint region with the metallic TIM layer 604 and non-metallic joint region with the non-metallic TIM layer 602. As shown in FIG. 4F, the TIM structure 600 is sandwiched between the rear surface of the package structure PKG and the lid structure 800. As shown in FIG. 4F and FIG. 5, in the semiconductor device 10, the vertical projection of the package structure PKG onto the substrate SUB is completely overlapped with the vertical projection of the TIM structure 600 onto the substrate SUB. With such configuration, in the semiconductor device 10, the lid structure 800 is thermally coupled to the package structure PKG through the TIM structure 600.

As shown in FIG. 4F, FIG. 6A and FIG. 5, in the semiconductor device 10, the vertical projection of the metallic TIM layer 604 onto the substrate SUB is completely overlapped with the vertical projection of the semiconductor die 100a onto the substrate SUB. That is to say, in the semiconductor device 10, the metallic TIM layer 604 is located at the side of the semiconductor die 100a. Because when the semiconductor device 10 is operated, at least one hot spot is generated inside the semiconductor die 100a, the semiconductor die 100a may be referred to as a hot spot region of the semiconductor device 10. By arranging the metallic TIM layer 604 to be overlapped with the semiconductor die 100a, in semiconductor device 10, the heat generated from the semiconductor die 100a is able to easily dissipate to the external environment through the metallic TIM layer 604 and the lid structure 800 thermally coupled thereto, thereby helping to maintain a lower temperature in the package structure PKG. That is to say, owing to the metallic TIM layer 604 of the TIM structure 600, the sufficient heat dissipation efficiency over the semiconductor die 100a (i.e., the hot spot region) of the package structure PKG can be maintain, thereby ensuring the reliability of the semiconductor device 10. In other words, due to the presence of the metallic TIM layer 604 of the TIM structure 600, overall thermal properties (e.g., heat dissipation, heat resistance) of the semiconductor device 10 can be ensured.

As shown in FIG. 4F, FIG. 6A and FIG. 5, in the semiconductor device 10, the vertical projection of the non-metallic TIM layer 602 onto the substrate SUB is overlapped with the vertical projections of the semiconductor dies 100b onto the substrate SUB and the vertical projection of the encapsulant 300 onto the substrate SUB. From another point of view, as shown in FIG. 4C and FIG. 5, in the semiconductor device 10, the metallic TIM layer 604 is surrounded/encircled by the non-metallic TIM layer 602. That is to say, the metallic TIM layer 604 is located within the area circled by the non-metallic TIM layer 602. In detail, in the TIM structure 600, the metallic TIM layer 604 used for dissipating the heat generated from the semiconductor die 100a is surrounded/encircled by the non-metallic TIM layer 602 having different material from the metallic TIM layer 604. In general, warpage derived from shear strength due to coefficient of thermal expansion (CTE) mismatch between the lid structure and the package structure induces mechanical strain/stress to cause delamination of the TIM structure while the metallic TIM layer in the TIM structure has large area (e.g., the metallic TIM layer is overlapped with the whole underlying package structure). In view of this, by arranging the metallic TIM layer 604 to be surrounded by the non-metallic TIM layer 602 in the TIM structure 600 to reduce the metallic interface, the non-metallic TIM layer 602 serves as a buffer layer to reduce the mechanical strain/stress exerted on the metallic TIM layer 604. As such, the problem of delamination of the TIM structure 600 may be sufficiently alleviated. From another point of view, in some embodiments, the area of the vertical projection of the metallic TIM layer 604 onto the substrate SUB is accounted for approximately 30% to 90% area of the vertical projection of the TIM structure 600 onto the substrate SUB, and the area of the vertical projection of the non-metallic TIM layer 602 onto the substrate SUB is accounted for approximately 10% to 70% area of the vertical projection of the TIM structure 600 onto the substrate SUB. With such configuration, the non-metallic TIM layer 602 serves as a buffer layer to reduce the mechanical strain/stress exerted on the metallic TIM layer 604, so as to sufficiently alleviate the problem of delamination of the TIM structure 600.

As shown in FIG. 4F and FIG. 6A, in the semiconductor device 10, the top surface $T_{604}$ of the metallic TIM layer 604 is a planar top surface. That is to say, in the semiconductor device 10, the thickness tc of the metallic TIM layer 604 at center is substantially equal to the thickness te1 and the thickness te2 of the metallic TIM layer 604 at two opposite edges in a cross-sectional view, as shown in FIG. 6A. However, the disclosure is not limited thereto. In some alternative embodiments, the top surface $T_{604}$ of the metallic TIM layer 604 is a non-planar top surface. For example, the thickness tc of the metallic TIM layer 604 at center may be greater than or less than each of the thickness te1 and the thickness te2 of the metallic TIM layer 604 at two opposite edges. In some embodiments, a variation between the thickness tc and the thickness te1 or a variation between the thickness tc and the thickness te2 ranges from about 10 μm to about 40 μm. In some embodiments, a ratio of the thickness tc to the thickness te1 or a ratio of the thickness tc to the thickness te2 is ranges from about 1.1:1 to about 1:1.1. In some embodiments, the thickness te1 of the metallic TIM layer 604 is the same as the thickness te2 of the metallic TIM layer 604. In some embodiments, the thickness te1 of the metallic TIM layer 604 is different from the thickness te2 of the metallic TIM layer 604.

As shown in FIG. 4F and FIG. 6A, in the semiconductor device 10, the metallic TIM layer 604 has a vertical side surface. That is to say, in the semiconductor device 10, the interface between the metallic TIM layer 604 and the non-metallic TIM layer 602 has a vertical surface configuration. With such configuration, in the metallic TIM layer 604, each of the included angle θ1 between the bottom surface and the side surface, the included angle θ2 between the bottom surface and the side surface, the included angle θ3 between the top surface $T_{604}$ and the side surface, and the included angle θ4 between the top surface $T_{604}$ and the side surface is a right angle. From another point of view, in the metallic TIM layer 604, the dimension wt along the direction X at top, the dimension we along the direction X at center and the dimension wb along the direction X at bottom are the same with each other in a cross-sectional view, as shown in FIG. 6A.

In some embodiments, at least one surface device may be optionally formed on the second surface S2 of the substrate SUB. In some embodiments, the conductive terminals 900 are formed on the second surface S2 of the substrate SUB by a ball placement process and a reflow process, while the at least one surface device is mounted on the second surface S2 of the substrate SUB through reflow process. The at least one surface device may be, for example, used to provide additional functionality or programming to the package structure PKG. In some embodiments, the at least one surface device includes a SMD or an IPD that comprises passive devices such as resistors, inductors, capacitors, fuses, jumpers, combinations of these, or the like.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 6B:
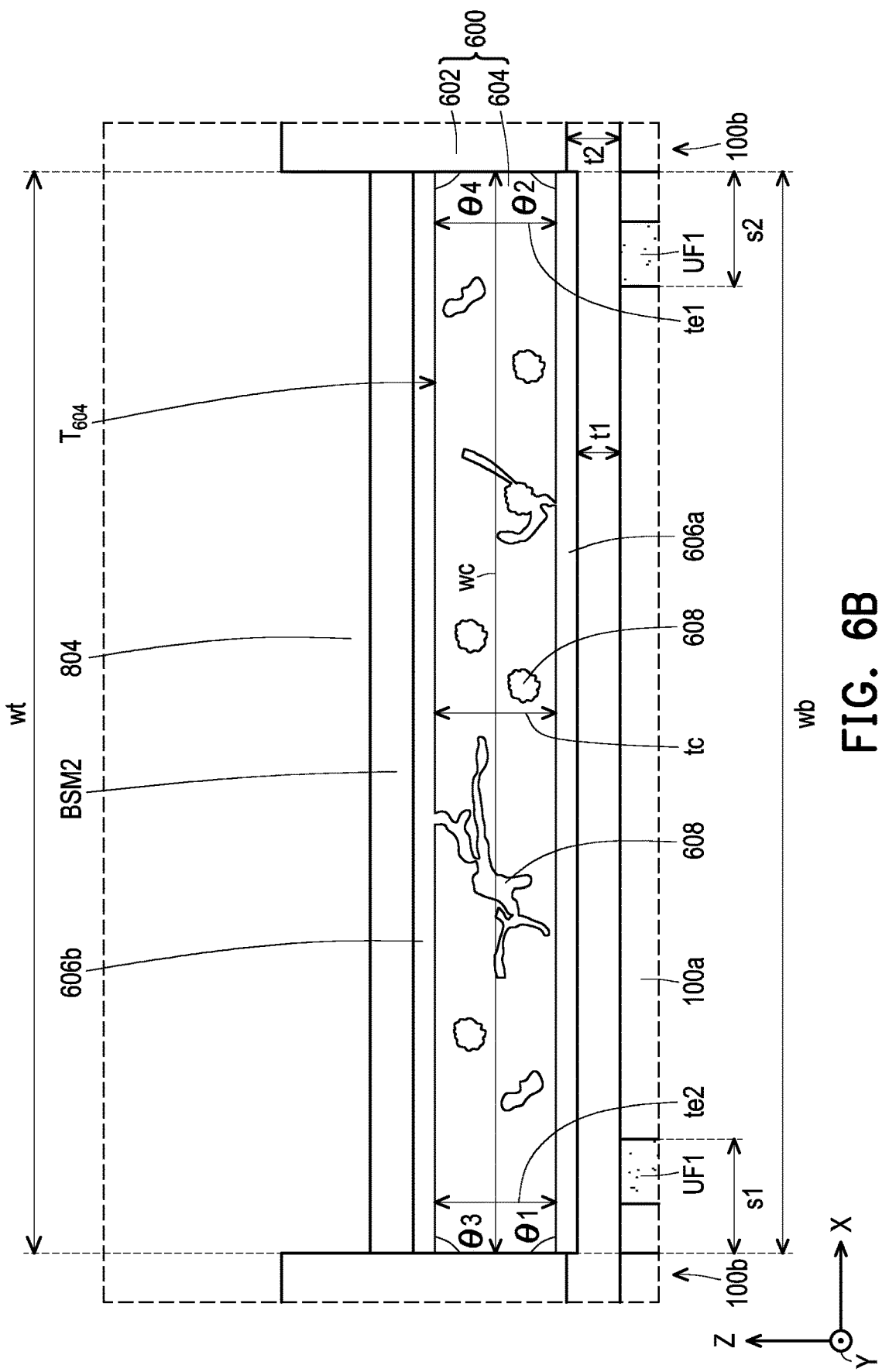
FIG. 6B to FIG. 6I each are schematic enlarged view illustrating a region of a semiconductor device in accordance with some alternative embodiments of the disclosure.
Figure 6C:
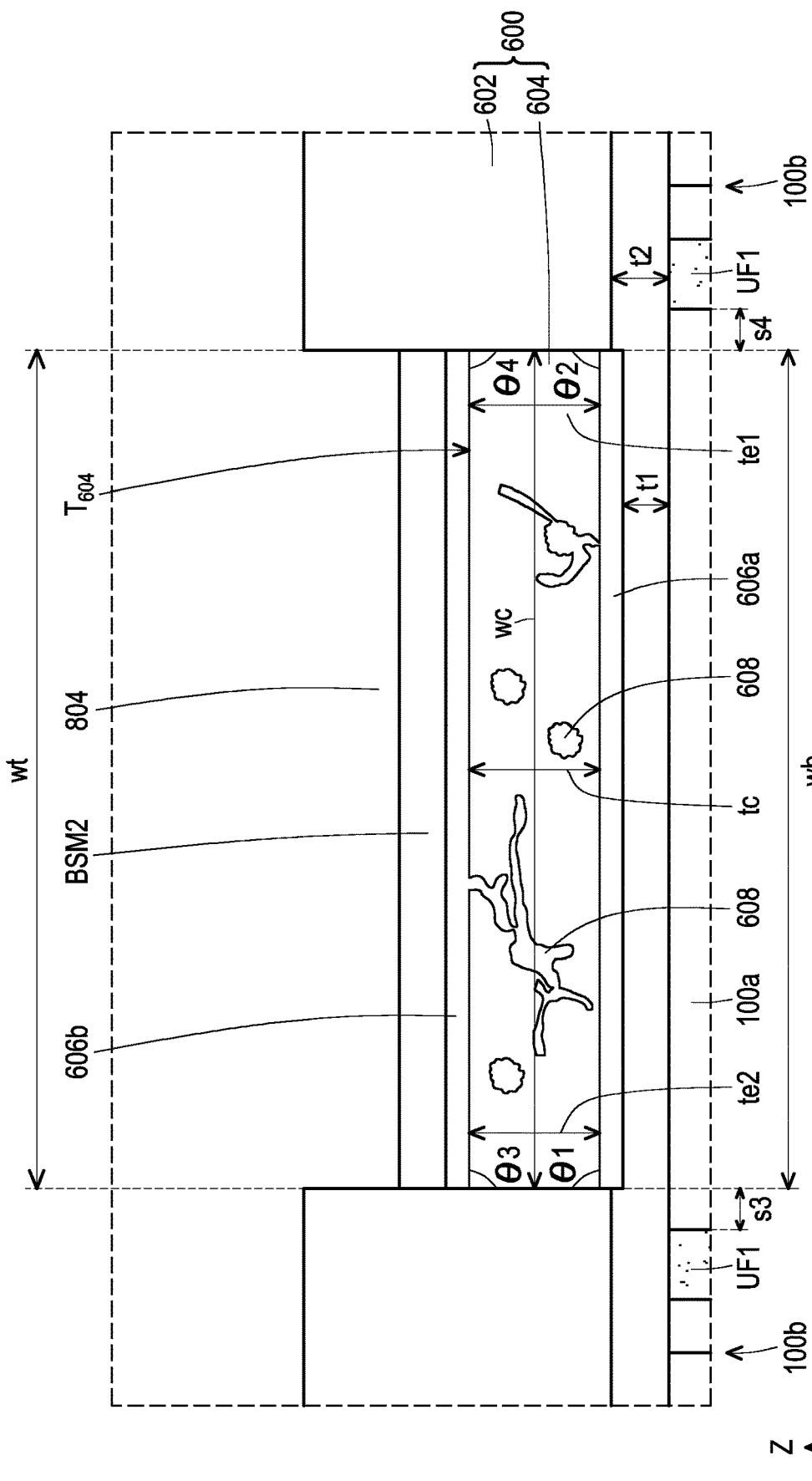

In the semiconductor device 10 illustrated in FIG. 4F and FIG. 6A, the side surfaces of the metallic TIM layer 604 are substantially aligned with the side surfaces of the semiconductor die 100a. However, the disclosure is not limited thereto. Various configurations of the metallic TIM layer 604 with respect to the semiconductor die 100a will be described below in conjunction with FIG. 6B and FIG. 6C. FIG. 6B and FIG. 6C each are schematic enlarged view illustrating a region of a semiconductor device in accordance with some alternative embodiments of the disclosure.

Referring to FIG. 6B, the side surfaces of the metallic TIM layer 604 are not aligned with the side surfaces of the semiconductor die 100a. In detail, as shown in FIG. 6B, the side surfaces of the metallic TIM layer 604 are laterally spaced a distance s1 and a distance s2 from the side surfaces of the semiconductor die 100a. From another point of view, as shown in FIG. 6B, each of the dimension wt, the dimension we and the dimension wb of the metallic TIM layer 604 along the direction X is greater than the dimension W1 of the semiconductor die 100a along the direction X. In some embodiments, each of the distance s1 and the distance s2 ranges from about 1 mm to about 2 mm. In some embodiments, the distance s1 is the same as the distance s2. In some embodiments, the distance s1 is different from the distance s2.

Referring to FIG. 6C, the side surfaces of the metallic TIM layer 604 are not aligned with the side surfaces of the semiconductor die 100a. In detail, as shown in FIG. 6C, the side surfaces of the metallic TIM layer 604 are laterally spaced a distance s3 and a distance s4 from the side surfaces of the semiconductor die 100a. From another point of view, as shown in FIG. 6C, each of the dimension wt, the dimension we and the dimension wb of the metallic TIM layer 604 along the direction X is less than the dimension W1 of the semiconductor die 100a along the direction X. In some embodiments, each of the distance s3 and the distance s4 ranges from about 1 mm to about 2 mm. In some embodiments, the distance s3 is the same as the distance s4. In some embodiments, the distance s3 is different from the distance s4.

Although FIG. 6B and FIG. 6C show cross-sectional views along the direction X, those skilled in the art can understand that the side surfaces of the metallic TIM layer 604 may also not aligned with the side surfaces of the semiconductor die 100a in cross-sectional view along the direction Y. In embodiments where all the side surfaces of the metallic TIM layer 604 are not aligned with the corresponding side surfaces of the semiconductor die 100a, the vertical projection of the metallic TIM layer 604 onto the substrate SUB is partially overlapped with the vertical projection of the semiconductor die 100a onto the substrate SUB. For example, in some embodiments, the vertical projection of the metallic TIM layer 604 onto the substrate SUB falls within the span of the vertical projection of the semiconductor die 100a onto the substrate SUB; and in other embodiments, the vertical projection of the semiconductor die 100a onto the substrate SUB falls within the span of the vertical projection of the metallic TIM layer 604 onto the substrate SUB.

In the semiconductor device 10 illustrated in FIG. 4F and FIG. 6A, the side surfaces of the metallic TIM layer 604 are vertical side surfaces. However, the disclosure is not limited thereto. Various configurations of the metallic TIM layer 604 will be described below in conjunction with FIG. 6D to FIG. 6I. FIG. 6D to FIG. 6I each are schematic enlarged view illustrating a region of a semiconductor device in accordance with some alternative embodiments of the disclosure.

Figure 6D:
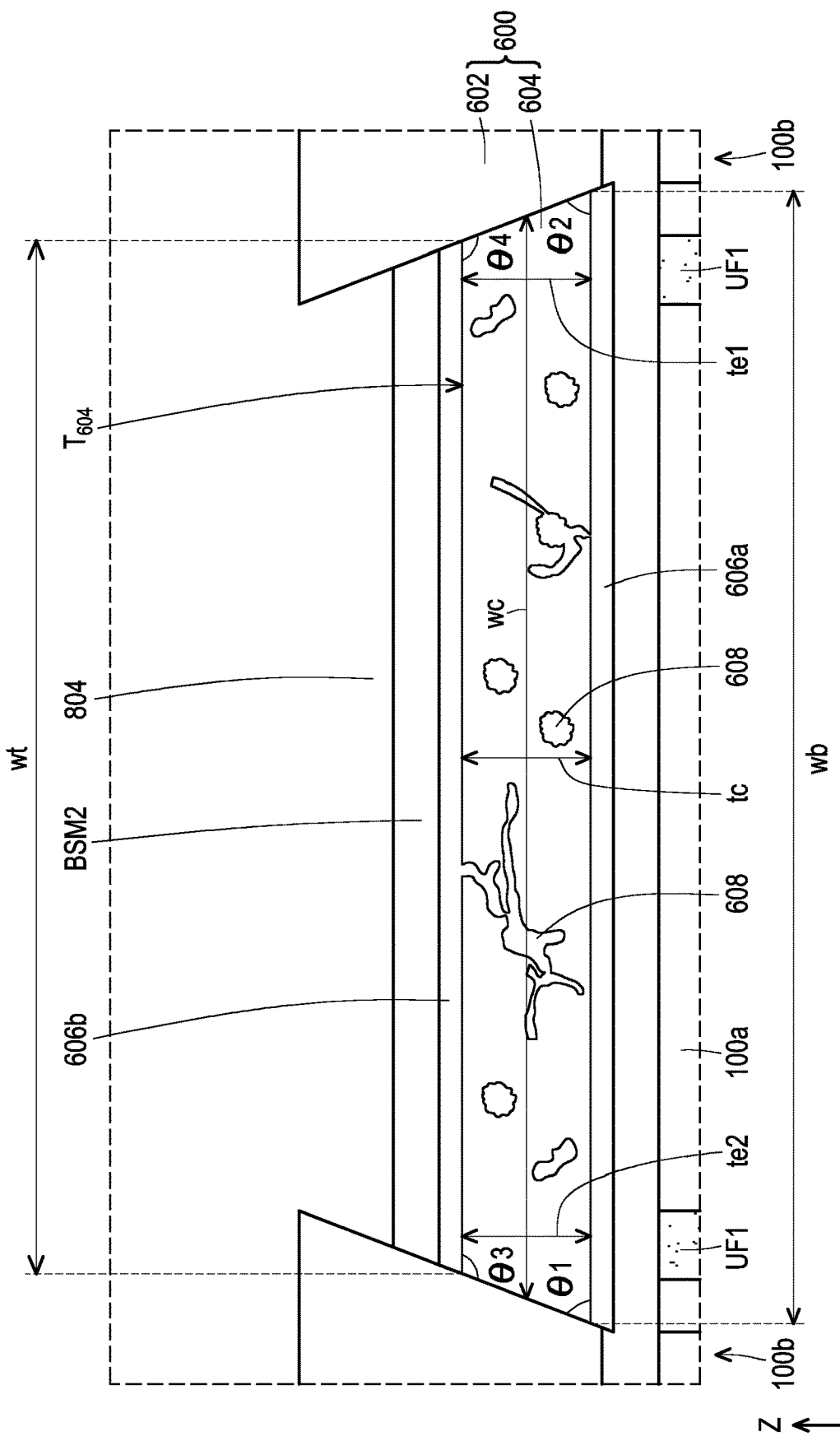

Referring to FIG. 6D, the side surfaces of the metallic TIM layer 604 are tilt side surfaces. In some embodiments, as shown in FIG. 6D, the lateral dimension of the metallic TIM layer 604 increases from the top surface $T_{604}$ to the bottom surface along the direction Z. In detail, in the metallic TIM layer 604 of FIG. 6D, the dimension wt along the direction X is less than the dimension we along the direction X, and the dimension we is less than the dimension wb along the direction X. Further, in some embodiments, each of the included angle θ1 and the included angle θ2 is greater than or equal to 45° and less than 90°; and each of the included angle θ3 and the included angle θ4 is greater than 90° and less than or equal to 135°.

Figure 6E:
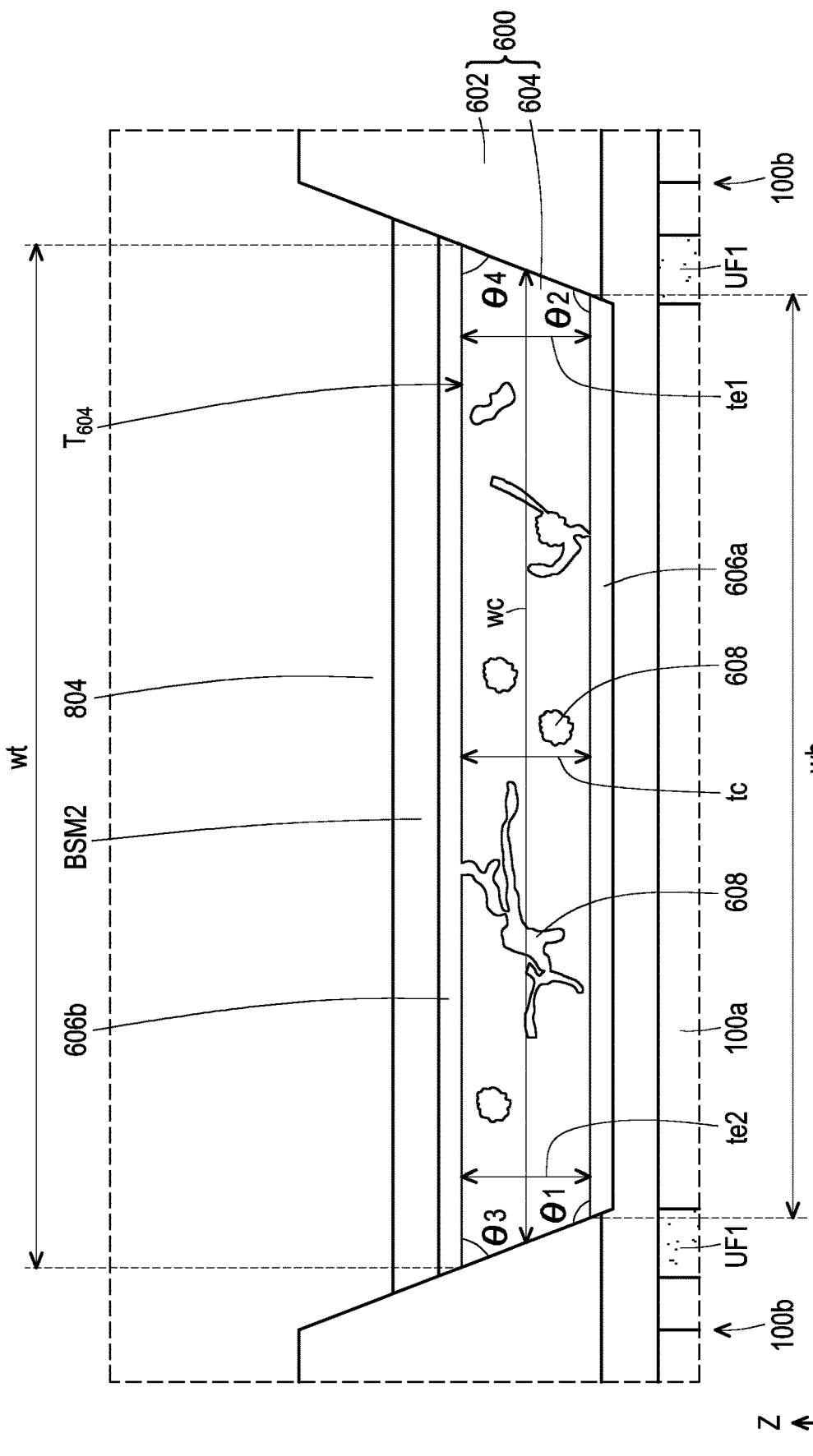

Referring to FIG. 6E, the side surfaces of the metallic TIM layer 604 are tilt side surfaces. In some embodiments, as shown in FIG. 6E, the lateral dimension of the metallic TIM layer 604 decreases from the top surface $T_{604}$ to the bottom surface along the direction Z. In detail, in the metallic TIM layer 604 of FIG. 6E, the dimension wt along the direction X is greater than the dimension we along the direction X, and the dimension we is greater than the dimension wb along the direction X. Further, in some embodiments, each of the included angle θ1 and the included angle θ2 is greater than 90° and less than or equal to 135°; and each of the included angle θ3 and the included angle θ4 is greater than or equal to 45° and less than 90°.

Figure 6F:
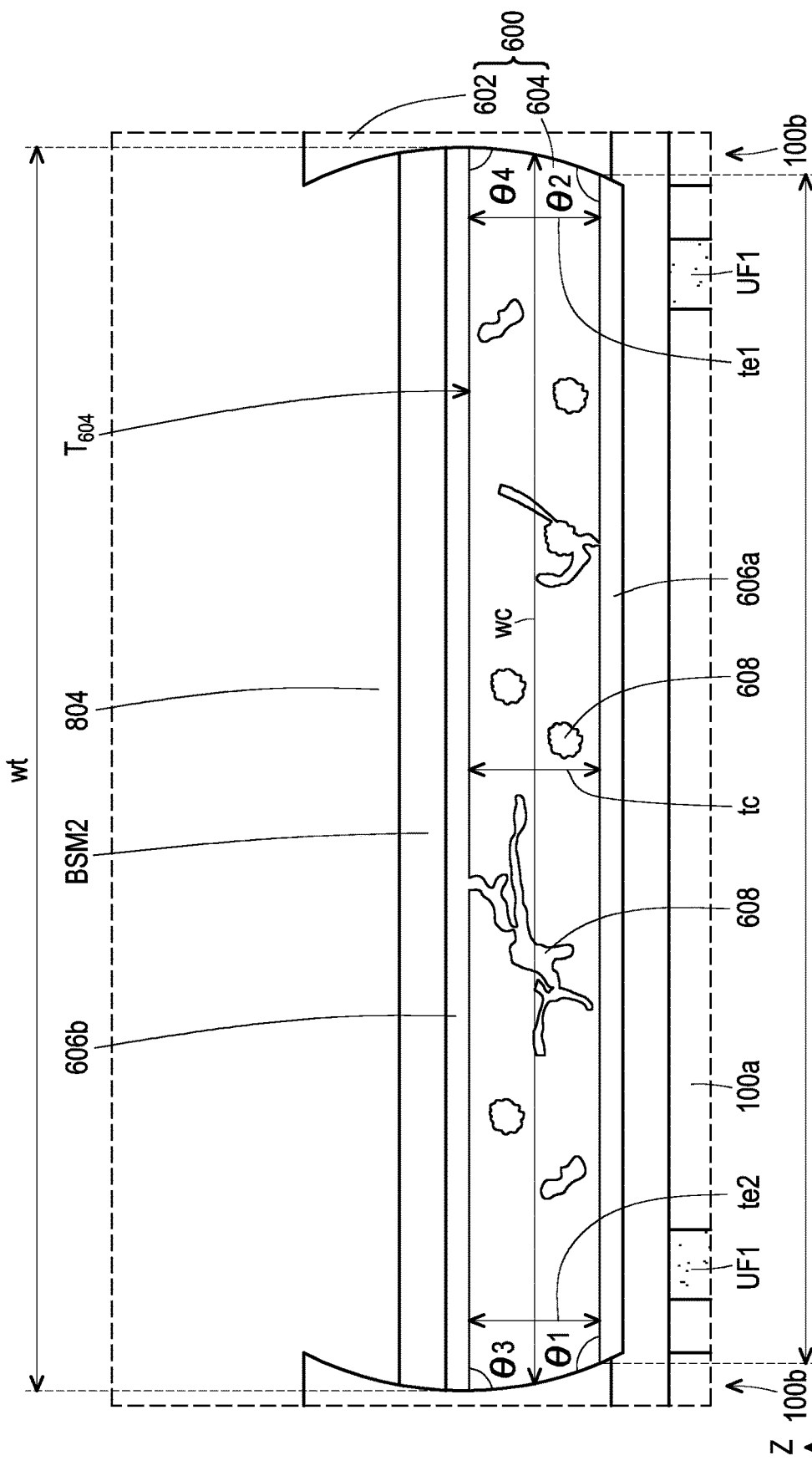

Referring to FIG. 6F, the side surfaces of the metallic TIM layer 604 are convex side surfaces. In some embodiments, as shown in FIG. 6F, the dimension wt along the direction X is greater than the dimension we along the direction X, and the dimension we is greater than the dimension wb along the direction X. Further, in some embodiments, each of the included angle θ1 and the included angle θ2 is greater than 90° and less than or equal to 135°; and each of the included angle θ3 and the included angle θ4 is greater than or equal to 45° and less than 90°.

Figure 6G:
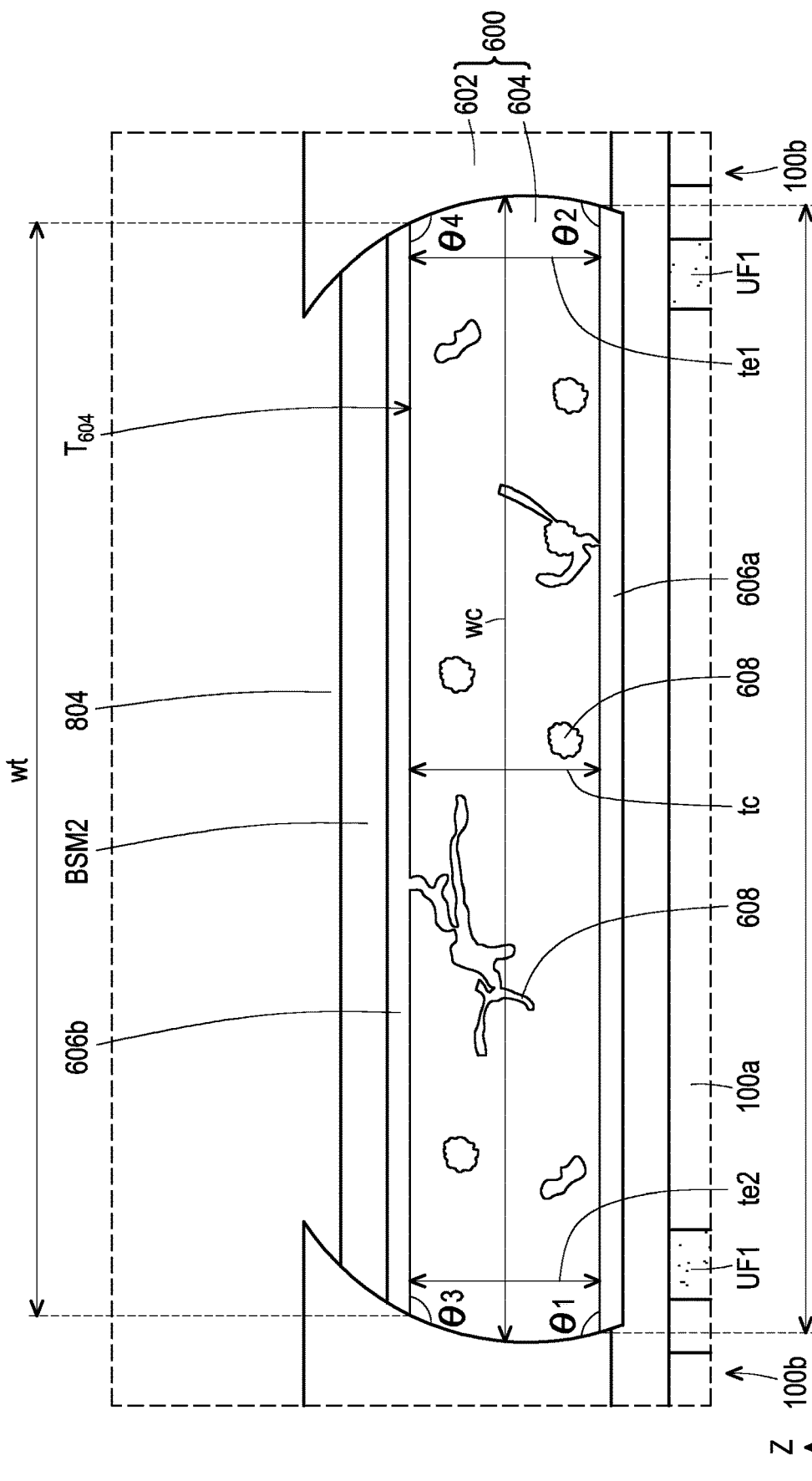

Referring to FIG. 6G, the side surfaces of the metallic TIM layer 604 are convex side surfaces. In some embodiments, as shown in FIG. 6G, the dimension we along the direction X is larger than the dimension wt and the dimension wb along the direction X, and the dimension wt is less than the dimension wb. Further, in some embodiments, each of the included angle θ1, the included angle θ2, the included angle θ3 and the included angle θ4 is greater than 90° and less than or equal to 135°.

It is noted that the configurations of the metallic TIM layer 604 shown in FIG. 6F and FIG. 6G are presented for illustrative purposes, those skilled in the art can understand that the disclosure is not specifically limited thereto. In some alternative embodiments, when the side surfaces of the metallic TIM layer 604 are convex side surfaces, the dimension we along the direction X may be larger than the dimension wt and the dimension wb along the direction X, and the dimension wt may be the same as the dimension wb. In some alternative embodiments, when the side surfaces of the metallic TIM layer 604 are convex side surfaces, the dimension we along the direction X may be larger than the dimension wt and the dimension wb along the direction X, and the dimension wt may be larger than the dimension wb.

Figure 6H:
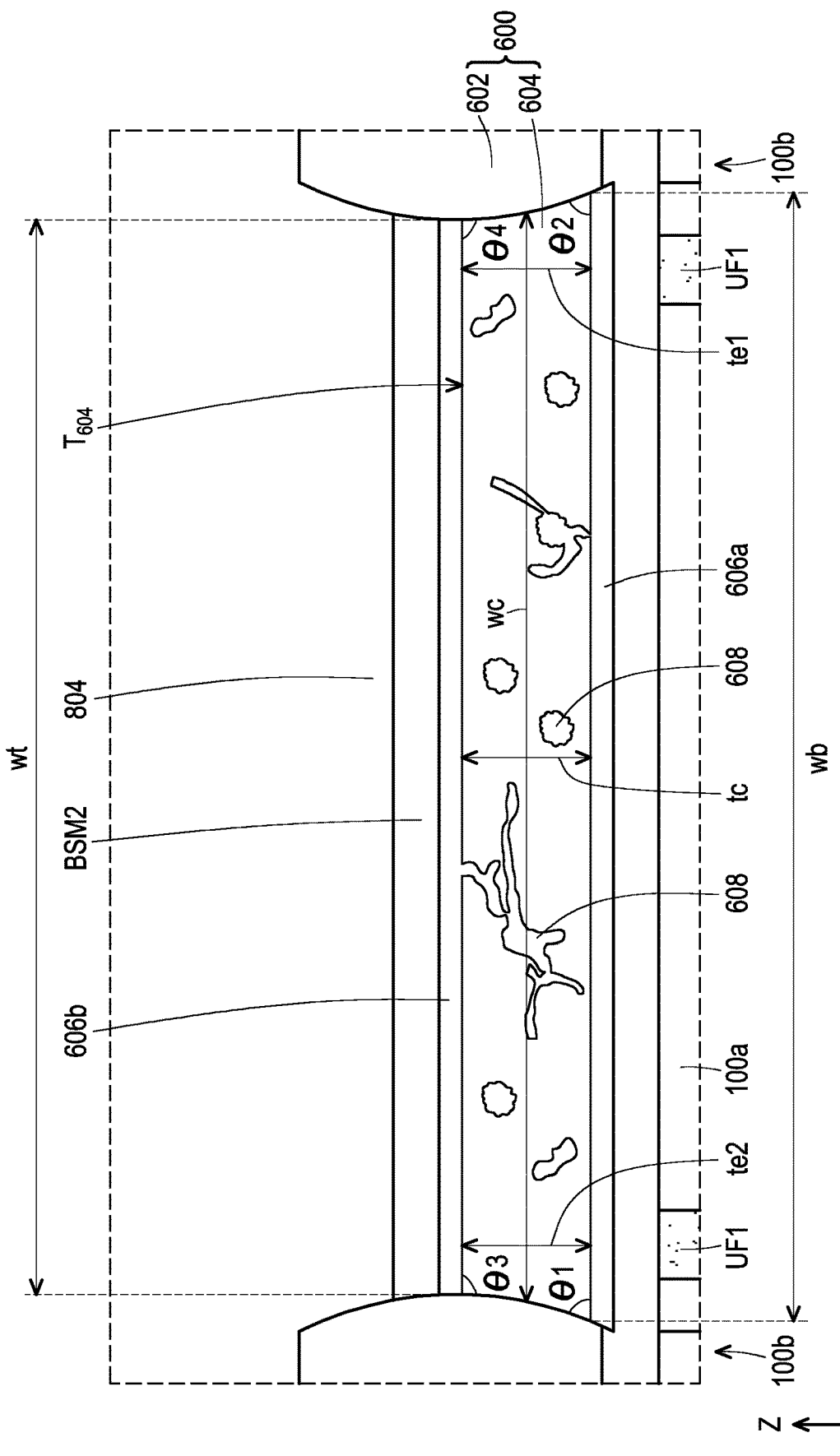

Referring to FIG. 6H, the side surfaces of the metallic TIM layer 604 are concave side surfaces. In some embodiments, as shown in FIG. 6H, the dimension wb along the direction X is greater than the dimension we along the direction X, and the dimension we is greater than the dimension wt along the direction X. Further, in some embodiments, each of the included angle θ1 and the included angle θ2 is greater than or equal to 45° and less than 90'; and each of the included angle θ3 and the included angle θ4 is greater than 90° and less than or equal to 135°.

Figure 6I:
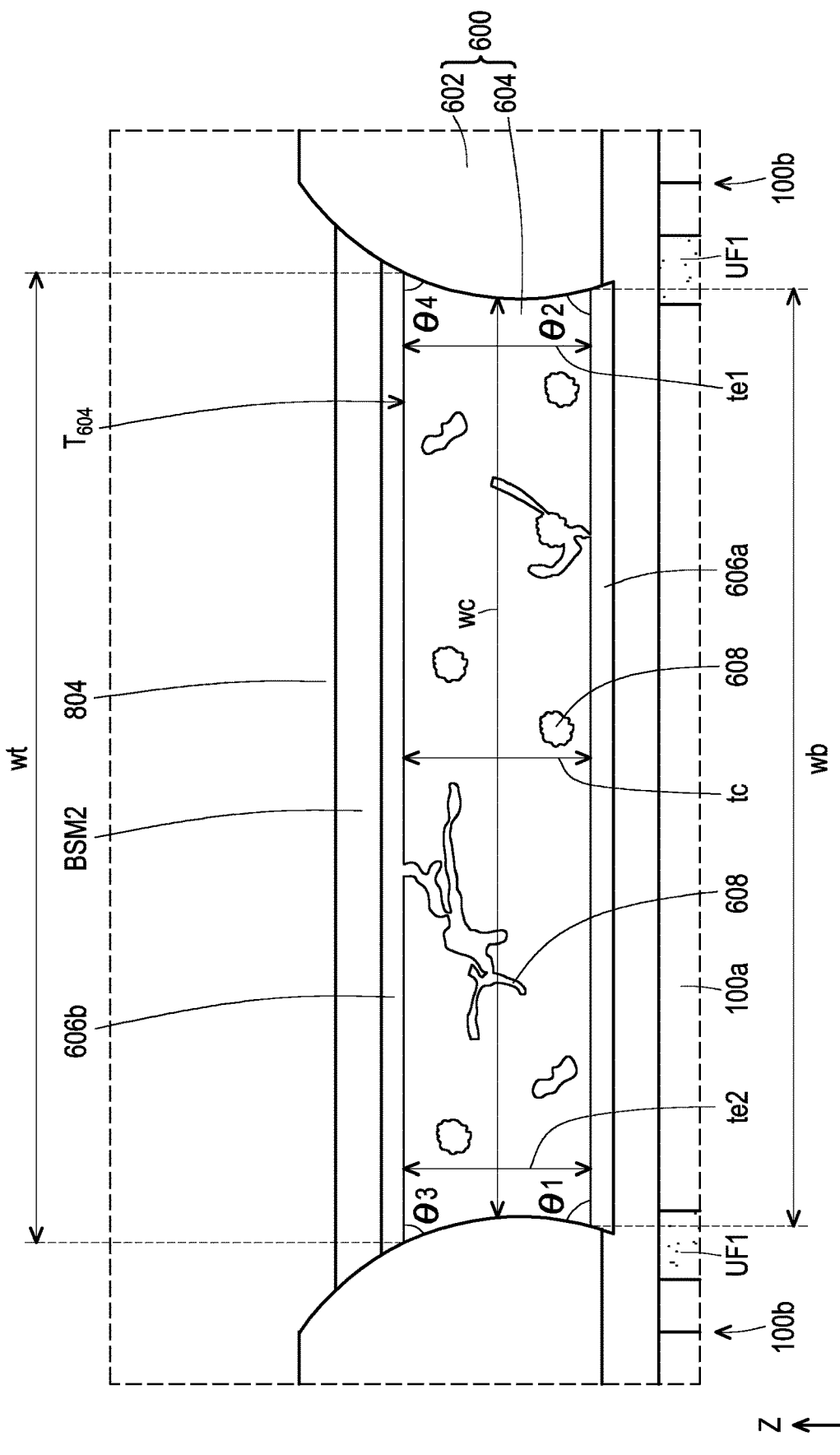

Referring to FIG. 6I, the side surfaces of the metallic TIM layer 604 are concave side surfaces. In some embodiments, as shown in FIG. 6I, the dimension we along the direction X is less than the dimension wt and the dimension wb along the direction X, and the dimension wt is larger than the dimension wb. Further, in some embodiments, each of the included angle θ1, the included angle θ2, the included angle θ3 and the included angle θ4 is greater than or equal to 45° and less than 90°.

It is noted that the configurations of the metallic TIM layer 604 shown in FIG. 6H and FIG. 6I are presented for illustrative purposes, those skilled in the art can understand that the disclosure is not specifically limited thereto. In some alternative embodiments, when the side surfaces of the metallic TIM layer 604 are concave side surfaces, the dimension we along the direction X may be less than the dimension wt and the dimension wb along the direction X, and the dimension wt may be the same as the dimension wb. In some alternative embodiments, when the side surfaces of the metallic TIM layer 604 are concave side surfaces, the dimension we along the direction X is less than the dimension wt and the dimension wb along the direction X, and the dimension wt is less than the dimension wb.

In the semiconductor device 10 illustrated in FIG. 4A to FIG. 4F, the opening O of the non-metallic TIM layer 602 and the semiconductor die 100a are formed in a one-to-one relationship. However, the disclosure is not limited thereto. Various configurations of the non-metallic TIM layer 602 with respect to the semiconductor die 100a will be described below in conjunction with FIG. 7. FIG. 7 is a simplified top view of a semiconductor device 20 in accordance with some alternative embodiments of the disclosure. The semiconductor device 20 illustrated in FIG. 7 is similar to the semiconductor device 10 illustrated in FIG. 4A to FIG. 4F, FIG. 5 and FIG. 6A, hence the same reference numerals are used to refer to the same or liked parts, and its detailed description will be omitted herein. For simplicity, some elements (e.g., the surface devices, the adhesive layer and the lid structure) are omitted in the top view of FIG. 7.

Referring to FIG. 7, in the semiconductor device 20, the non-metallic TIM layer 602 has an opening O1, an opening O2, an opening O3 and an opening O4 which are formed within the span of the vertical projection of the semiconductor die 100a onto the substrate SUB. That is to say, multiple openings are formed in the non-metallic TIM layer 602 and disposed over the semiconductor die 100a. In other words, multiple openings in the non-metallic TIM layer 602 are formed to be overlapped with the semiconductor die 100a in a multiple-to-one relationship. From another point of view, the metallic TIM layer 604 formed over the semiconductor die 100a includes a metallic TIM pattern 604a, a metallic TIM pattern 604b, a metallic TIM pattern 604c and a metallic TIM pattern 604d respectively confined in the opening O1, the opening O2, the opening O3 and the opening O4 of the non-metallic TIM layer 602. That is to say, in semiconductor device 20, the heat generated from the semiconductor die 100a is able to dissipate to the external environment through the multiple patterns of the metallic TIM layer 604 thermally coupled thereto. It should be noted that the number of openings in non-metallic TIM layer 602 and the number of metallic TIM patterns of the metallic TIM layer 604 shown in FIG. 7 are merely an exemplary illustration, and the disclosure is not limited. In some alternative embodiments, the number of openings in non-metallic TIM layer 602 and the number of metallic TIM patterns of the metallic TIM layer 604 may be adjusted depending on the routing requirements, as long as a multiple-to-one relationship between the openings in non-metallic TIM layer 602 to the semiconductor die 100a is rendered.

As mentioned above, the metallic TIM layer 604 is formed to be corresponded to the semiconductor die 100a for heat dissipation. Therefore, in some embodiments, when more than one semiconductor die 100a are formed in the package structure PKG, the metallic TIM layer 604 may be formed to have more than one metallic TIM pattern. From another point of view, in such embodiments, the non-metallic TIM layer 602 may be formed to have more than one openings therein. Further, in some alternative embodiments, when more than one semiconductor die 100a are formed in the package structure PKG, the metallic TIM layer 604 may be formed to be one bulk pattern overlapped with the more than one semiconductor die 100a. That is to say, in such embodiments, the metallic TIM layer 604 is formed to be overlapped with the more than one semiconductor die 100a in a one-to-multiple relationship.

In further alternative embodiments, when multiple semiconductor dies 100a are formed in the package structure PKG, the metallic TIM layer 604 may be formed to be multiple patterns, where at least one pattern of the metallic TIM layer 604 may be formed to be one bulk pattern overlapped with more than one semiconductor die 100a and other patterns of the metallic TIM layer 604 may be independently formed to be one bulk pattern overlapped with a respective one semiconductor die 100a. That is to say, in such further alternative embodiments, the metallic TIM layer 604 is formed to be overlapped with multiple semiconductor dies 100a in an one-to-multiple relationship and an one-to-one relationship. In other alternative embodiments, when multiple semiconductor dies 100a are formed in the package structure PKG, the metallic TIM layer 604 may be formed to be multiple patterns, where at least one pattern of the metallic TIM layer 604 may be formed to be one bulk pattern overlapped with more than one semiconductor die 100a, more than one pattern of the metallic TIM layer 604 may be formed to be overlapped with one semiconductor die 100a, and other patterns of the metallic TIM layer 604 may be independently formed to be one bulk pattern overlapped with a respective one semiconductor die 100a. That is to say, in such other alternative embodiments, the metallic TIM layer 604 is formed to be overlapped with multiple semiconductor dies 100a in an one-to-multiple relationship, multiple-to-one relationship, and an one-to-one relationship.

FIG. 8A to FIG. 8E are schematic cross-sectional views illustrating a manufacturing process of a semiconductor device 30 in accordance with some alternative embodiments of the disclosure. The elements similar to or substantially the same as the elements described previously will use the same reference numbers, and certain details or descriptions (e.g., the materials, formation processes, positioning configurations, etc.) of the same elements would not be repeated herein.

Figure 8A:
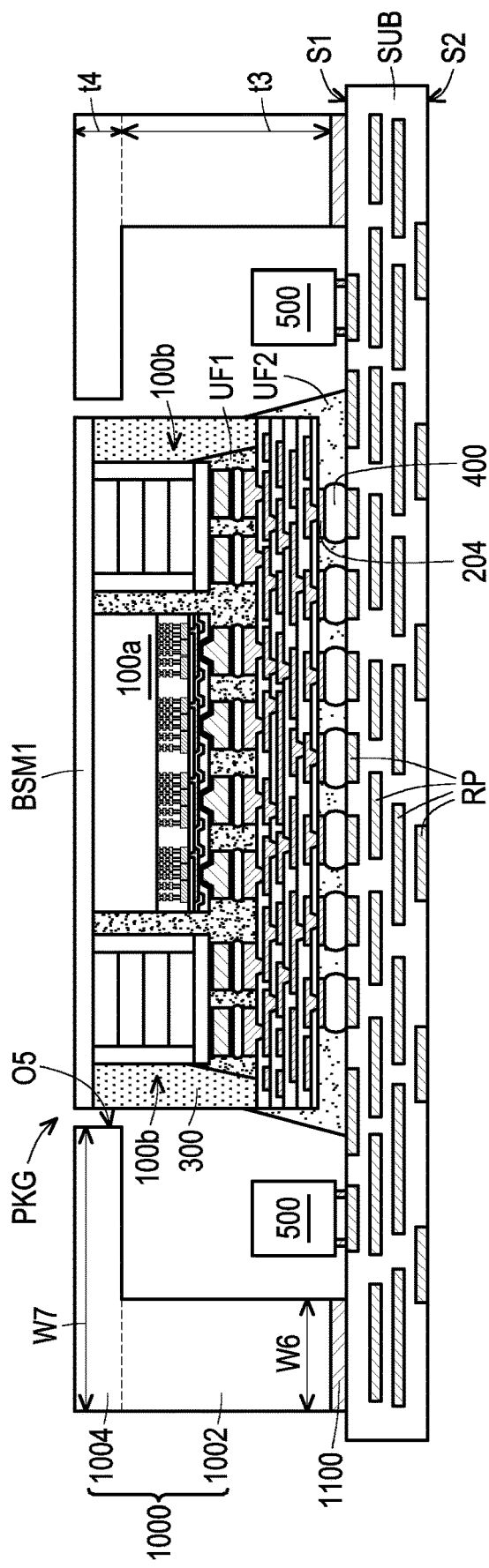

Referring to FIG. 8A, a structure same as the structure of FIG. 4A is provided. Details or descriptions (e.g., the materials, formation processes, positioning configurations, etc.) of the substrate SUB, the package structure PKG, the underfill layer UF2 and the surface devices 500 have been described in conjunction with FIG. 4A above, and will not be iterated herein again. Accordingly, for details or descriptions of the substrate SUB, the package structure PKG, the underfill layer UF2 and the surface devices 500 not iterated herein, please refer to the aforesaid embodiments.

Continued on FIG. 8A, a stiffener ring 1000 is attached to the substrate SUB. In some embodiment, the stiffener ring 1000 is made of metal. The metal for the stiffener ring 1000 includes, but is not limited to, aluminum, stainless steel or CuNi. In some embodiments, the Young's modulus of the stiffener ring 1000 ranges from about 50 GPa to about 200 GPa. In some embodiment, the stiffener ring 1000 encircles the package structure PKG and the surface devices 500. As shown in FIG. 8A, the stiffener ring 1000 includes a cover portion 1004 and a leg portion 1002 connected to the cover portion 1004. In some embodiments, the cover portion 1004 and the leg portion 1002 are integrally formed. In some embodiments, the leg portion 1002 is spatially separated from the package structure PKG, the underfill layer UF2, and the surface devices 500. In some embodiments, the cover portion 1004 has an opening O5 which is formed to correspond to the location of the package structure PKG. In detail, as shown in FIG. 8A, the sidewalls of the opening O5 defined by the cover portion 1004 are not in contact with the package structure PKG and the conductive layer BSM1. However, the disclosure is not limited thereto. In some alternative embodiments, the sidewalls of the opening O5 defined by the cover portion 1004 may be in physical contact with the package structure PKG and/or the conductive layer BSM1. In some embodiments, in a cross-sectional view as shown in FIG. 8A, the dimension W6 of the leg portion 1002 along the direction X is less than the dimension W7 of the cover portion 1004 along the direction X. In some embodiments, the top surface of the cover portion 1004 (i.e., the top surface of the stiffener ring 1000) is substantially coplanar with the top surface of the conductive layer BSM1. However, the disclosure is not limited thereto. In some alternative embodiments, the top surface of the cover portion 1004 may be located at a level height higher than or lower than that of the top surface of the conductive layer BSM1. In some embodiments, the thickness t3 of the leg portion 1002 along the direction Z is larger than the thickness t4 of the cover portion 1004 along the direction Z. In some embodiments, the thickness t3 of the leg portion 1002 along the direction Z ranges from about 400 μm to about 700 μm, and the thickness t4 of the cover portion 1004 along the direction Z ranges from about 100 μm to about 300 μm. In some embodiments, a ratio of the thickness t3 of the leg portion 1002 to the thickness t4 of the cover portion 1004 ranges from 2.3 to 4.

In some embodiments, as shown in FIG. 8A, the stiffener ring 1000 is attached to the substrate SUB through an adhesive layer 1100. For example, the stiffener ring 1000 is first placed over the substrate SUB such that the leg portion 1002 is in physical contact with the adhesive layer 1100. Thereafter, the stiffener ring 1000 is pressed against the adhesive layer 1100. In some embodiments, pressing the stiffener ring 1000 against the adhesive layer 1100 includes performing a heat clamping process, wherein the process temperature of the heat clamping process ranges from about 60° C. to about 300° C. Subsequently, a curing process is performed on the adhesive layer 1100 such that the stiffener ring 1000 is attached to the substrate SUB through the adhesive layer 1100. In detail, the curing process is performed on the adhesive layer 1100 to securely fix the stiffener ring 1000 onto the substrate SUB. In some embodiments, the process temperature of the curing process ranges from about 60° C. to about 300° C.

In some embodiments, the adhesive layer 1100 is disposed near edges of the first surface S1 of the substrate SUB to surround the package structure PKG, the underfill layer UF2, and the surface devices 500. In some embodiments, the adhesive layer 1100 partially covers the first surface S1 of the substrate SUB. For example, the package structure PKG, the underfill layer UF2, and the surface devices 500 are physically isolated from the adhesive layer 1100. In some embodiments, the adhesive layer 1100 has a ring-like shape in the plane view such as the top view. In some embodiments, the pattern of the adhesive layer 1100 may be designed based on the various design. For example, the adhesive layer 1100 may have a linear shape, L shape, U shape, dot shape, etc. In some embodiments, the shape of the adhesive layer 1100 depends on the shape of the substrate SUB. For example, when the substrate SUB is in wafer form (i.e., having a circular top view), the adhesive layer 1100 exhibits a circular ring-like shape from the top view. For example, when the substrate SUB is in panel form (i.e., having a rectangular or squared top view), the adhesive layer 1100 exhibits a rectangular or squared ring-like shape from the top view. In some embodiments, the adhesive layer 1100 is applied onto the substrate SUB through a dispensing process, a spin-coating process, or the like. In some embodiments, the adhesive layer 1100 has a thermal conductivity lower than about 0.5 W/m·K. In some embodiments, the adhesive layer 1100 includes an epoxy-based material. However, the disclosure is not limited to. In some alternative embodiments, other polymeric materials having adhering property may be utilized as the adhesive layer 1100.

Figure 8B:
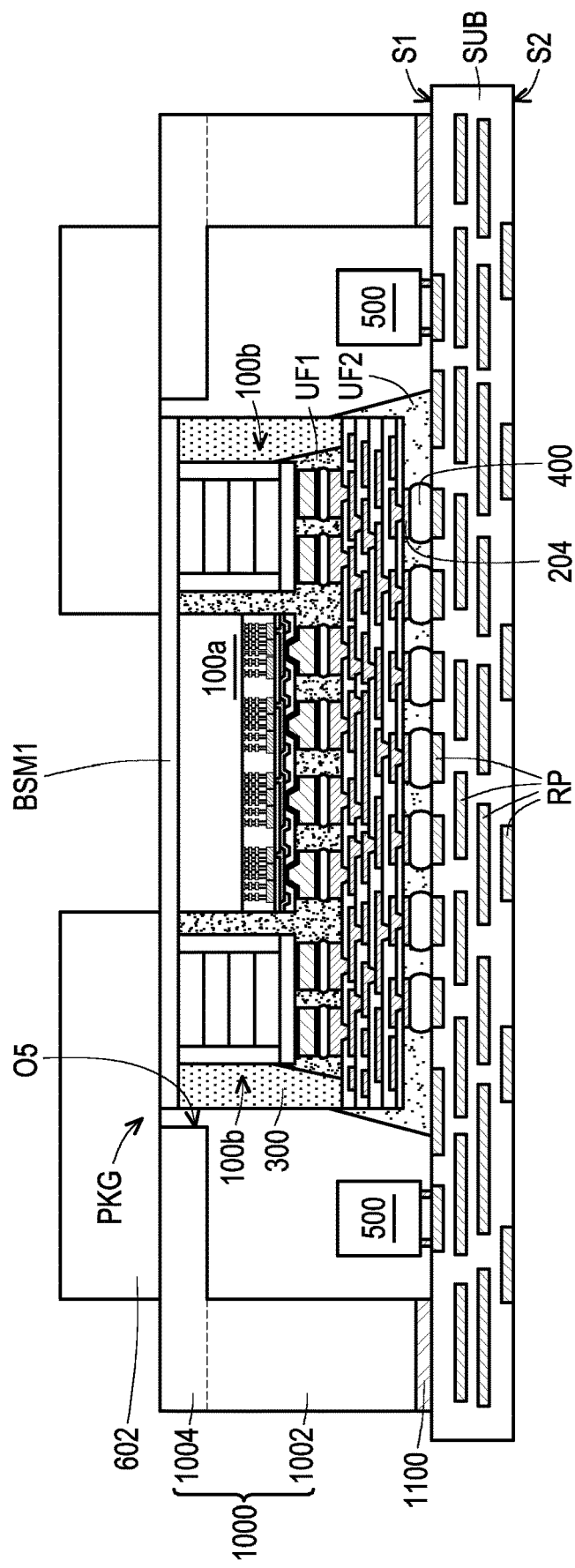

Referring to FIG. 8B, after the stiffener ring 1000 is provided over the substrate SUB, the non-TIM layer 602 is formed. In some embodiments, as shown in FIG. 8B, the non-TIM layer 602 is in contact with the stiffener ring 1000. For example, as shown in FIG. 8B, the non-TIM layer 602 is in physical contact with the top surface of the cover portion 1004 of the stiffener ring 1000. From another point of view, as shown in FIG. 8B, the outer side surface of the non-metallic TIM layer 602 is laterally spaced a distance from the outer side surface of the encapsulant 300 in the package structure PKG. It is noted that by arranging the stiffener ring 1000, the non-metallic TIM layer 602 can extend laterally past the outer side surface of the package structure PKG. That is to say, the stiffener ring 1000 provides a wider process window for forming the non-metallic TIM layer 602.

Figure 8C:
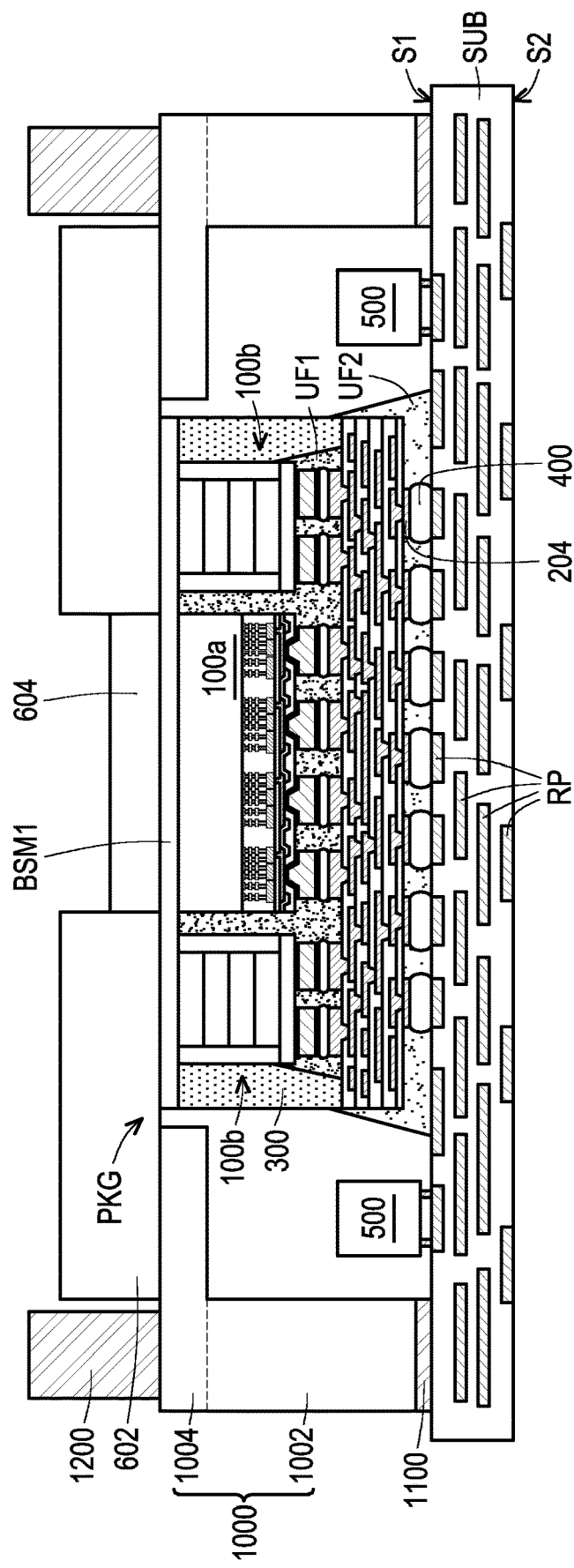

Referring to FIG. 8C, after the non-metallic TIM layer 602 is formed, the metallic TIM layer 604 is formed on the conductive layer BSM1, an then an adhesive layer 1200 is formed on the stiffener ring 1000. In some embodiments, the adhesive layer 1200 is disposed near edges of the top surface of the stiffener ring 1000 to surround the non-metallic TIM layer 602 and the metallic TIM layer 604. In some embodiments, the adhesive layer 1200 partially covers the top surface of the stiffener ring 1000. For example, the non-metallic TIM layer 602 is physically isolated from the adhesive layer 1200. In some embodiments, the adhesive layer 1200 has a ring-like shape in the plane view such as the top view. In some embodiments, the pattern of the adhesive layer 1200 may be designed based on the various design. For example, the adhesive layer 1200 may have a linear shape, L shape, U shape, dot shape, etc. In some embodiments, the shape of the adhesive layer 1200 depends on the shape of the substrate SUB. For example, when the substrate SUB is in wafer form (i.e., having a circular top view), the adhesive layer 1200 exhibits a circular ring-like shape from the top view. For example, when the substrate SUB is in panel form (i.e., having a rectangular or squared top view), the adhesive layer 1200 exhibits a rectangular or squared ring-like shape from the top view. In some embodiments, the adhesive layer 1200 is applied onto the stiffener ring 1000 through a dispensing process, a spin-coating process, or the like. In some embodiments, the adhesive layer 1200 has a thermal conductivity lower than about 0.5 W/m·K. In some embodiments, the adhesive layer 1200 includes an epoxy-based material. However, the disclosure is not limited to. In some alternative embodiments, other polymeric materials having adhering property may be utilized as the adhesive layer 1200.

Referring to FIG. 8D, the lid structure 800 is placed over the stiffener ring 1000 such that the non-metallic TIM layer 602 is located between the stiffener ring 1000 and the lid structure 800. The lid structure 800 shown in FIG. 8D includes the cover portion 802a and the protruding portion 804 without including the leg portion 802b. As such, as shown in FIG. 8D, the lid structure 800 is securely fixed onto the stiffener ring 1000 through attaching the cover portion 802a to the adhesive layer 1200.

Figure 8E:
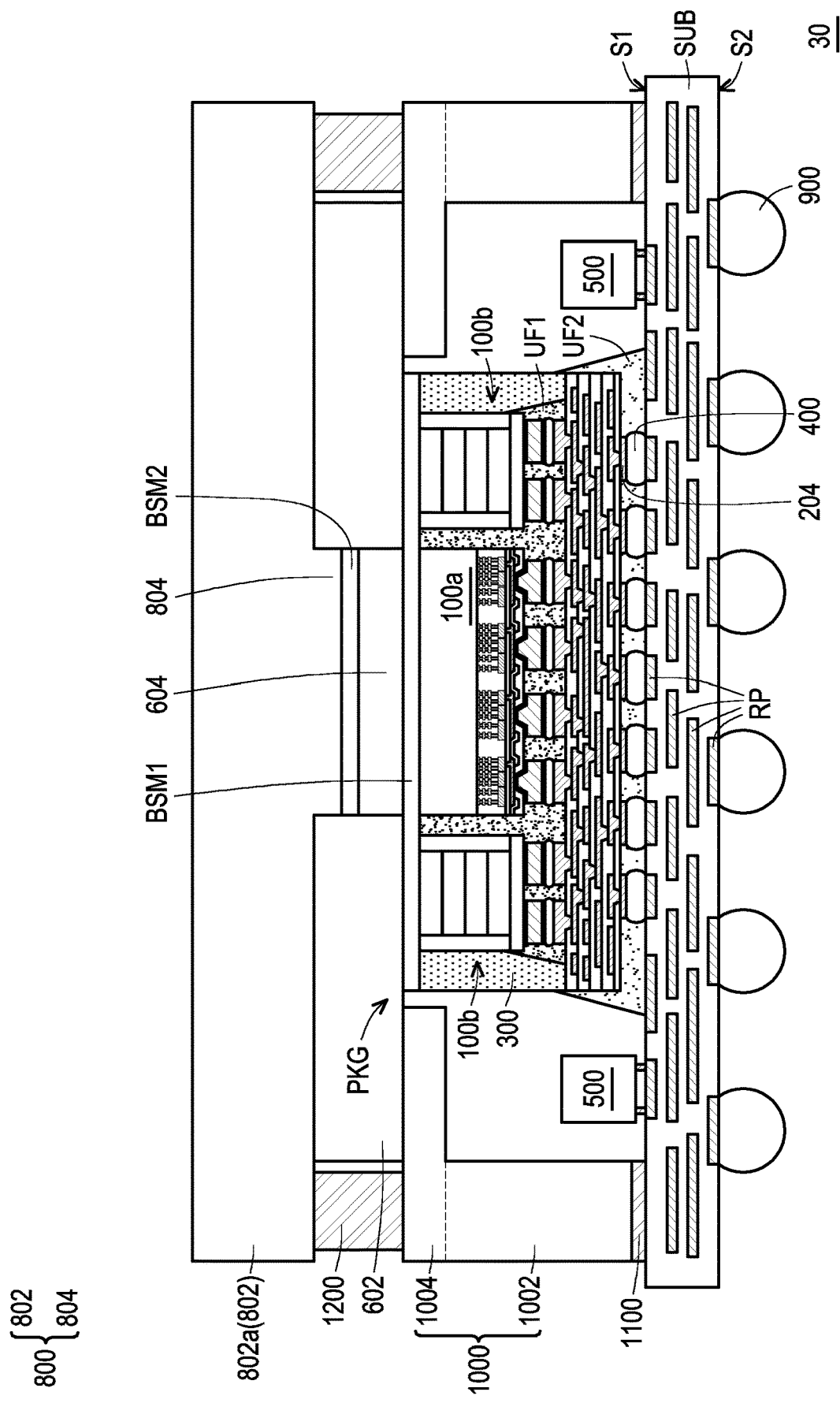

Referring to FIG. 8E, after the lid structure 800 is attached to the stiffener ring 1000, the conductive terminals 900 are formed on the second surface S2 of the substrate SUB to obtain the semiconductor device 30. In the semiconductor device 30, the lid structure 800 is attached to the substrate SUB through the adhesive layer 1200, the stiffener ring 1000 and the adhesive layer 1100. With such configuration, it is noted that the reliability of the semiconductor device 30 is improved.

FIG. 9A to FIG. 9D are schematic cross-sectional views illustrating a manufacturing process of a semiconductor device 40 in accordance with some alternative embodiments of the disclosure. The elements similar to or substantially the same as the elements described previously will use the same reference numbers, and certain details or descriptions (e.g., the materials, formation processes, positioning configurations, etc.) of the same elements would not be repeated herein.

Figure 9A:
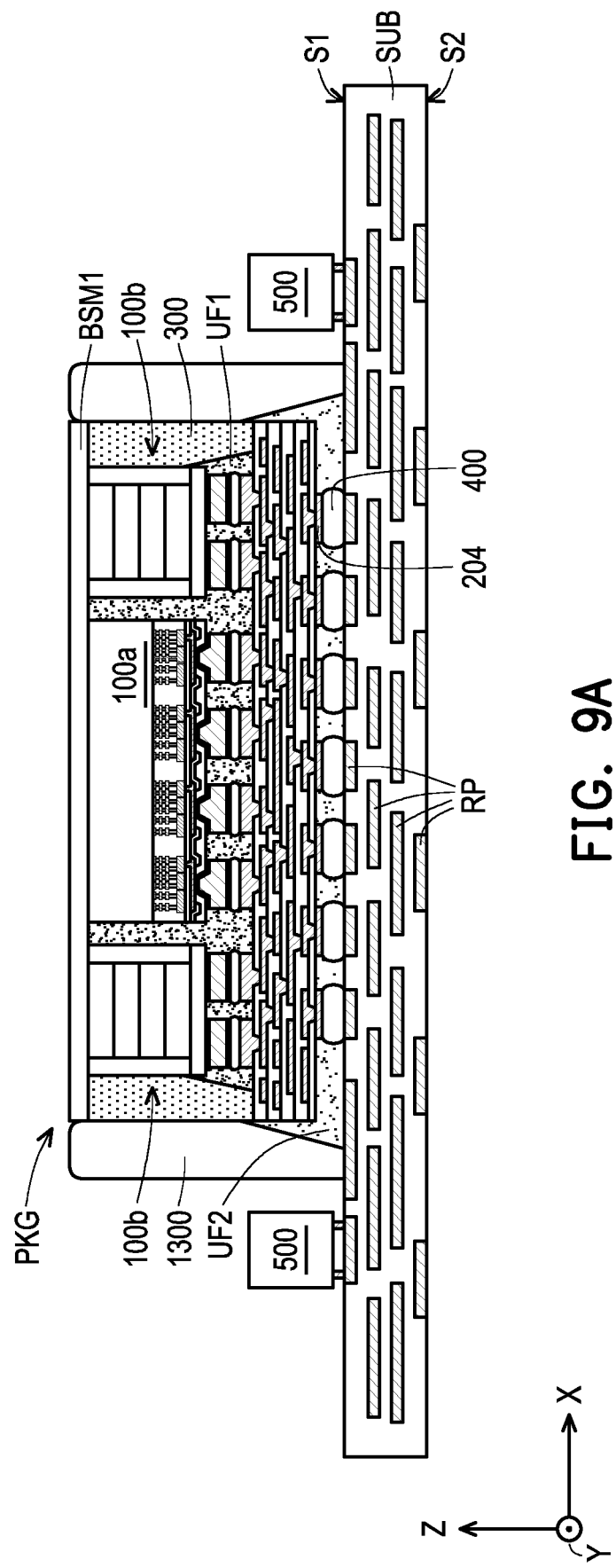
FIG. 9A to FIG. 9D are schematic cross-sectional views illustrating a manufacturing process of a semiconductor device in accordance with some alternative embodiments of the disclosure.

Referring to FIG. 9A, a structure same as the structure of FIG. 4A is provided. Details or descriptions (e.g., the materials, formation processes, positioning configurations, etc.) of the substrate SUB, the package structure PKG, the underfill layer UF2 and the surface devices 500 have been described in conjunction with FIG. 4A above, and will not be iterated herein again. Accordingly, for details or descriptions of the substrate SUB, the package structure PKG, the underfill layer UF2 and the surface devices 500 not iterated herein, please refer to the aforesaid embodiments.

Continued on FIG. 9A, a gel ring 1300 is formed on the substrate SUB. In some embodiment, the gel ring 1300 may include a polymer with fillers. In some embodiment, the polymer for the gel ring 1300 includes, but is not limited to, epoxy base polymer, silica base polymer or acrylic base polymer. In some embodiment, the fillers for the gel ring 1300 includes, but is not limited to, ceramic fillers or metal filler. In some embodiments, the Young's modulus of the gel ring 1300 ranges from about 10 MPa to about 100 MPa. In some embodiments, the gel ring 1300 may be formed using dispensing process, a spin-coating process, or the like, and followed by a curing step to cure the gel ring 1300. The curing step may include a ultra-violet (UV) light exposure process, an infrared (IR) energy exposure process, combinations thereof, or a combination thereof with a heating process. In some embodiment, the gel ring 1300 encircles the package structure PKG. In some embodiments, the shape of the gel ring 1300 depends on the shape of the package structure PKG. For example, when the package structure PKG has a rectangular or squared top view, the gel ring 1300 exhibits a rectangular or squared ring-like shape from the top view. In some embodiments, the surface devices 500 are physically isolated from the gel ring 1300. In some embodiments, the gel ring 1300 is in physical contact with the package structure PKG and the underfill layer UF2. However, the disclosure is not limited thereto. In some alternative embodiments, the gel ring 1300 is physically isolated from the package structure PKG. In some alternative embodiments, the gel ring 1300 is physically isolated from the package structure PKG and the underfill layer UF2. In some embodiments, the top surface of the gel ring 1300 is substantially coplanar with the top surface of the conductive layer BSM1. However, the disclosure is not limited thereto. In some alternative embodiments, the top surface of the gel ring 1300 is located at a level height higher than or lower than that of the top surface of the conductive layer BSM1.

Figure 9B:
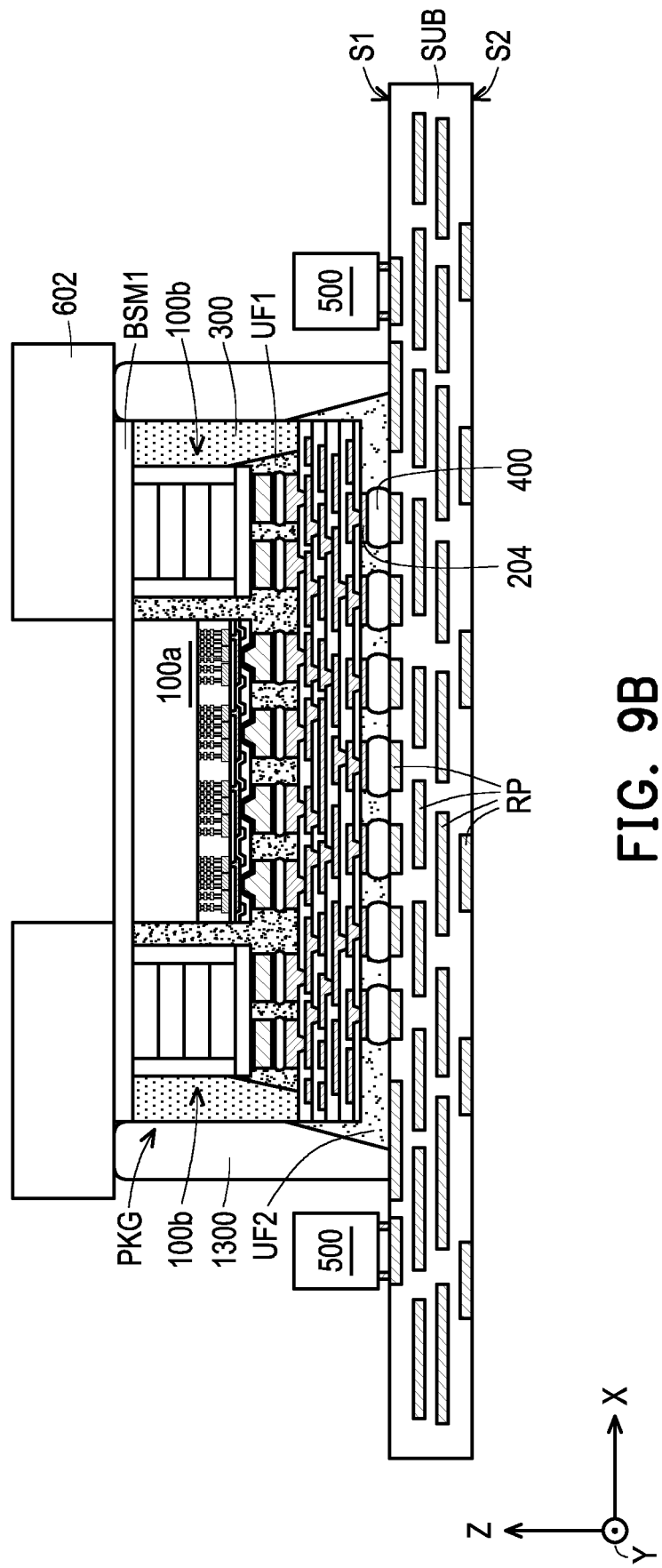

Referring to FIG. 9B, after the gel ring 1300 is provided on the substrate SUB, the non-TIM layer 602 is formed. In some embodiments, as shown in FIG. 9B, the non-TIM layer 602 is in contact with the gel ring 1300. For example, as shown in FIG. 9B, the non-TIM layer 602 is in physical contact with the top surface of the gel ring 1300. From another point of view, as shown in FIG. 9B, the outer side surface of the non-metallic TIM layer 602 is laterally spaced a distance from the outer side surface of the encapsulant 300 in the package structure PKG. It is noted that by arranging the gel ring 1300, the non-metallic TIM layer 602 can extend laterally past the outer side surface of the package structure PKG. That is to say, the gel ring 1300 provides a wider process window for forming the non-metallic TIM layer 602. Further, as shown in FIG. 9B, the non-metallic TIM layer 602 extends laterally past the outer side surface of the gel ring 1300. However, the disclosure is not limited to. In some alternative embodiments, the outer side surface of the non-metallic TIM layer 602 may be substantially aligned with the outer side surface of the gel ring 1300.

Figure 9C:
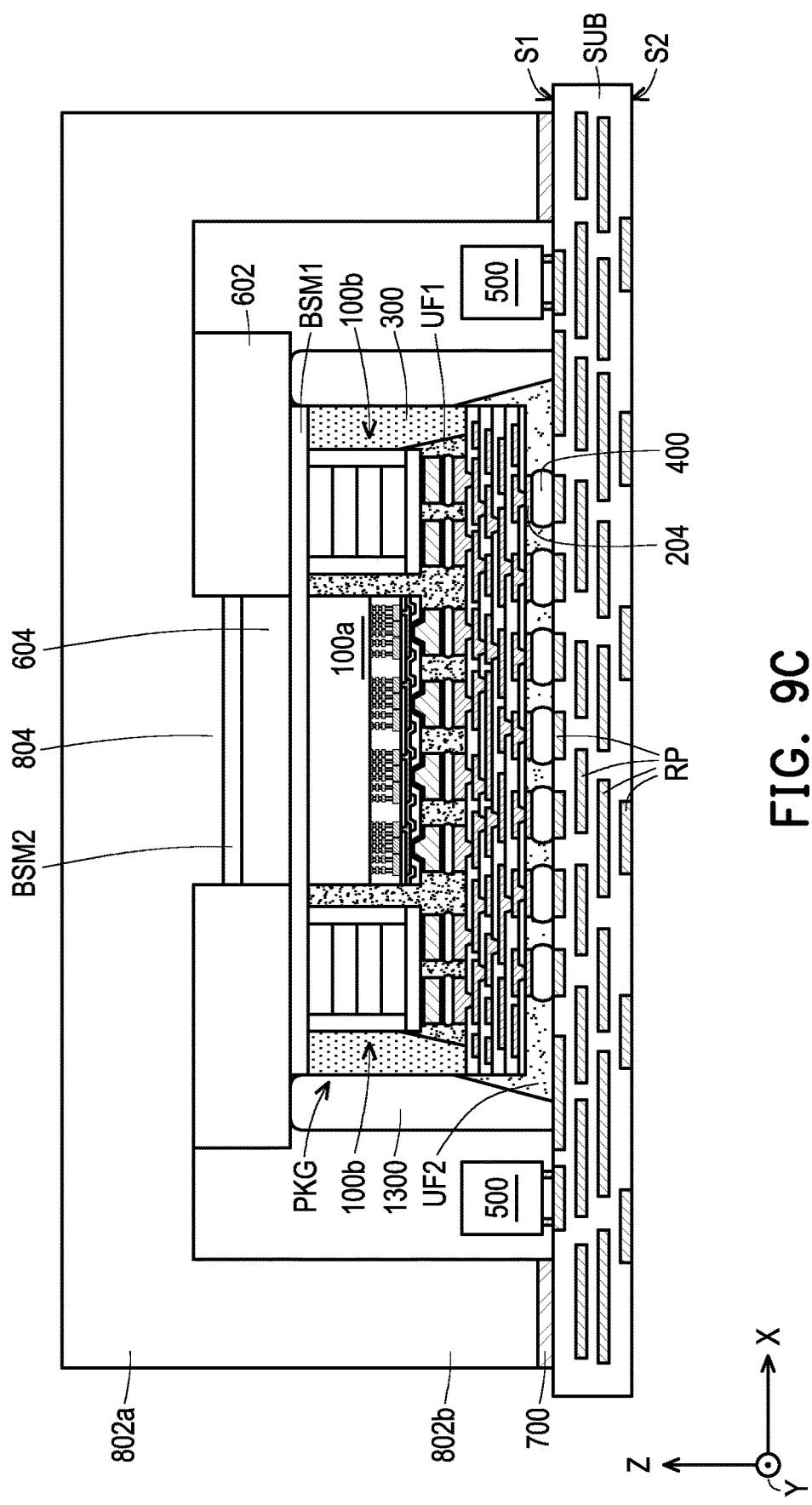

Referring to FIG. 9C, after the non-metallic TIM layer 602 is formed, the metallic TIM layer 604 is formed on the conductive layer BSM1, an then the lid structure 800 is attached to the substrate SUB through the adhesive layer 700.

Figure 9D:
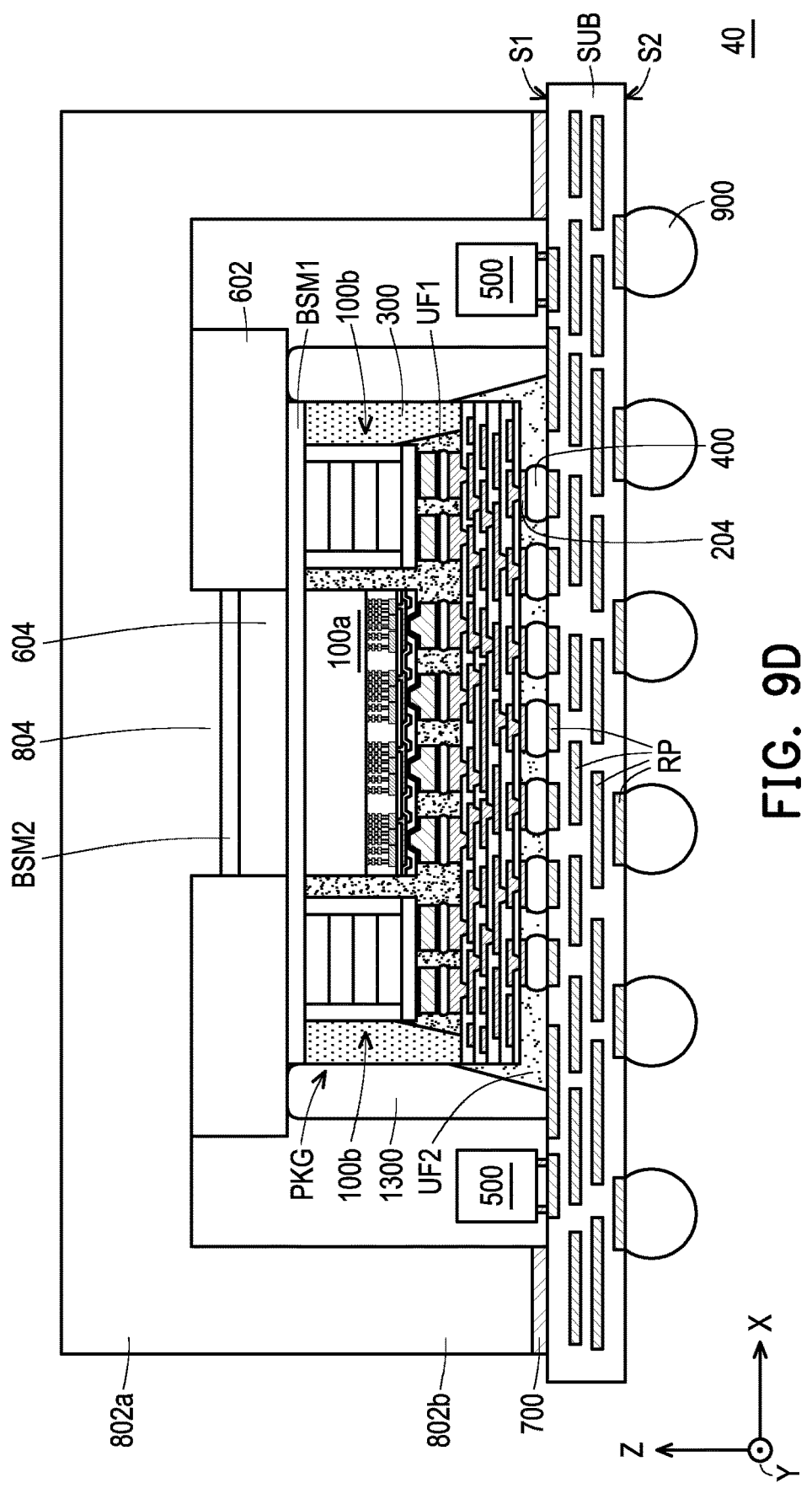

Referring to FIG. 9D, after the lid structure 800 is provided, the conductive terminals 900 are formed on the second surface S2 of the substrate SUB to obtain the semiconductor device 40.

FIG. 10A to FIG. 10E are schematic cross-sectional views illustrating a manufacturing process of a semiconductor device 50 in accordance with some alternative embodiments of the disclosure. The elements similar to or substantially the same as the elements described previously will use the same reference numbers, and certain details or descriptions (e.g., the materials, formation processes, positioning configurations, etc.) of the same elements would not be repeated herein.

Figure 10A:
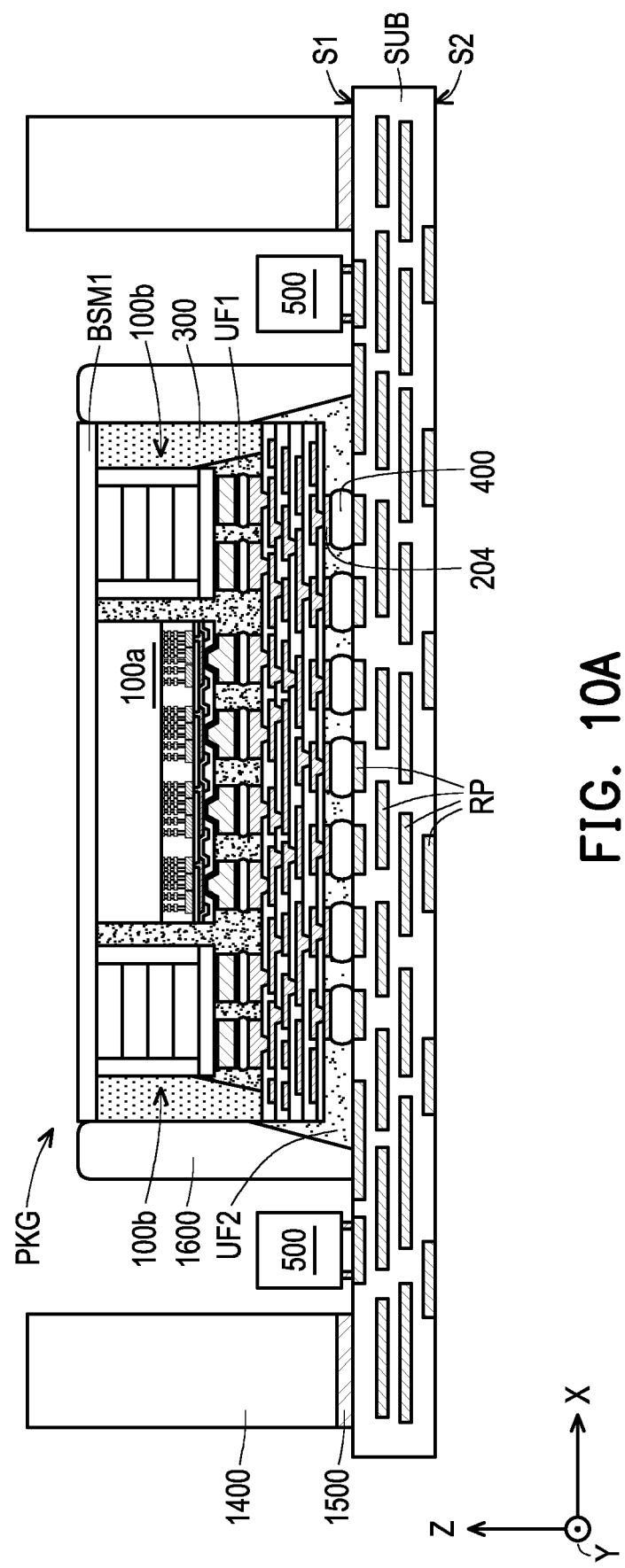
FIG. 10A to FIG. 10E are schematic cross-sectional views illustrating a manufacturing process of a semiconductor device in accordance with some alternative embodiments of the disclosure.

Referring to FIG. 10A, a structure same as the structure of FIG. 4A is provided. Details or descriptions (e.g., the materials, formation processes, positioning configurations, etc.) of the substrate SUB, the package structure PKG, the underfill layer UF2 and the surface devices 500 have been described in conjunction with FIG. 4A above, and will not be iterated herein again. Accordingly, for details or descriptions of the substrate SUB, the package structure PKG, the underfill layer UF2 and the surface devices 500 not iterated herein, please refer to the aforesaid embodiments.

Continued on FIG. 10A, a stiffener ring 1400 is attached to the substrate SUB. In some embodiment, the stiffener ring 1400 is made of metal. The metal for the stiffener ring 1400 includes, but is not limited to, aluminum, stainless steel or CuNi. In some embodiments, the Young's modulus of the stiffener ring 1400 ranges from about 50 GPa to about 200 GPa. In some embodiment, the stiffener ring 1400 encircles the package structure PKG and the surface devices 500. As shown in FIG. 10A, the stiffener ring 1400 is spatially separated from the package structure PKG, the underfill layer UF2, and the surface devices 500. In some embodiments, the top surface of the stiffener ring 1400 is located at a level height higher than the top surface of the conductive layer BSM1.

In some embodiments, as shown in FIG. 10A, the stiffener ring 1400 is attached to the substrate SUB through the adhesive layer 1500. For example, the stiffener ring 1400 is first placed over the substrate SUB to be in physical contact with the adhesive layer 1500. Thereafter, the stiffener ring 1400 is pressed against the adhesive layer 1500. In some embodiments, pressing the stiffener ring 1400 against the adhesive layer 1500 includes performing a heat clamping process, wherein the process temperature of the heat clamping process ranges from about 60° C. to about 300° C. Subsequently, a curing process is performed on the adhesive layer 1500 such that the stiffener ring 1400 is attached to the substrate SUB through the adhesive layer 1500. In detail, the curing process is performed on the adhesive layer 1500 to securely fix the stiffener ring 1400 onto the substrate SUB. In some embodiments, the process temperature of the curing process ranges from about 60° C. to about 300° C.

In some embodiments, the adhesive layer 1500 is disposed near edges of the first surface S1 of the substrate SUB to surround the package structure PKG, the underfill layer UF2, and the surface devices 500. In some embodiments, the adhesive layer 1500 partially covers the first surface S1 of the substrate SUB. For example, the package structure PKG, the underfill layer UF2, and the surface devices 500 are physically isolated from the adhesive layer 1500. In some embodiments, the adhesive layer 1500 has a ring-like shape in the plane view such as the top view. In some embodiments, the pattern of the adhesive layer 1500 may be designed based on the various design. For example, the adhesive layer 1500 may have a linear shape, L shape, U shape, dot shape, etc. In some embodiments, the shape of the adhesive layer 1500 depends on the shape of the substrate SUB. For example, when the substrate SUB is in wafer form (i.e., having a circular top view), the adhesive layer 1500 exhibits a circular ring-like shape from the top view. For example, when the substrate SUB is in panel form (i.e., having a rectangular or squared top view), the adhesive layer 1500 exhibits a rectangular or squared ring-like shape from the top view. In some embodiments, the adhesive layer 1500 is applied onto the substrate SUB through a dispensing process, a spin-coating process, or the like. In some embodiments, the adhesive layer 1500 has a thermal conductivity lower than about 0.5 W/m·K. In some embodiments, the adhesive layer 1500 includes an epoxy-based material. However, the disclosure is not limited to. In some alternative embodiments, other polymeric materials having adhering property may be utilized as the adhesive layer 1500.

Still continued on FIG. 10A, a gel ring 1600 is formed on the substrate SUB. In some embodiment, the gel ring 1600 may include a polymer with fillers. In some embodiment, the polymer for the gel ring 1600 includes, but is not limited to, epoxy base polymer, silica base polymer or acrylic base polymer. In some embodiment, the fillers for the gel ring 1600 includes, but is not limited to, ceramic fillers or metal fillers. In some embodiments, the Young's modulus of the gel ring 1600 ranges from about 10 MPa to about 100 MPa. In some embodiments, the gel ring 1600 may be formed using dispensing process, a spin-coating process, or the like, and followed by a curing step to cure the gel ring 1600. The curing step may include a UV light exposure process, an IR energy exposure process, combinations thereof, or a combination thereof with a heating process. In some embodiment, the gel ring 1600 encircles the package structure PKG. In some embodiments, the shape of the gel ring 1600 depends on the shape of the package structure PKG. For example, when the package structure PKG has a rectangular or squared top view, the gel ring 1600 exhibits a rectangular or squared ring-like shape from the top view. In some embodiments, the surface devices 500 are physically isolated from the gel ring 1600. In some embodiments, the gel ring 1600 is in physical contact with the package structure PKG and the underfill layer UF2. However, the disclosure is not limited thereto. In some alternative embodiments, the gel ring 1600 may be physically isolated from the package structure PKG. In some alternative embodiments, the gel ring 1600 may be physically isolated from the package structure PKG and the underfill layer UF2. In some embodiments, the top surface of the gel ring 1600 is substantially coplanar with the top surface of the conductive layer BSM1. However, the disclosure is not limited thereto. In some alternative embodiments, the top surface of the gel ring 1600 may be located at a level height higher than or lower than that of the top surface of the conductive layer BSM1. In some embodiments, the gel ring 1600 is formed before the stiffener ring 1400 is attached to the substrate SUB. In some embodiments, the gel ring 1600 is formed after the stiffener ring 1400 is attached to the substrate SUB.

Figure 10B:
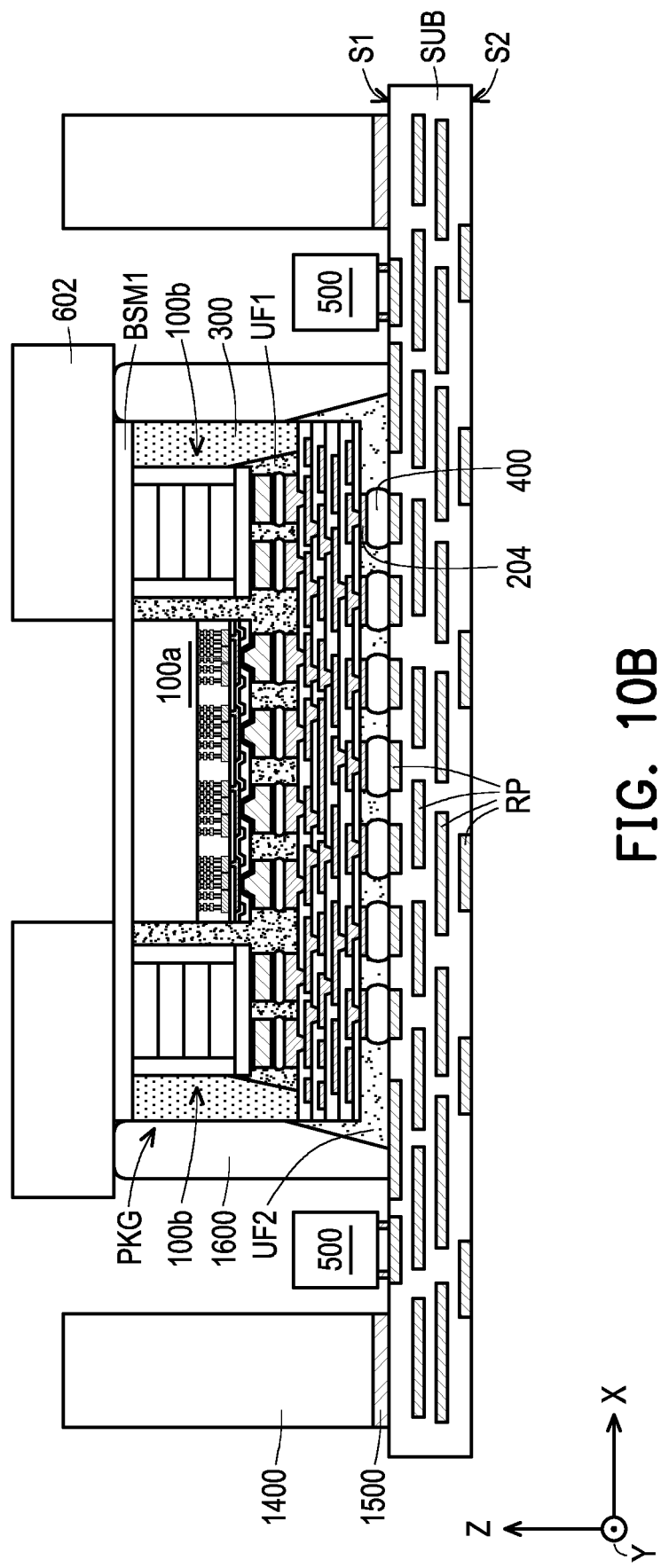

Referring to FIG. 10B, after the stiffener ring 1400 and the gel ring 1600 are provided on the substrate SUB, the non-TIM layer 602 is formed. In some embodiments, as shown in FIG. 10B, the non-TIM layer 602 is in contact with the gel ring 1600. For example, as shown in FIG. 10B, the non-TIM layer 602 is in physical contact with the top surface of the gel ring 1600. From another point of view, as shown in FIG. 10B, the outer side surface of the non-metallic TIM layer 602 is laterally spaced a distance from the outer side surface of the encapsulant 300 in the package structure PKG. It is noted that by arranging the gel ring 1600, the non-metallic TIM layer 602 can extend laterally past the outer side surface of the package structure PKG. That is to say, the gel ring 1600 provides a wider process window for forming the non-metallic TIM layer 602. Further, as shown in FIG. 10B, the non-metallic TIM layer 602 extends laterally past the outer side surface of the gel ring 1600. However, the disclosure is not limited to. In some alternative embodiments, the outer side surface of the non-metallic TIM layer 602 may be substantially aligned with the outer side surface of the gel ring 1600.

Figure 10C:
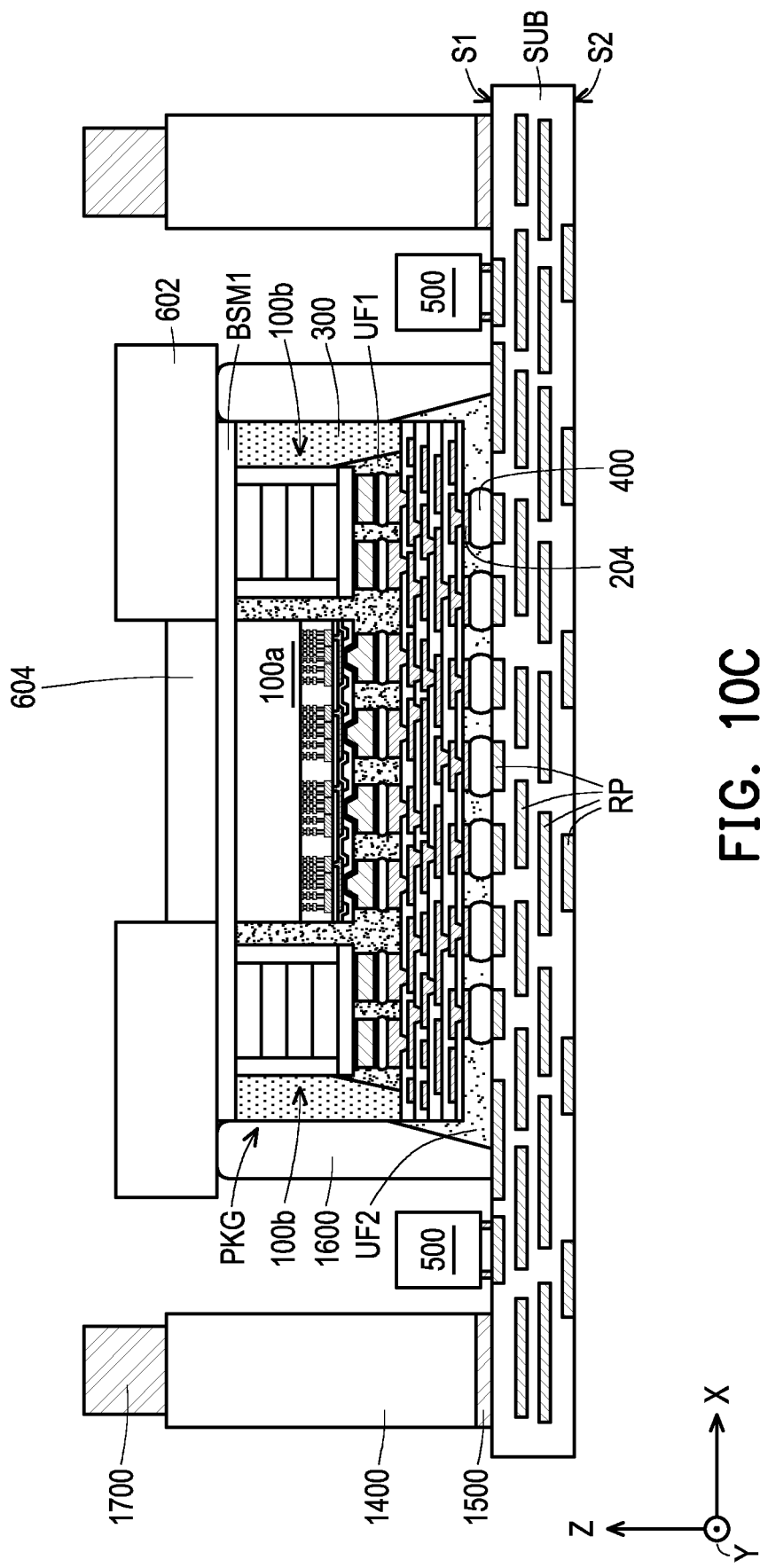

Referring to FIG. 10C, after the non-metallic TIM layer 602 is formed, the metallic TIM layer 604 is formed on the conductive layer BSM1, and then an adhesive layer 1700 is formed on the stiffener ring 1400. In some embodiments, the adhesive layer 1700 is disposed on the top surface of the stiffener ring 1400 to surround the non-metallic TIM layer 602 and the metallic TIM layer 604. In some embodiments, the adhesive layer 1700 has a ring-like shape in the plane view such as the top view. In some embodiments, the pattern of the adhesive layer 1700 may be designed based on the various design. For example, the adhesive layer 1700 may have a linear shape, L shape, U shape, dot shape, etc. In some embodiments, the shape of the adhesive layer 1700 depends on the shape of the substrate SUB. For example, when the substrate SUB is in wafer form (i.e., having a circular top view), the adhesive layer 1700 exhibits a circular ring-like shape from the top view. For example, when the substrate SUB is in panel form (i.e., having a rectangular or squared top view), the adhesive layer 1700 exhibits a rectangular or squared ring-like shape from the top view. In some embodiments, the adhesive layer 1700 is applied onto the stiffener ring 1400 through a dispensing process, a spin-coating process, or the like. In some embodiments, the adhesive layer 1700 has a thermal conductivity lower than about 0.5 W/m·K. In some embodiments, the adhesive layer 1700 includes an epoxy-based material. However, the disclosure is not limited to. In some alternative embodiments, other polymeric materials having adhering property may be utilized as the adhesive layer 1700.

Figure 10D:
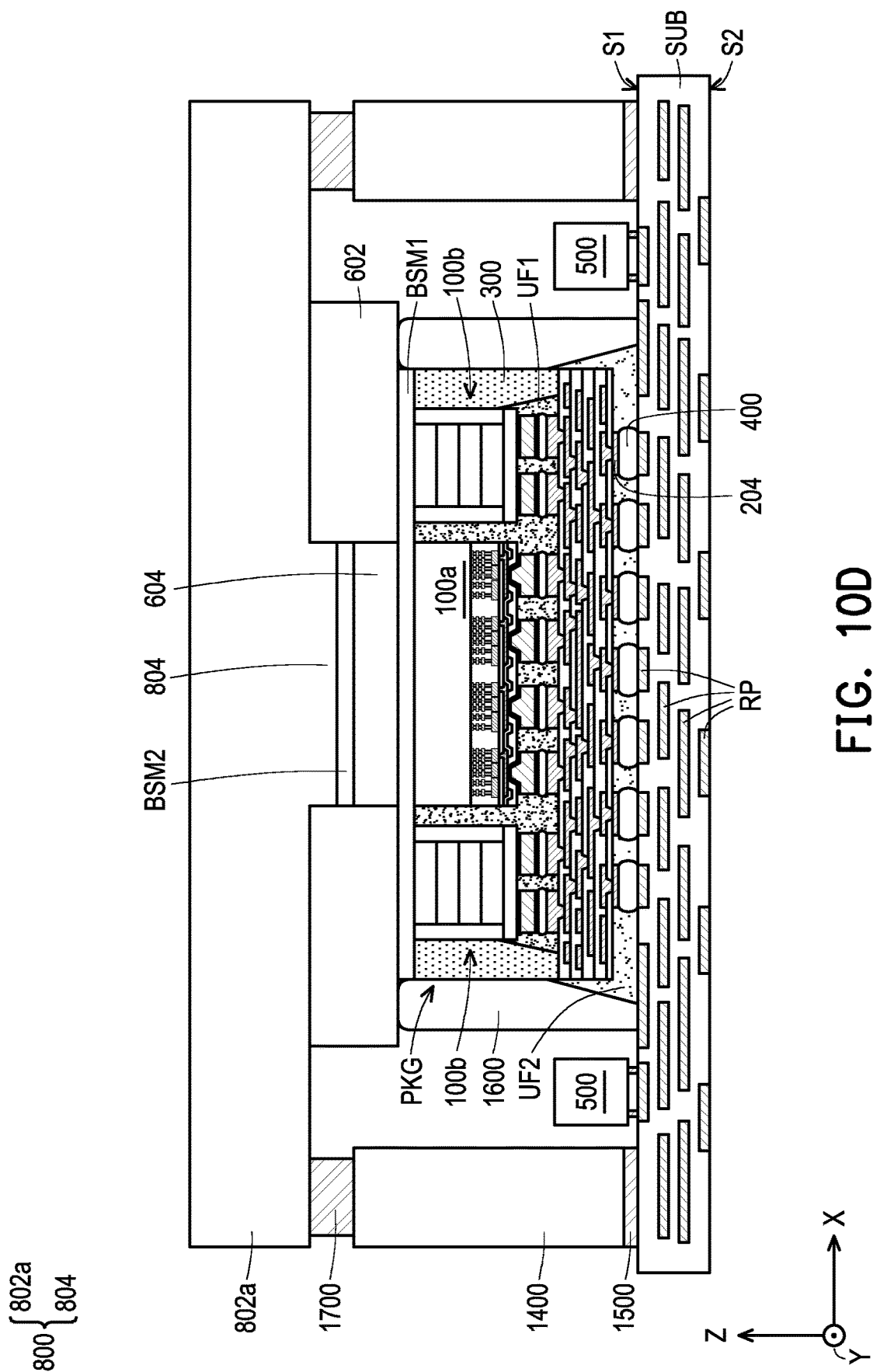

Referring to FIG. 10D, the lid structure 800 is placed over the stiffener ring 1400 such that the non-metallic TIM layer 602 and the metallic TIM layer 604 are located between the package structure PKG and the lid structure 800. The lid structure 800 shown in FIG. 10D includes the cover portion 802a and the protruding portion 804 without including the leg portion 802b. As such, as shown in FIG. 10D, the lid structure 800 is securely fixed onto the stiffener ring 1400 through attaching the cover portion 802a to the adhesive layer 1700.

Figure 10E:
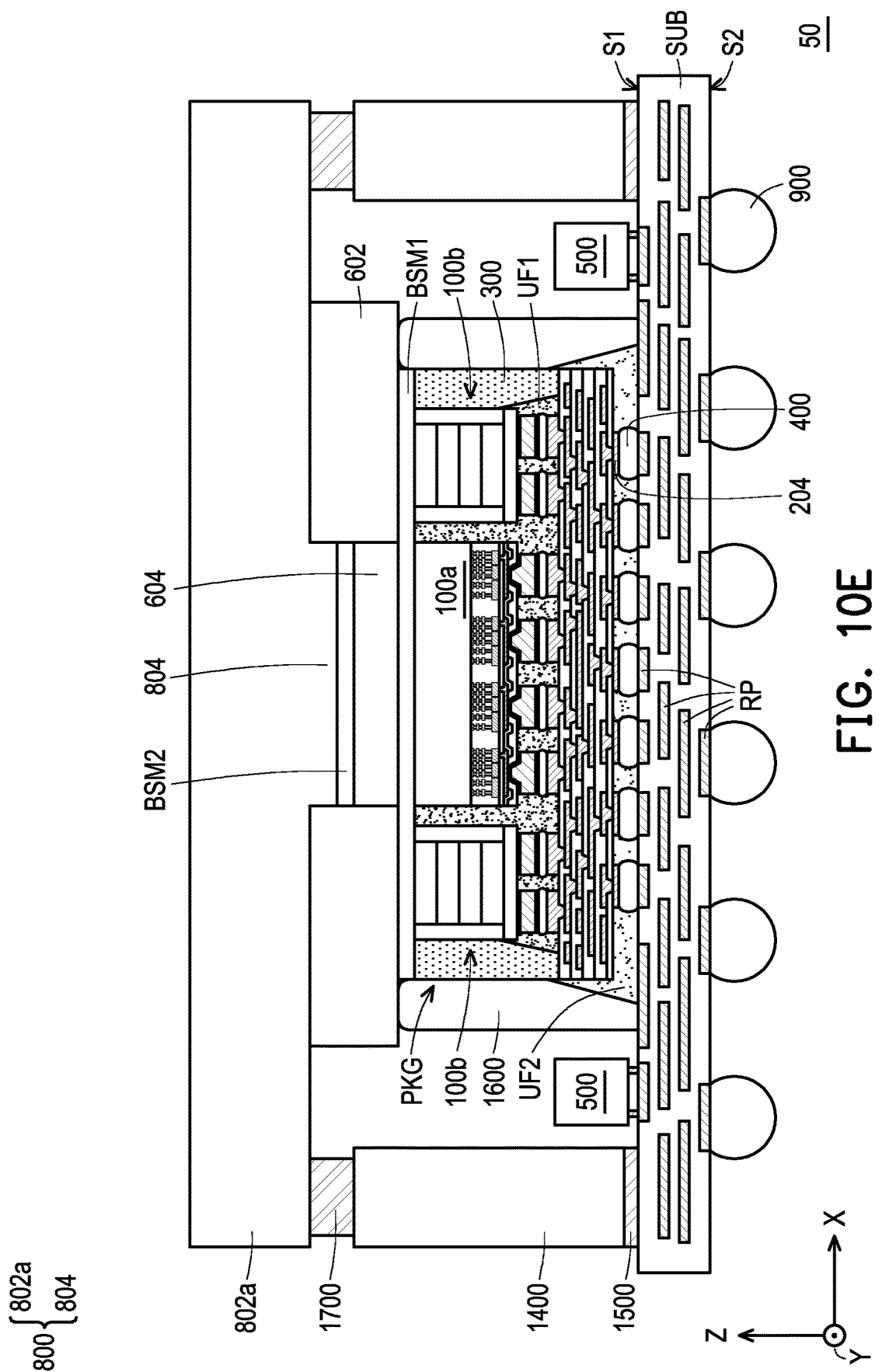

Referring to FIG. 10E, after the lid structure 800 is attached to the stiffener ring 1400, the conductive terminals 900 are formed on the second surface S2 of the substrate SUB to obtain the semiconductor device 50. In the semiconductor device 50, the lid structure 800 is attached to the substrate SUB through the adhesive layer 1700, the stiffener ring 1400 and the adhesive layer 1500. With such configuration, it is noted that the reliability of the semiconductor device 50 is improved.

FIG. 11A to FIG. 11E are schematic cross-sectional views illustrating a manufacturing process of a semiconductor device 60 in accordance with some alternative embodiments of the disclosure. The elements similar to or substantially the same as the elements described previously will use the same reference numbers, and certain details or descriptions (e.g., the materials, formation processes, positioning configurations, etc.) of the same elements would not be repeated herein.

Figure 11A:
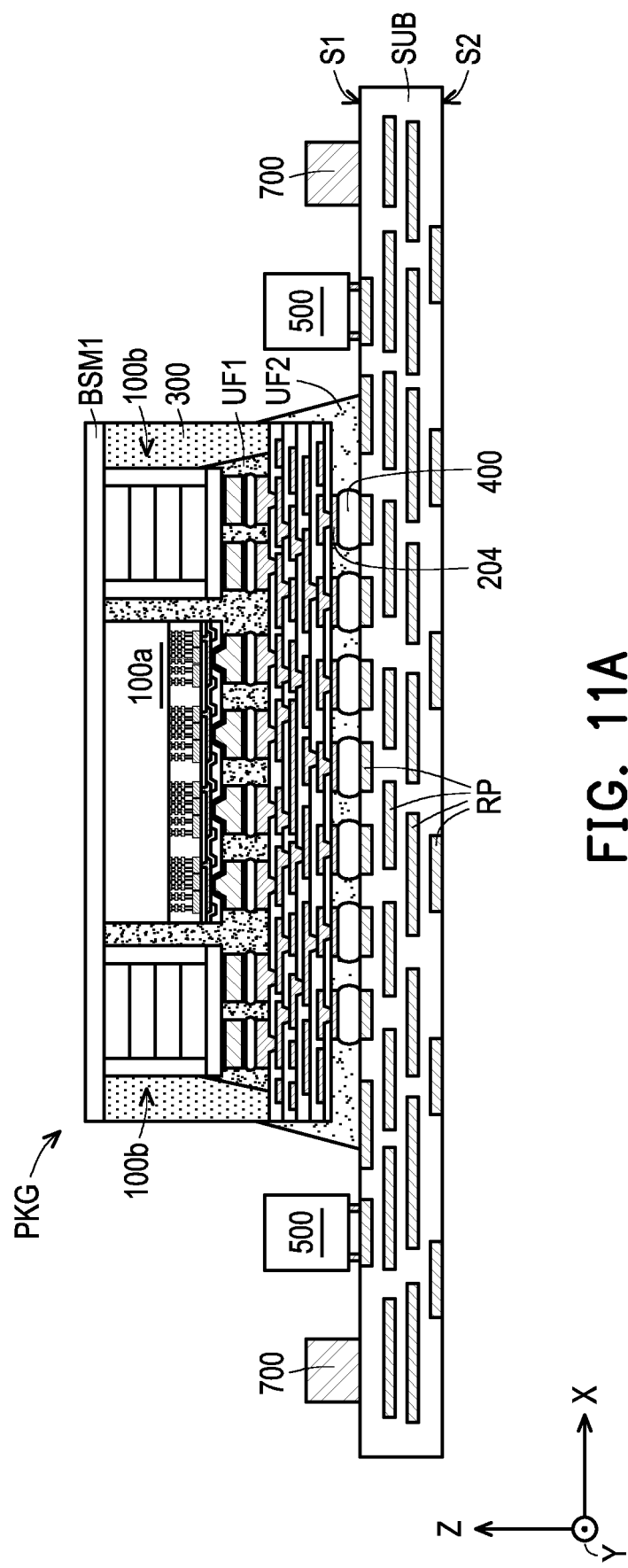
FIG. 11A to FIG. 11E are schematic cross-sectional views illustrating a manufacturing process of a semiconductor device in accordance with some alternative embodiments of the disclosure.

Referring to FIG. 11A, a structure same as the structure of FIG. 4A is provided. Details or descriptions (e.g., the materials, formation processes, positioning configurations, etc.) of the substrate SUB, the package structure PKG, the underfill layer UF2 and the surface devices 500 have been described in conjunction with FIG. 4A above, and will not be iterated herein again. Accordingly, for details or descriptions of the substrate SUB, the package structure PKG, the underfill layer UF2 and the surface devices 500 not iterated herein, please refer to the aforesaid embodiments. Continued on FIG. 11A, the adhesive layer 700 is formed on the first surface S1 of the substrate SUB.

Figure 11B:
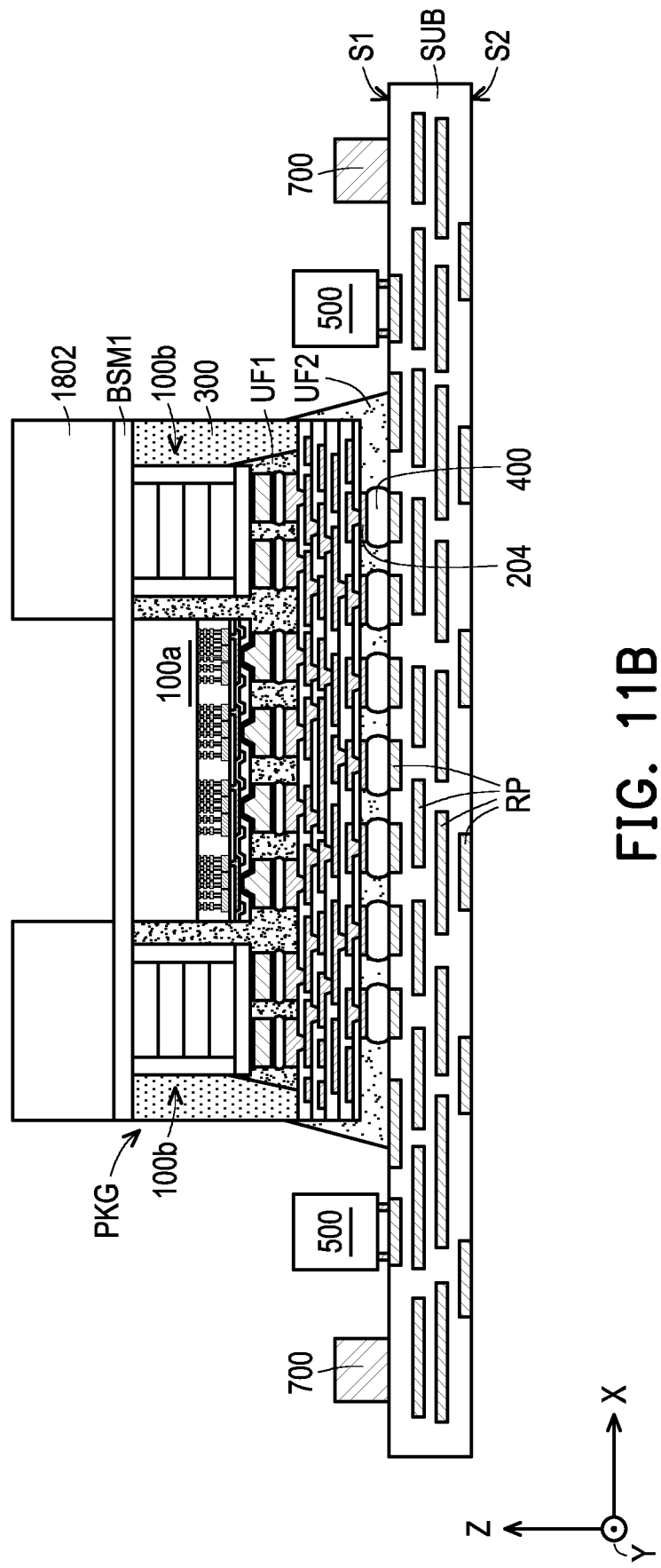

Referring to FIG. 11B, after the adhesive layer 700 is provided, a non-metallic TIM layer 1802 is formed on the conductive layer BSM1. It is noted that the non-metallic TIM layer 1802 illustrated in FIG. 11B is similar to the non-metallic TIM layer 602 illustrated in FIGS. 4B-4F, 5, 6A-6I and/or 7, hence the same detailed descriptions will be omitted, please refer to the aforesaid embodiments, and only the differences between the non-metallic TIM layer 1802 and the non-metallic TIM layer 602 will be described below. In some embodiments, the non-metallic TIM layer 1802 is in gel type. In some embodiments, the non-metallic TIM layer 1802 is formed on the conductive layer BSM1 through a dispensing process, optionally followed by a curing step. In some embodiments, the material of the non-metallic TIM layer 1802 includes polyimide, polybenzoxazole (PBO), epoxy base polymer, silica base polymer, acrylic base polymer, or a combination thereof. In some embodiments, the non-metallic TIM layer 1802 may further include fillers. The fillers may facilitate the thermal conduction of the non-metallic TIM layer 1802. In some embodiments, the fillers are particles made of divinyl benzene crosslinked-polymers, aluminum, copper, silver, beryllium oxide, aluminum nitride, aluminum oxide, zinc oxide, or silicon dioxide. In some embodiments, the thermal conductivity of the non-metallic TIM layer 1802 ranges from about 0.1 W/(m·K) to about 10 W/(m·K). In some embodiments, the Young's modulus of the non-metallic TIM layer 1802 ranges from about 10 MPa to about 1000 MPa. Or alternatively, the non-metallic TIM layer 1802 may be in file type, which is formed through the forming process of the non-metallic TIM layer 602 previously described in FIG. 4B.

Figure 11C:
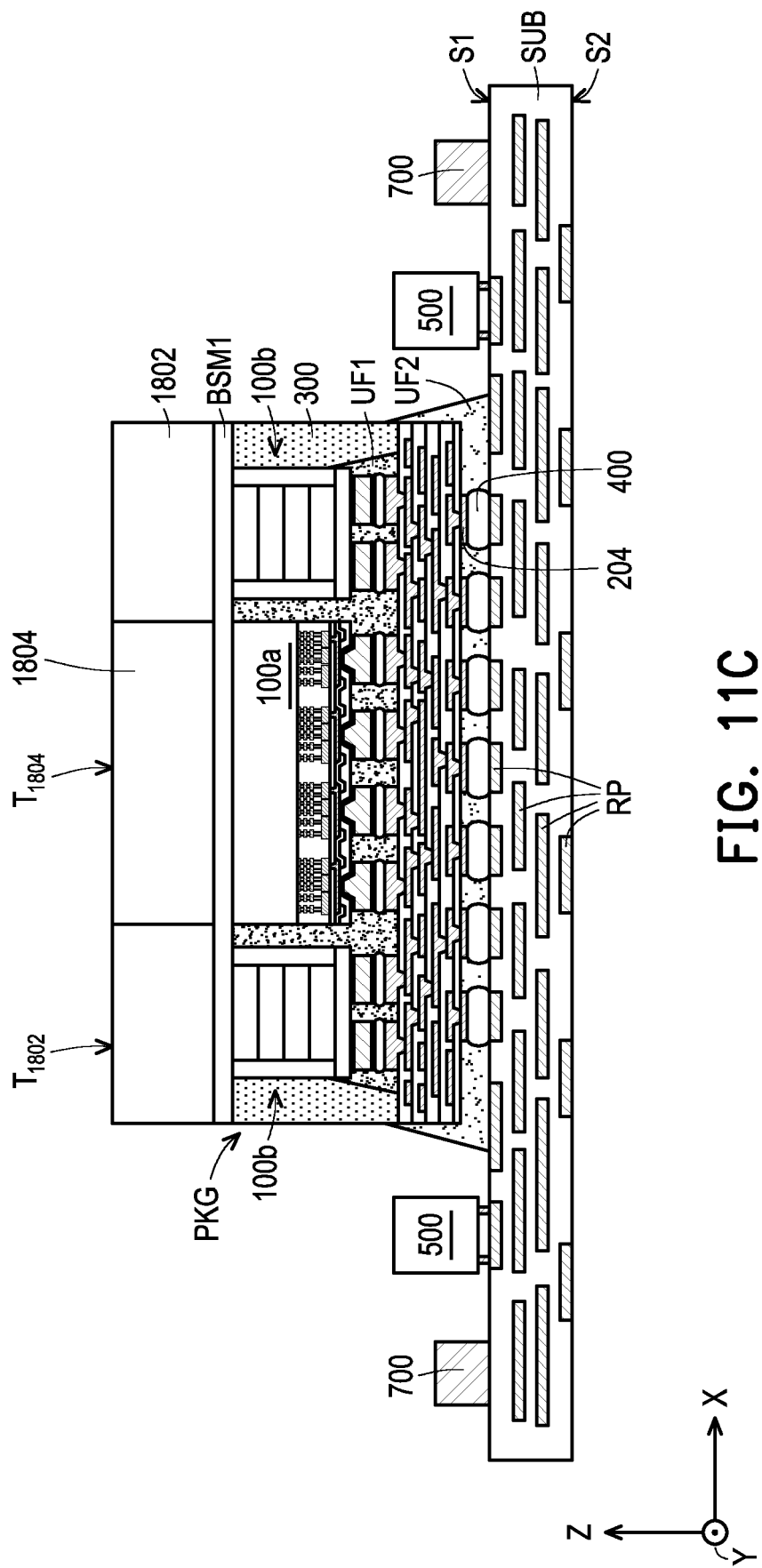

Referring to FIG. 11C, a metallic TIM layer 1804 is formed on the conductive layer BSM1. It is noted that the metallic TIM layer 1804 illustrated in FIG. 11C is similar to the metallic TIM layer 604 illustrated in FIGS. 4C-4F, 5, 6A-6I and/or 7, hence the same detailed descriptions will be omitted, please refer to the aforesaid embodiments, and only the differences between the metallic TIM layer 1804 and the metallic TIM layer 604 will be described below. In some embodiments, the metallic TIM layer 1804 is in gel type. In some embodiments, the metallic TIM layer 1804 is formed on the conductive layer BSM1 through a dispensing process, optionally followed by a curing step. In some embodiments, the material of the metallic TIM layer 1804 is different from the material of the non-metallic TIM layer 1802. In some embodiments, the material of the metallic TIM layer 1804 is silver. In some embodiments, the thermal conductivity of the metallic TIM layer 1804 is higher than the thermal conductivity of the non-metallic TIM layer 1802. In some embodiments, the thermal conductivity of the metallic TIM layer 1804 ranges from about 10 W/(m·K) to about 300 W/(m·K). In some embodiments, the Young's modulus of the metallic TIM layer 1804 ranges from about 1 GPa to about 30 GPa. Or alternatively, the metallic TIM layer 1804 may be in sheet type, which is formed through the forming process of the metallic TIM layer 604 previously described in FIG. 4C. In some embodiments, as illustrated in FIG. 11C, the top surface $T_{1802}$ of the non-metallic TIM layer 1802 is substantially coplanar with the top surface $T_{1804}$ of the metallic TIM layer 1804. Further, as shown in FIG. 11A to FIG. 11C, although the adhesive layer 700 is formed before the non-metallic TIM layer 1802 and the metallic TIM layer 1804 are provided for illustrative purposes, those skilled in the art can understand that the illustrated ordering of such acts or events are not to be interpreted in a limiting sense. In some alternative embodiments, the adhesive layer 700 may be formed after the non-metallic TIM layer 1802 and the metallic TIM layer 1804 are formed.

Figure 11D:
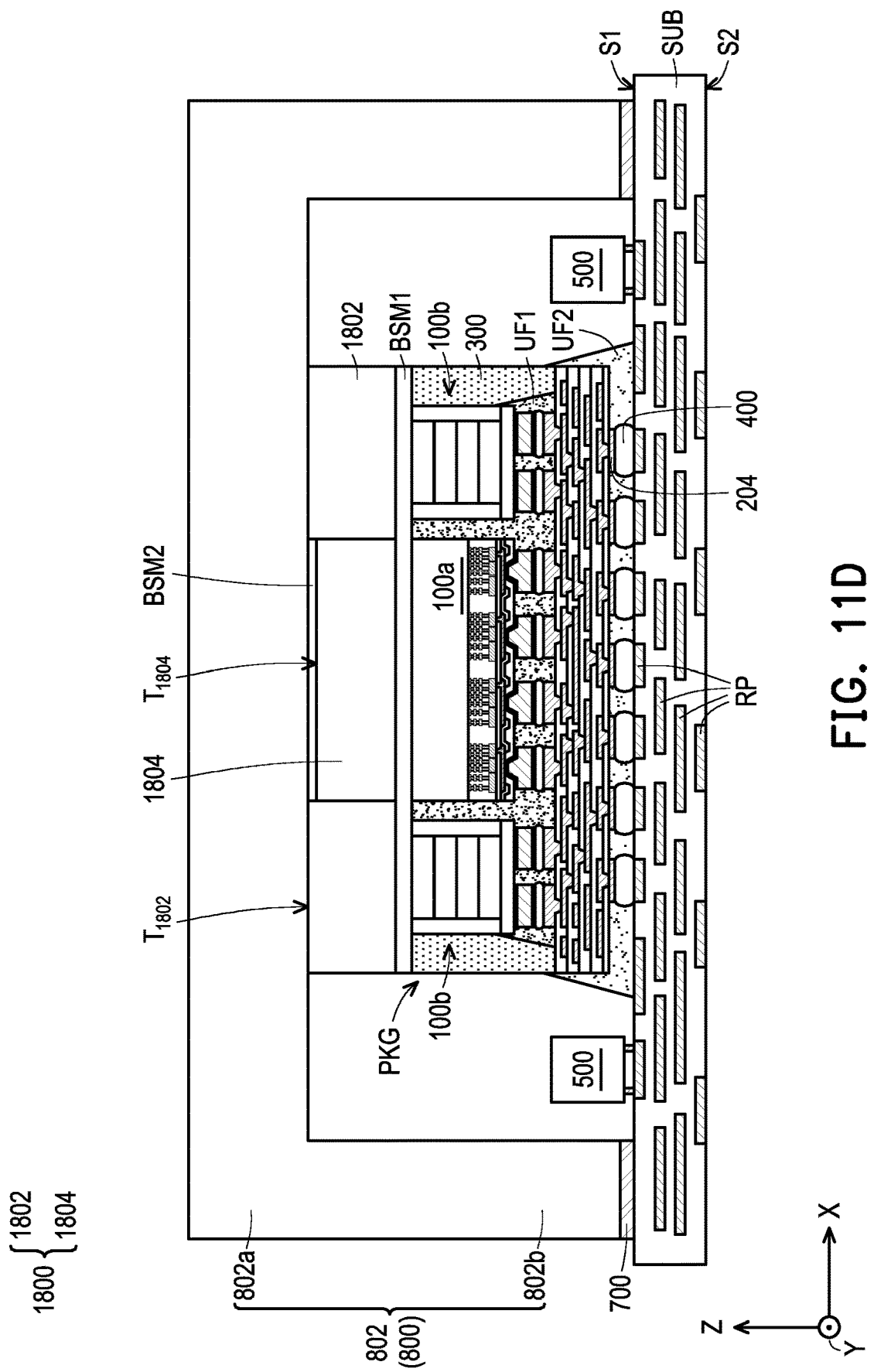

Referring to FIG. 11D, after the non-metallic TIM layer 1802 and the metallic TIM layer 1804 are provided, the lid structure 800 is placed over the substrate SUB, the package structure PKG, and the surface devices 500 such that the non-metallic TIM layer 1802 and the metallic TIM layer 1804 are located between the lid structure 800 and the package structure PKG. The lid structure 800 shown in FIG. 11D includes only the body portion 802 having the cover portion 802a and the leg portion 802b without including the protruding portion 804. As such, as shown in FIG. 11D, the conductive layer BSM2 is formed on the cover portion 802a. In some embodiments, the lid structure 800 is attached to the substrate SUB and the package structure PKG through the adhesive layer 700, the non-metallic TIM layer 1802 and the metallic TIM layer 1804. For example, after the lid structure 800 is placed over the substrate SUB and is being pressed against the metallic TIM layer 1804, the non-metallic TIM layer 1802 and the adhesive layer 700, a curing process is performed on the adhesive layer 700, the non-metallic TIM layer 1802 and the metallic TIM layer 1804 such that the lid structure 800 is securely attached to the substrate SUB through the adhesive layer 700 and to the package structure PKG through the metallic TIM layer 1804 and the non-metallic TIM layer 1802. In some embodiments, after the lid structure 800 is securely fixed onto the substrate SUB and the package structure PKG, the metallic TIM layer 1804 and the non-metallic TIM layer 1802 are collectively referred to as a TIM structure 1800 over the package structure PKG. In some embodiments, in TIM structure 1800, the material of the metallic TIM layer 1804 (e.g., silver particles) diffuses into the non-metallic TIM layer 1802.

Figure 11E:
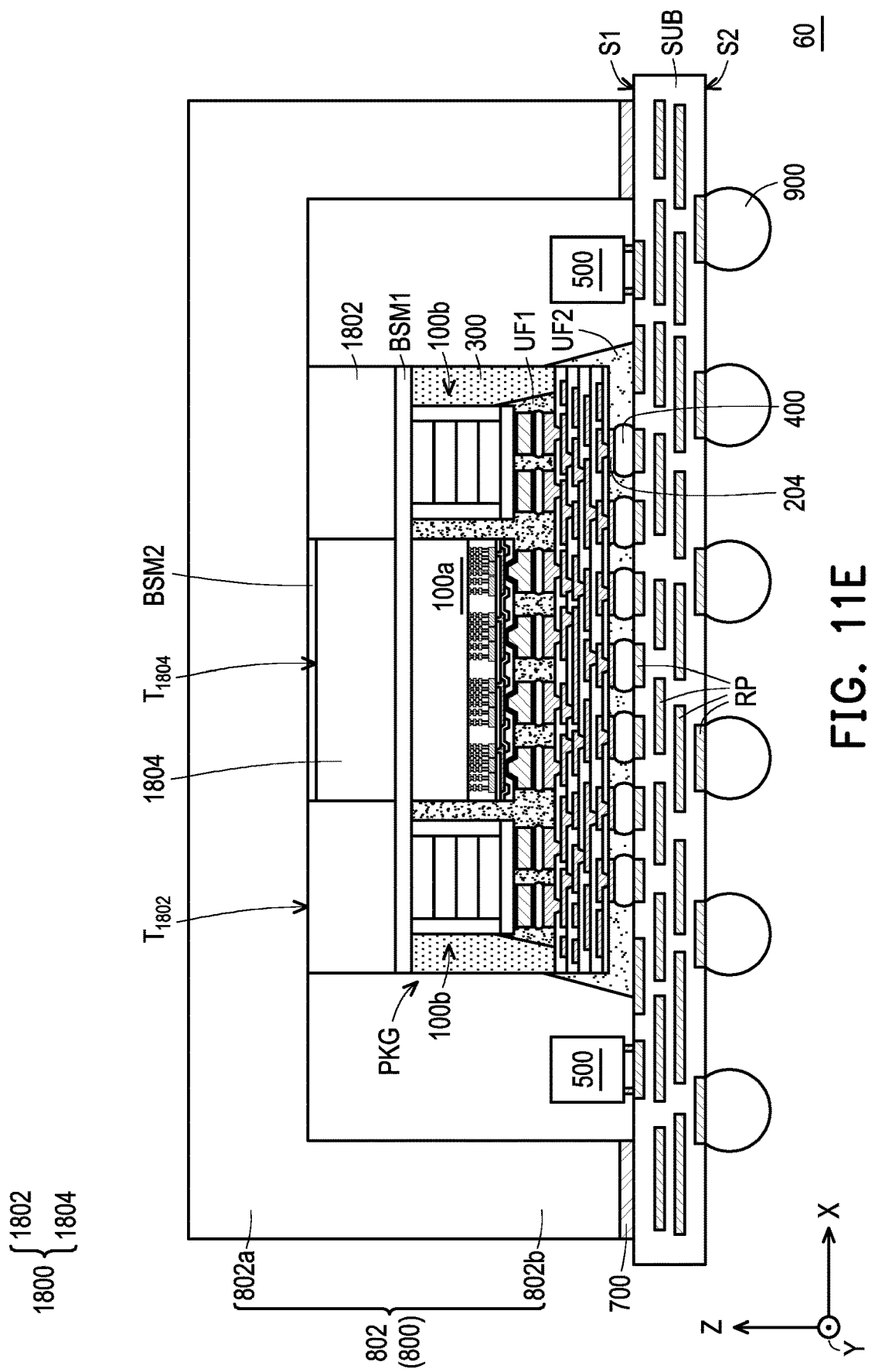

Referring to FIG. 11E, after the lid structure 800 is provided, the conductive terminals 900 are formed on the second surface S2 of the substrate SUB to obtain the semiconductor device 60.

FIG. 12A to FIG. 12F are schematic cross-sectional views illustrating a manufacturing process of a semiconductor device 70 in accordance with some alternative embodiments of the disclosure. The elements similar to or substantially the same as the elements described previously will use the same reference numbers, and certain details or descriptions (e.g., the materials, formation processes, positioning configurations, etc.) of the same elements would not be repeated herein.

Figure 12A:
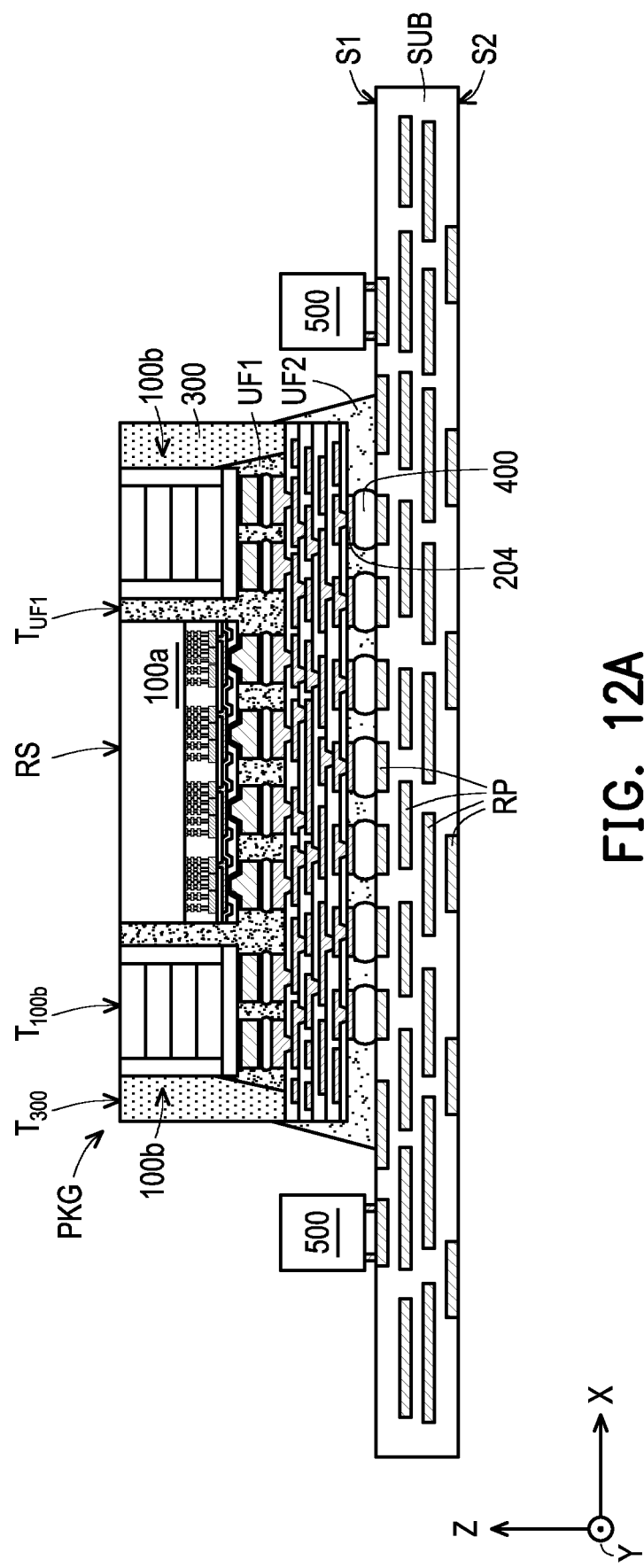
FIG. 12A to FIG. 12F are schematic cross-sectional views illustrating a manufacturing process of a semiconductor device in accordance with some alternative embodiments of the disclosure.

Referring to FIG. 12A and FIG. 4A, the structure illustrated in FIG. 12A is similar to the structure illustrated in FIG. 4A, hence the same detailed descriptions will be omitted, please refer to the aforesaid embodiments, and only the differences between the structure illustrated in FIG. 12A and the structure illustrated in FIG. 4A will be described below. As shown in FIG. 12A, the package structure PKG does not include the conductive layer BSM1. That is to say, at this stage, the top surface $T_{300}$ of the encapsulant 300, the rear surface RS of the semiconductor substrate 110, the top surfaces $T_{100b}$ of the semiconductor dies 100b and the top surface $T_{UF1}$ of the underfill layer UF1 are exposed.

Figure 12B:
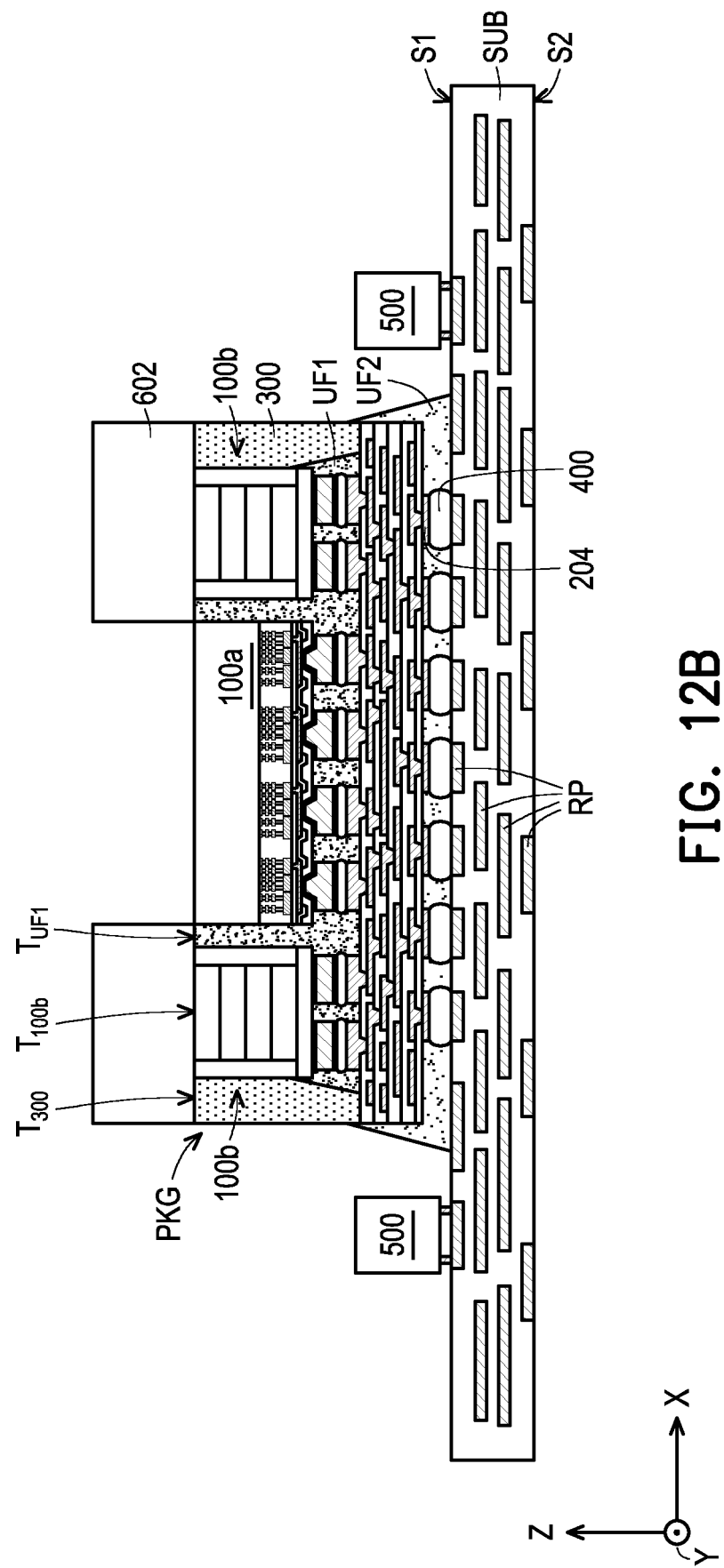

Referring to FIG. 12B, the non-TIM layer 602 is formed on the package structure PKG. In detail, the non-TIM layer 602 is formed to be in physical contact with the top surface $T_{300}$ of the encapsulant 300, the top surfaces $T_{100b}$ of the semiconductor dies 100b and the top surface $T_{UF1}$ of the underfill layer UF1.

Figure 12C:
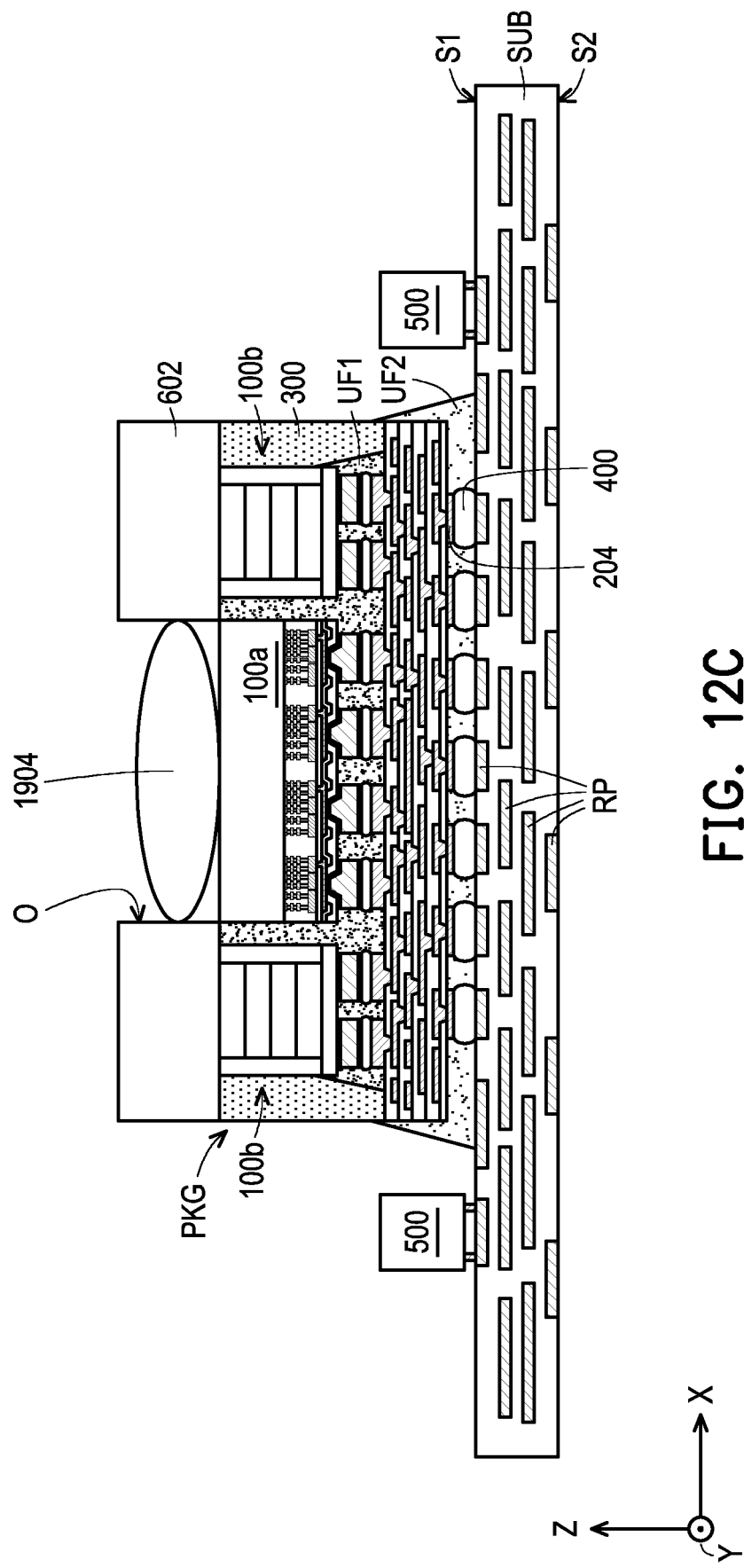

Referring to FIG. 12C, after the non-TIM layer 602 is provided, a metallic TIM layer 1904 is formed on the package structure PKG and in the opening O of the non-TIM layer 602. It is noted that the metallic TIM layer 1904 illustrated in FIG. 11C is similar to the metallic TIM layer 604 illustrated in FIGS. 4C-4F, 5, 6A-6I and/or 7, hence the same detailed descriptions will be omitted, and only the differences between the metallic TIM layer 1904 and the metallic TIM layer 604 will be described below. In some embodiments, the material of the metallic TIM layer 1904 is different from the material of the non-TIM layer 602. In some embodiments, the metallic TIM layer 1904 includes a liquid state metal material. The liquid state metal material includes gallium, indium, tin, zinc, an alloy thereof or a combination thereof. For example, the metallic TIM layer 1904 may be made of Galinstan (68% Ga, 21.5% In, and 10.0% Sn by weight), EGaIn (Gallium-Indium eutectic; 75.5% Ga and 24.5% In by weight), or the like. In some embodiments, the thermal conductivity of the metallic TIM layer 1904 ranges from about 10 W/m·K to about 100 W/m·K. In some embodiments, the metallic TIM layer 1904 is in a liquid state and is applied onto the package structure PKG through a dispensing process. In some embodiments, the metallic TIM layer 1904 has a high surface tension ranging from about 0.624 N/m to about 0.718 N/m. For example, when the metallic TIM layer 1904 is made of Galinstan, the metallic TIM layer 1904 has the surface tension of 0.718 N/m. For example, when the metallic TIM layer 1904 is made of EGaIn, the metallic TIM layer 1904 has the surface tension of 0.624 N/m. In some embodiments, due to the high surface tension of the liquid state metal material, the metallic TIM layer 1904 may aggregate to form a big droplet after dispensing. For example, as illustrated in FIG. 12C, the metallic TIM layer 1904 has a circular or elliptical cross-sectional view. However, the disclosure is not limited thereto. In some alternative embodiments, the metallic TIM layer 1904 may have a hemispherical cross-sectional view. In some embodiments, the metallic TIM layer 1904 is in physical contact with the package structure PKG. As illustrated in FIG. 12C, the metallic TIM layer 1904 is in physical contact with the semiconductor die 100*a*. However, the disclosure is not limited thereto. In some alternative embodiments, depending on the arrangement of the opening O of the non-TIM layer 602, the metallic TIM layer 1904 may be in physical contact with the semiconductor die 100*a*, the underfill layer UF1, and the semiconductor die 100*b*.

Figure 12D:
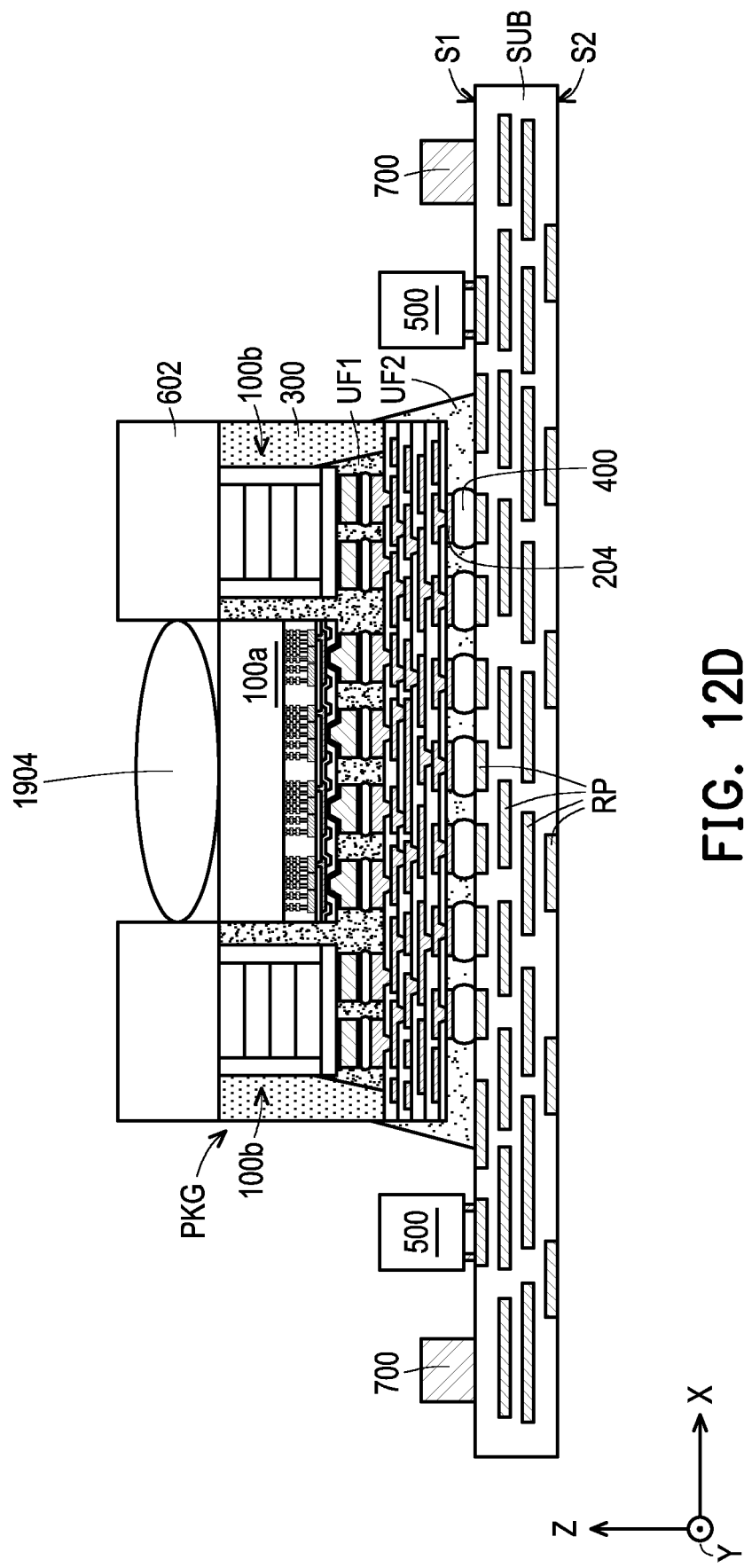

Referring to FIG. 12D, after the metallic TIM layer 1904 is provided, the adhesive layer 700 is formed on the first surface S1 of the substrate SUB.

Figure 12E:
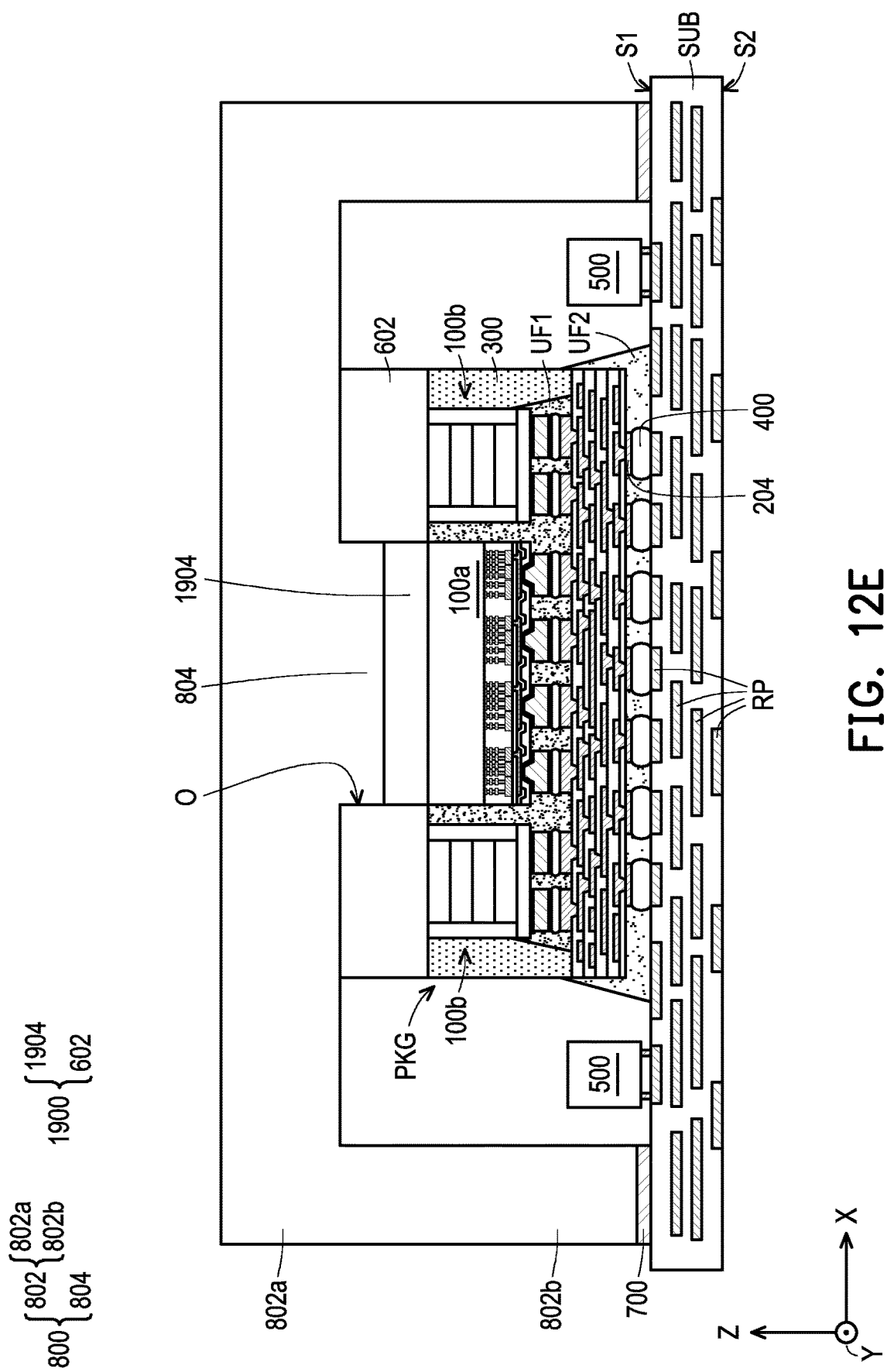

Referring to FIG. 12E, the lid structure 800 is placed over the substrate SUB, the package structure PKG, and the surface devices 500 such that the non-metallic TIM layer 602 and the metallic TIM layer 1904 are located between the lid structure 800 and the package structure PKG. In some embodiments, the lid structure 800 is attached to the substrate SUB and the package structure PKG through the adhesive layer 700, the non-metallic TIM layer 602 and the metallic TIM layer 1804. For example, after the lid structure 800 is placed over the substrate SUB and is being pressed against the metallic TIM layer 1904, the non-metallic TIM layer 602 and the adhesive layer 700, a curing process is performed on the adhesive layer 700, the non-metallic TIM layer 602 and the metallic TIM layer 1904 such that the lid structure 800 is securely attached to the substrate SUB through the adhesive layer 700 and to the package structure PKG through the metallic TIM layer 1904 and the non-metallic TIM layer 602. In some embodiments, after the lid structure 800 is securely fixed onto the substrate SUB and the package structure PKG, the metallic TIM layer 1904 and the non-metallic TIM layer 602 are collectively referred to as a TIM structure 1900 over the package structure PKG.

Since the metallic TIM layer 1904 includes the liquid state metal material, which is in the liquid state before and after curing, during the lid structure 800 is being pressed against the metallic TIM layer 1904, the metallic TIM layer 1904 would flow radially to fill the space between the lid structure 800 and the non-metallic TIM layer 602. In other words, in the TIM structure 1900, the metallic TIM layer 1904 is in physical contact with the non-metallic TIM layer 602, as shown in FIG. 12E. From another point of view, since the protruding portion 804 of the lid structure 800 extends into the opening O of the non-metallic TIM layer 602, even the metallic TIM layer 1904 is in the liquid state before and after curing, the metallic TIM layer 1904 can be well confined by the protruding portion 804 and the non-metallic TIM layer 602 within the opening O and therefore the metallic TIM layer 1904 can be prevent from bleeding/overflowing to undesired components during pressing.

Further, the lid structure 800 shown in FIG. 12E does not include the conductive layer BSM2. As such, as shown in FIG. 12E, after the lid structure 800 is securely fixed onto the substrate SUB and the package structure PKG, the metallic TIM layer 1904 is directly in contact with the package structure PKG and the protruding portion 804 of the lid structure 800 to adhere these elements, and no solder interface is seen between these elements. In some embodiments, the solder interface would cause high stress during thermal processes. In view of this, by adopting the liquid state metal material as the metallic TIM layer 1904, since no solder interface is presented between the package structure PKG, the metallic TIM layer 1904, and the lid structure 800, the issue of high stress can be sufficiently solved.

Figure 12F:
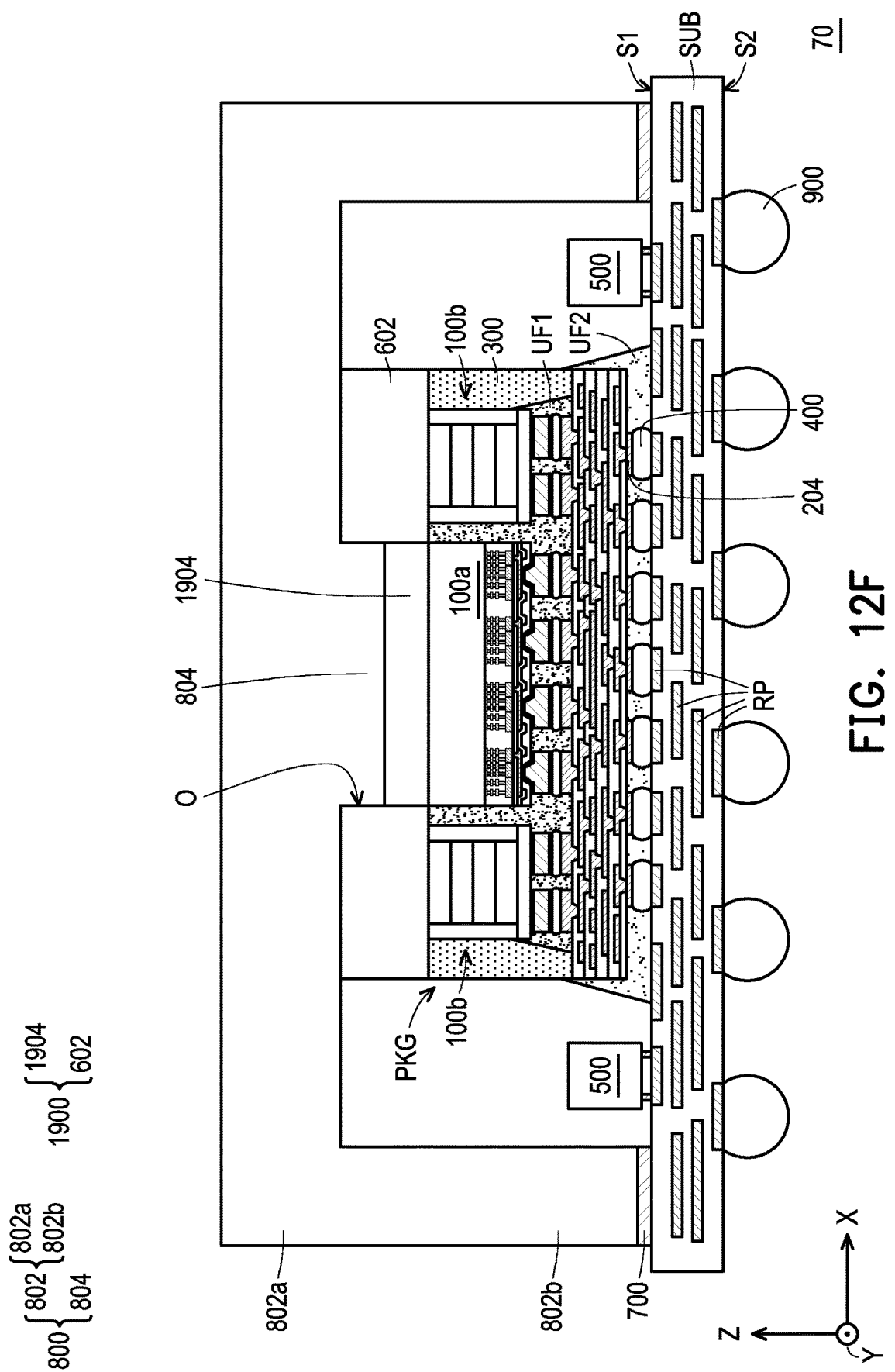

Referring to FIG. 12F, after the lid structure 800 is provided, the conductive terminals 900 are formed on the second surface S2 of the substrate SUB to obtain the semiconductor device 70.

FIG. 13A to FIG. 13E are schematic cross-sectional views illustrating a manufacturing process of a semiconductor device 80 in accordance with some alternative embodiments of the disclosure. The elements similar to or substantially the same as the elements described previously will use the same reference numbers, and certain details or descriptions (e.g., the materials, formation processes, positioning configurations, etc.) of the same elements would not be repeated herein.

Figure 13A:
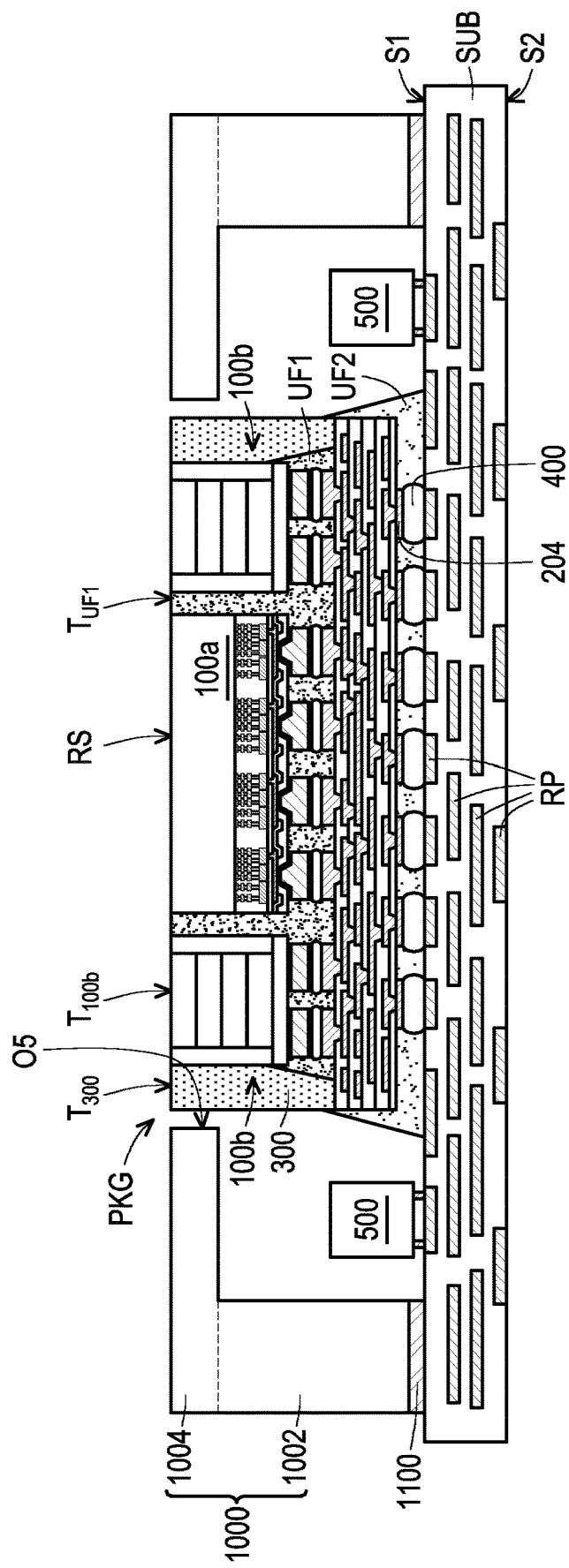
FIG. 13A to FIG. 13E are schematic cross-sectional views illustrating a manufacturing process of a semiconductor device in accordance with some alternative embodiments of the disclosure.

Referring to FIG. 13A, a structure same as the structure of FIG. 12A is provided. Details or descriptions (e.g., the materials, formation processes, positioning configurations, etc.) of the substrate SUB, the package structure PKG, the underfill layer UF2 and the surface devices 500 have been described in conjunction with FIG. 4A and FIG. 12A above, and will not be iterated herein again. Accordingly, for details or descriptions of the substrate SUB, the package structure PKG, the underfill layer UF2 and the surface devices 500 not iterated herein, please refer to the aforesaid embodiments.

Continued on FIG. 13A, the stiffener ring 1000 is attached to the substrate SUB through the adhesive layer 1100. In detail, as shown in FIG. 13A, the top surface of the cover portion 1004 (i.e., the top surface of the stiffener ring 1000) is substantially coplanar with the top surface of the package structure PKG. That is to say, the top surface of the cover portion 1004 (i.e., the top surface of the stiffener ring 1000) is substantially coplanar with the top surface $T_{300}$ of the encapsulant 300, the rear surface RS of the semiconductor substrate 110, the top surfaces $T_{100b}$ of the semiconductor dies 100*b* and the top surface $T_{UF1}$ of the underfill layer UF1. However, the disclosure is not limited thereto. In some alternative embodiments, the top surface of the stiffener ring 1000 may be located at a level height higher than or lower than that of the top surface of the package structure PKG.

Figure 13B:
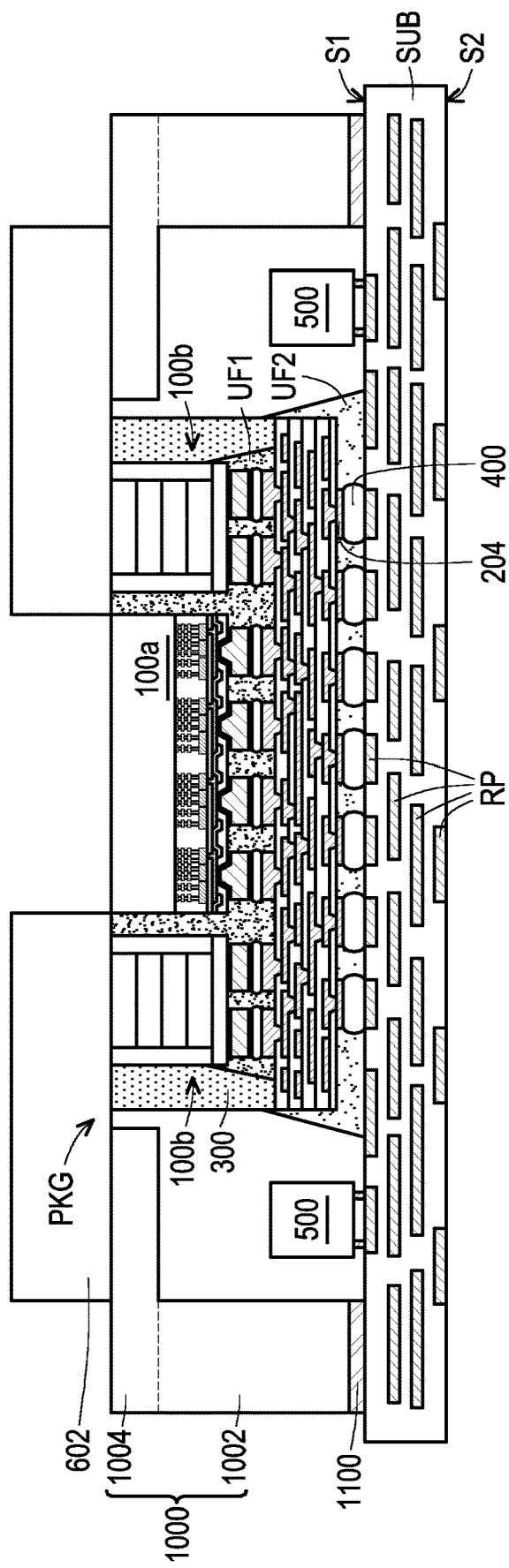

Referring to FIG. 13B, after the stiffener ring 1000 is provided over the substrate SUB, the non-TIM layer 602 is formed. In some embodiments, as shown in FIG. 13B, the non-TIM layer 602 is in physical contact with the package structure PKG. In some embodiments, as shown in FIG. 13B, the non-TIM layer 602 is in contact with the stiffener ring 1000. For example, as shown in FIG. 13B, the non-TIM layer 602 is in physical contact with the top surface of the cover portion 1004 of the stiffener ring 1000. From another point of view, as shown in FIG. 13B, the outer side surface of the non-metallic TIM layer 602 is laterally spaced a distance from the outer side surface of the encapsulant 300 in the package structure PKG. It is noted that by arranging the stiffener ring 1000, the non-metallic TIM layer 602 can extend laterally past the outer side surface of the package structure PKG. That is to say, the stiffener ring 1000 provides a wider process window for forming the non-metallic TIM layer 602.

Figure 13C:
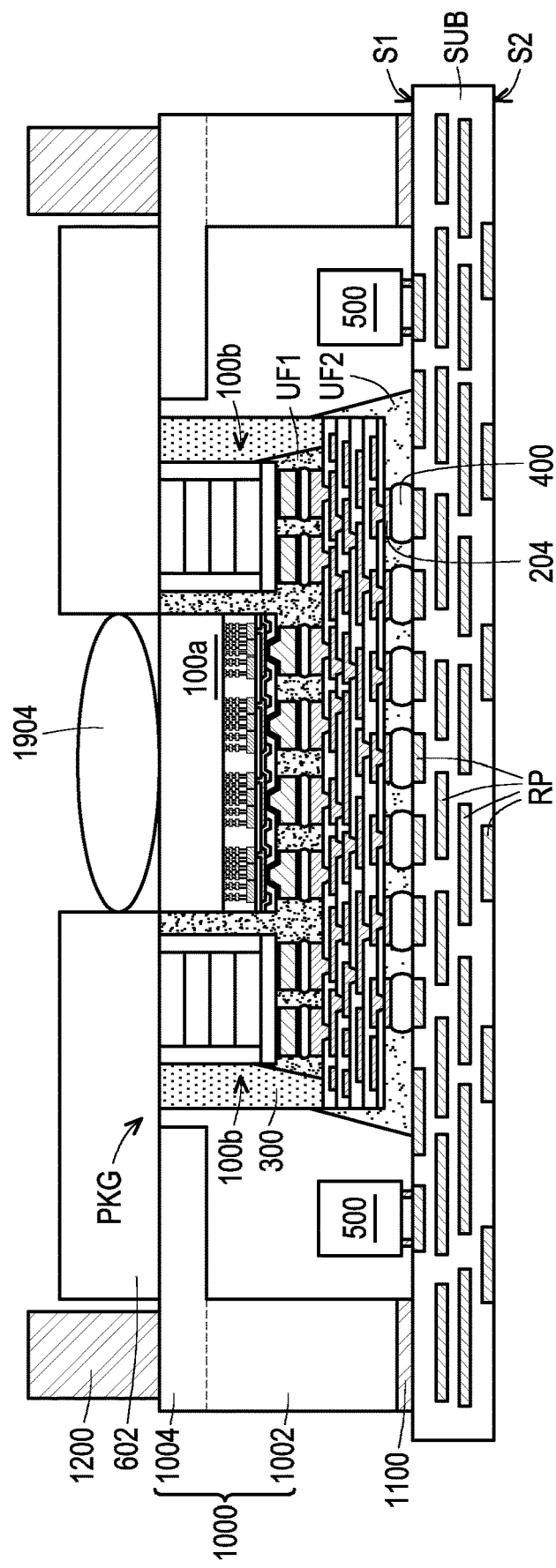

Referring to FIG. 13C, after the non-metallic TIM layer 602 is formed, the metallic TIM layer 1904 is formed on the package structure PKG, an then the adhesive layer 1200 is formed on the stiffener ring 1000. In some embodiments, the adhesive layer 1200 is disposed near edges of the top surface of the stiffener ring 1000 to surround the non-metallic TIM layer 602 and the metallic TIM layer 1904.

Figure 13D:
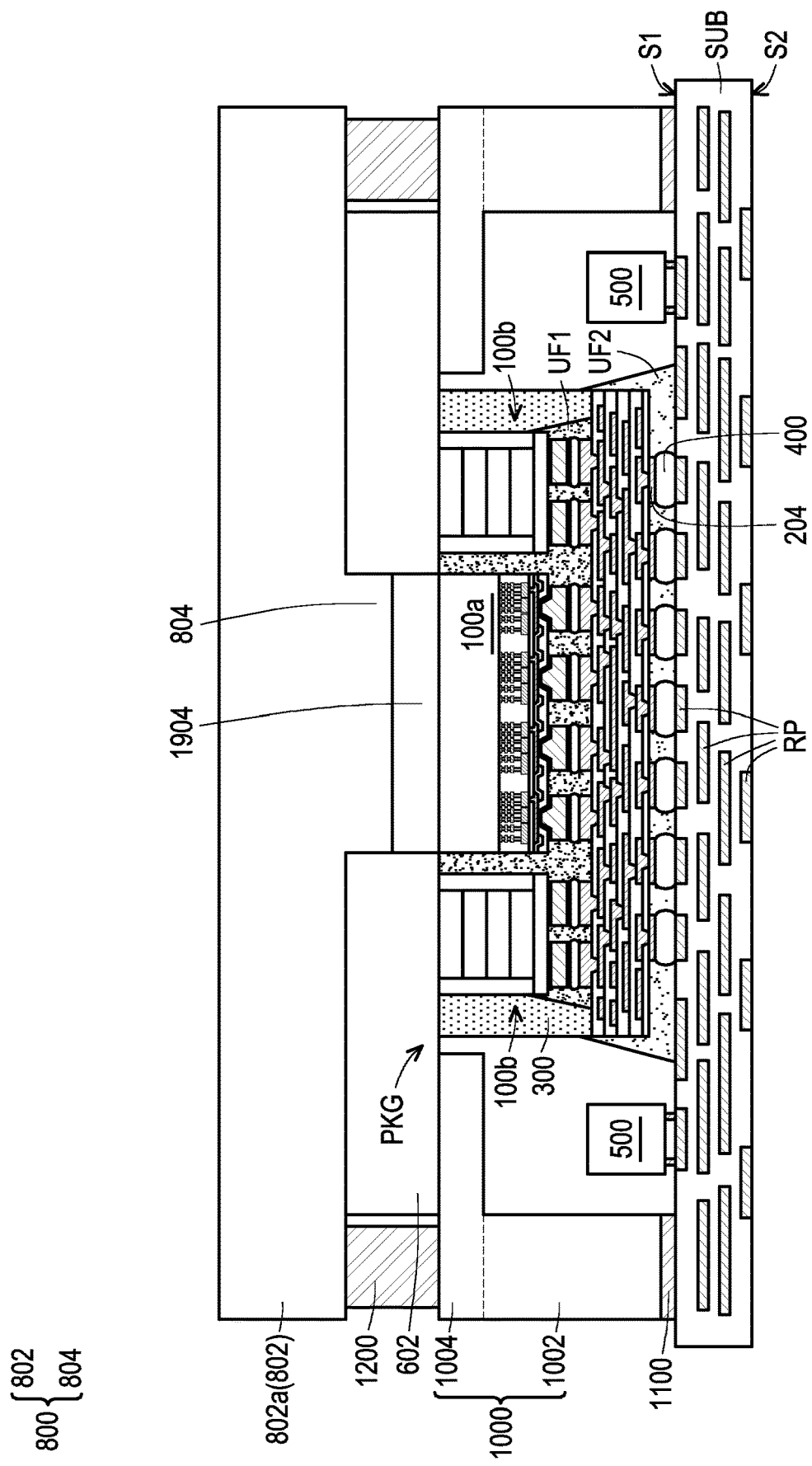

Referring to FIG. 13D, the lid structure 800 is attached to the stiffener ring 1000 and the package structure PKG such that the non-metallic TIM layer 602 is located between the stiffener ring 1000 and the lid structure 800, and the metallic TIM layer 1904 is located between the package structure PKG and the lid structure 800. The lid structure 800 shown in FIG. 13D includes the cover portion 802a and the protruding portion 804 without including the leg portion 802b. As such, as shown in FIG. 13D, the lid structure 800 is securely fixed onto the stiffener ring 1000 through attaching the cover portion 802a to the adhesive layer 1200.

Figure 13E:
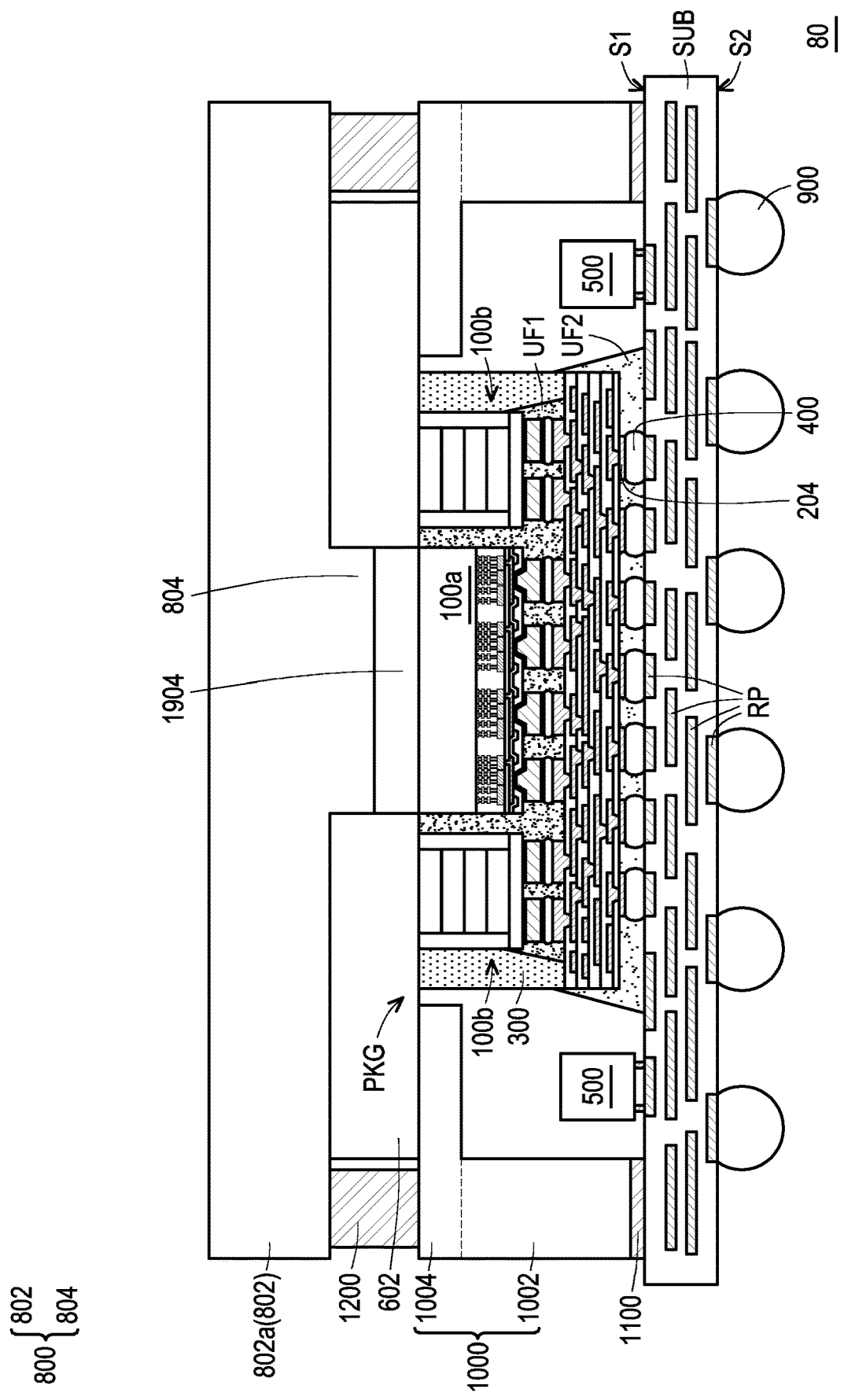

Referring to FIG. 13E, after the lid structure 800 is attached to the stiffener ring 1000, the conductive terminals 900 are formed on the second surface S2 of the substrate SUB to obtain the semiconductor device 80. In the semiconductor device 80, the lid structure 800 is attached to the substrate SUB through the adhesive layer 1200, the stiffener ring 1000 and the adhesive layer 1100. With such configuration, it is noted that the reliability of the semiconductor device 80 is improved.

FIG. 14A to FIG. 14E are schematic cross-sectional views illustrating a manufacturing process of a semiconductor device 90 in accordance with some alternative embodiments of the disclosure. The elements similar to or substantially the same as the elements described previously will use the same reference numbers, and certain details or descriptions (e.g., the materials, formation processes, positioning configurations, etc.) of the same elements would not be repeated herein.

Figure 14A:
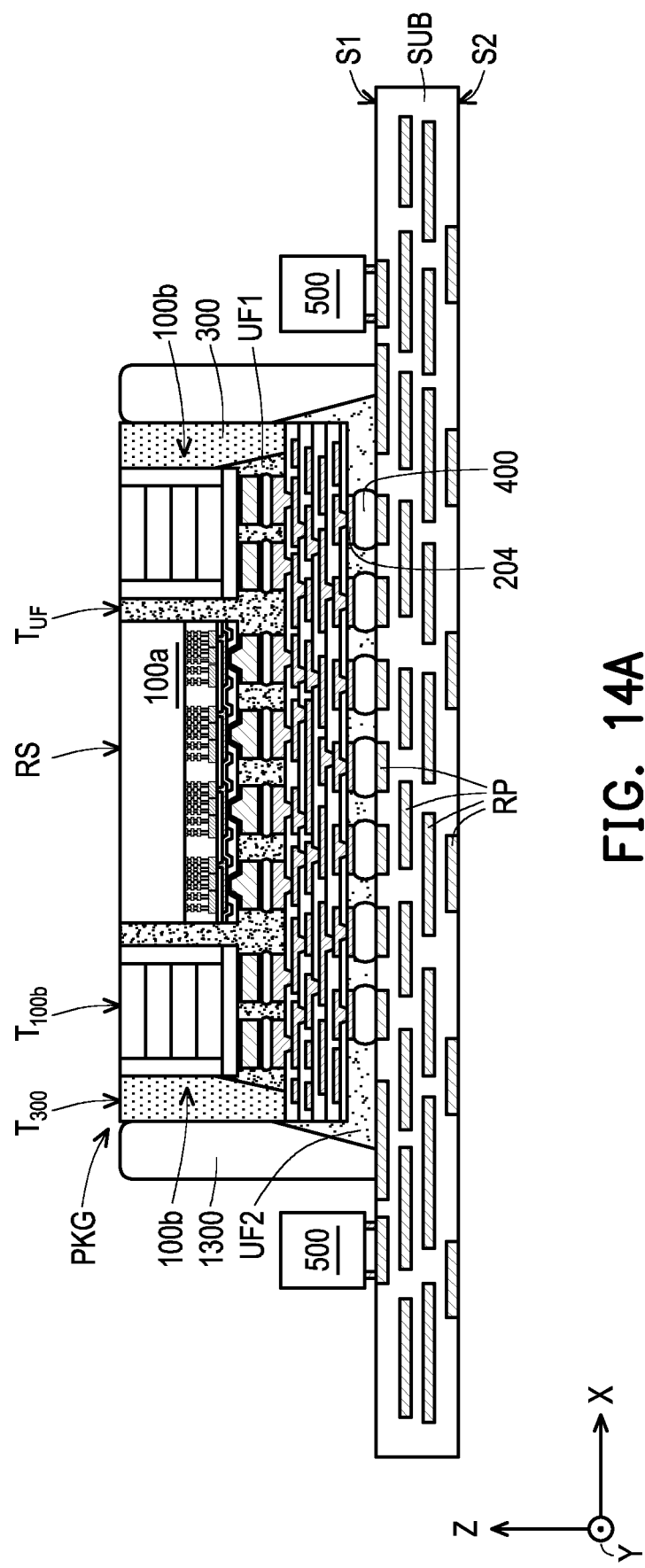
FIG. 14A to FIG. 14E are schematic cross-sectional views illustrating a manufacturing process of a semiconductor device in accordance with some alternative embodiments of the disclosure.

Referring to FIG. 14A, a structure same as the structure of FIG. 12A is provided. Details or descriptions (e.g., the materials, formation processes, positioning configurations, etc.) of the substrate SUB, the package structure PKG, the underfill layer UF2 and the surface devices 500 have been described in conjunction with FIG. 4A and FIG. 12A above, and will not be iterated herein again. Accordingly, for details or descriptions of the substrate SUB, the package structure PKG, the underfill layer UF2 and the surface devices 500 not iterated herein, please refer to the aforesaid embodiments.

Continued on FIG. 14A, the gel ring 1300 is formed on the substrate SUB. In detail, as shown in FIG. 14A, the top surface of the gel ring 1300 is substantially coplanar with the top surface of the package structure PKG. That is to say, the top surface of the gel ring 1300 is substantially coplanar with the top surface $T_{300}$ of the encapsulant 300, the rear surface RS of the semiconductor substrate 110, the top surfaces $T_{100b}$ of the semiconductor dies 100b and the top surface $T_{UF1}$ of the underfill layer UF1. However, the disclosure is not limited thereto. In some alternative embodiments, the top surface of the gel ring 1300 may be located at a level height higher than or lower than that of the top surface of the package structure PKG.

Figure 14B:
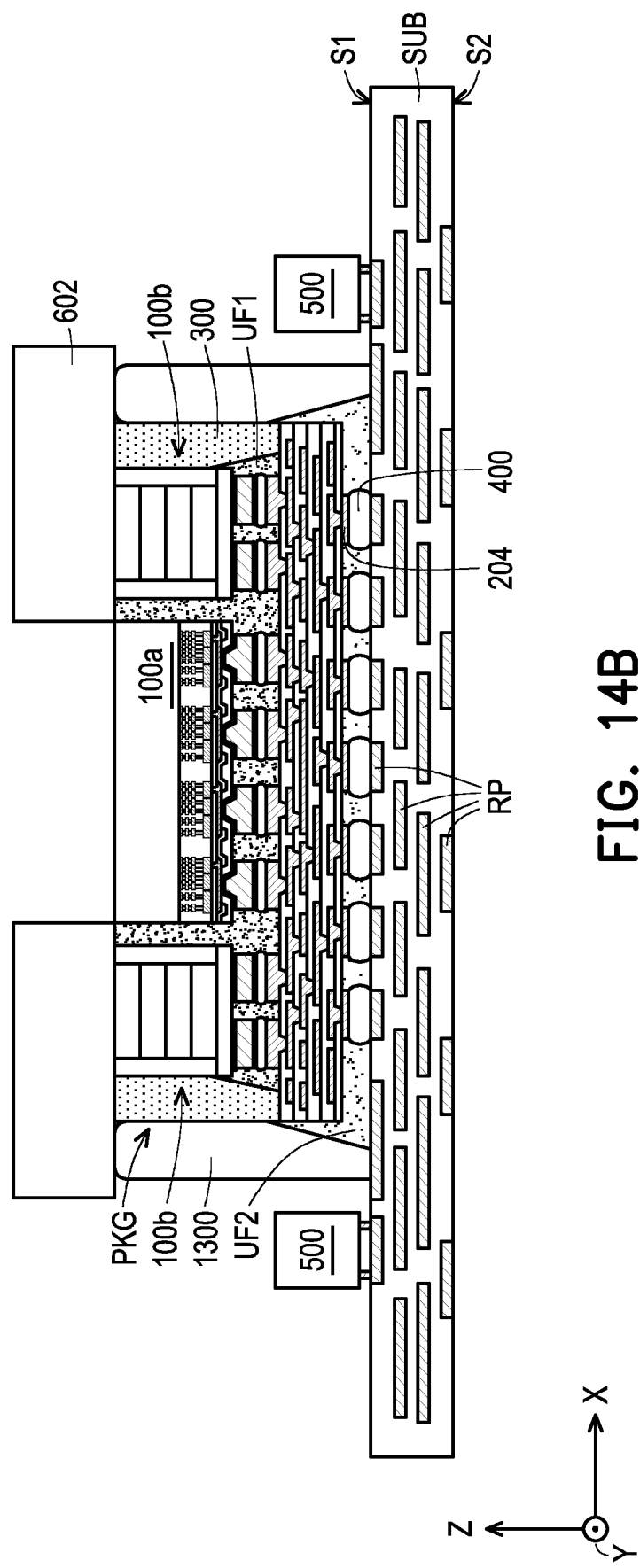

Referring to FIG. 14B, after the gel ring 1300 is provided on the substrate SUB, the non-TIM layer 602 is formed. In some embodiments, as shown in FIG. 14B, the non-TIM layer 602 is in physical contact with the package structure PKG. In some embodiments, as shown in FIG. 14B, the non-TIM layer 602 is in contact with the gel ring 1300. For example, as shown in FIG. 9B, the non-TIM layer 602 is in physical contact with the top surface of the gel ring 1300. From another point of view, as shown in FIG. 14B, the outer side surface of the non-metallic TIM layer 602 is laterally spaced a distance from the outer side surface of the encapsulant 300 in the package structure PKG. It is noted that by arranging the gel ring 1300, the non-metallic TIM layer 602 can extend laterally past the outer side surface of the package structure PKG. That is to say, the gel ring 1300 provides a wider process window for forming the non-metallic TIM layer 602. Further, as shown in FIG. 14B, the non-metallic TIM layer 602 extends laterally past the outer side surface of the gel ring 1300. However, the disclosure is not limited to. In some alternative embodiments, the outer side surface of the non-metallic TIM layer 602 may be substantially aligned with the outer side surface of the gel ring 1300.

Figure 14C:
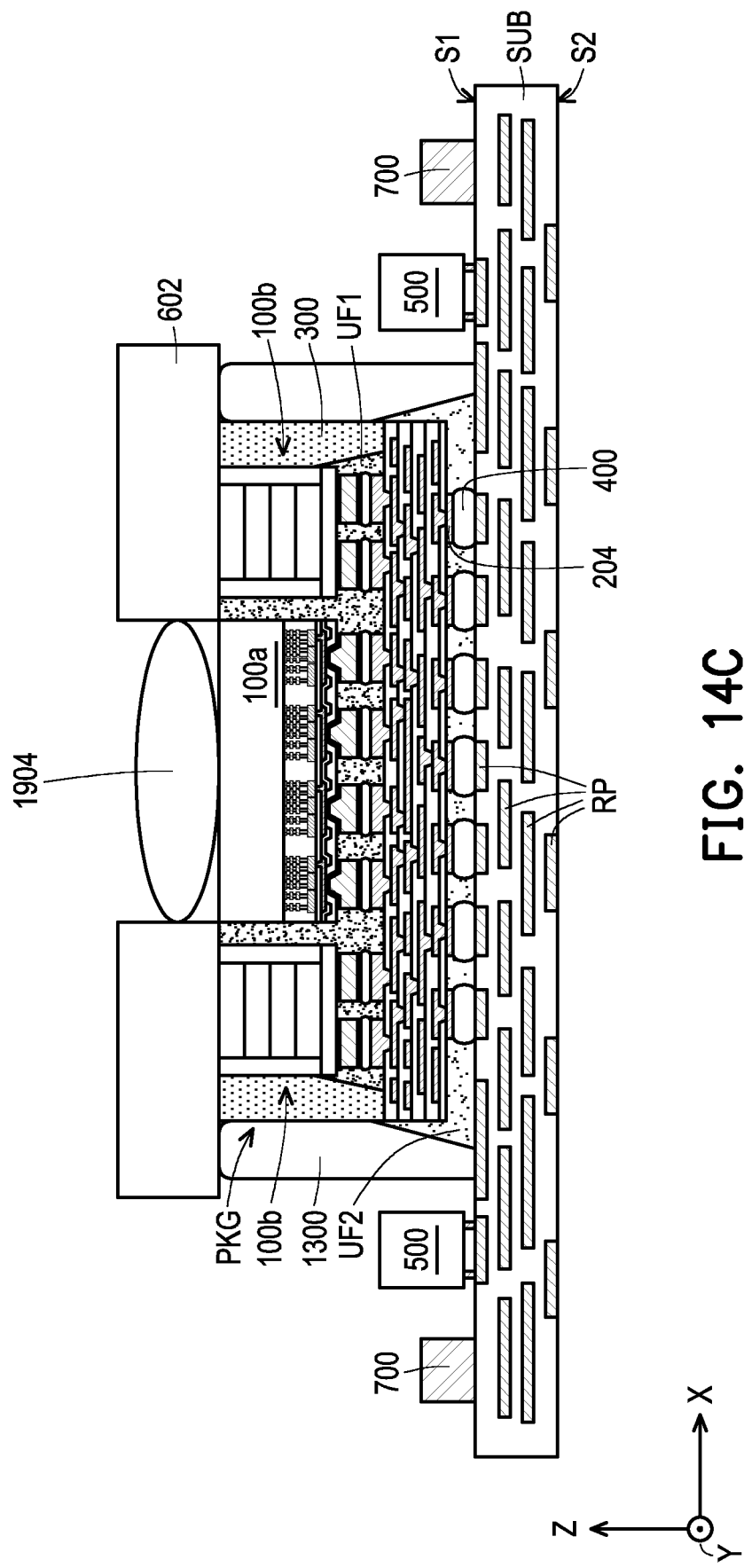

Referring to FIG. 14C, after the non-metallic TIM layer 602 is formed, the metallic TIM layer 1904 is formed on the package structure PKG, an then the adhesive layer 700 is formed on the first surface S1 of the substrate SUB.

Figure 14D:
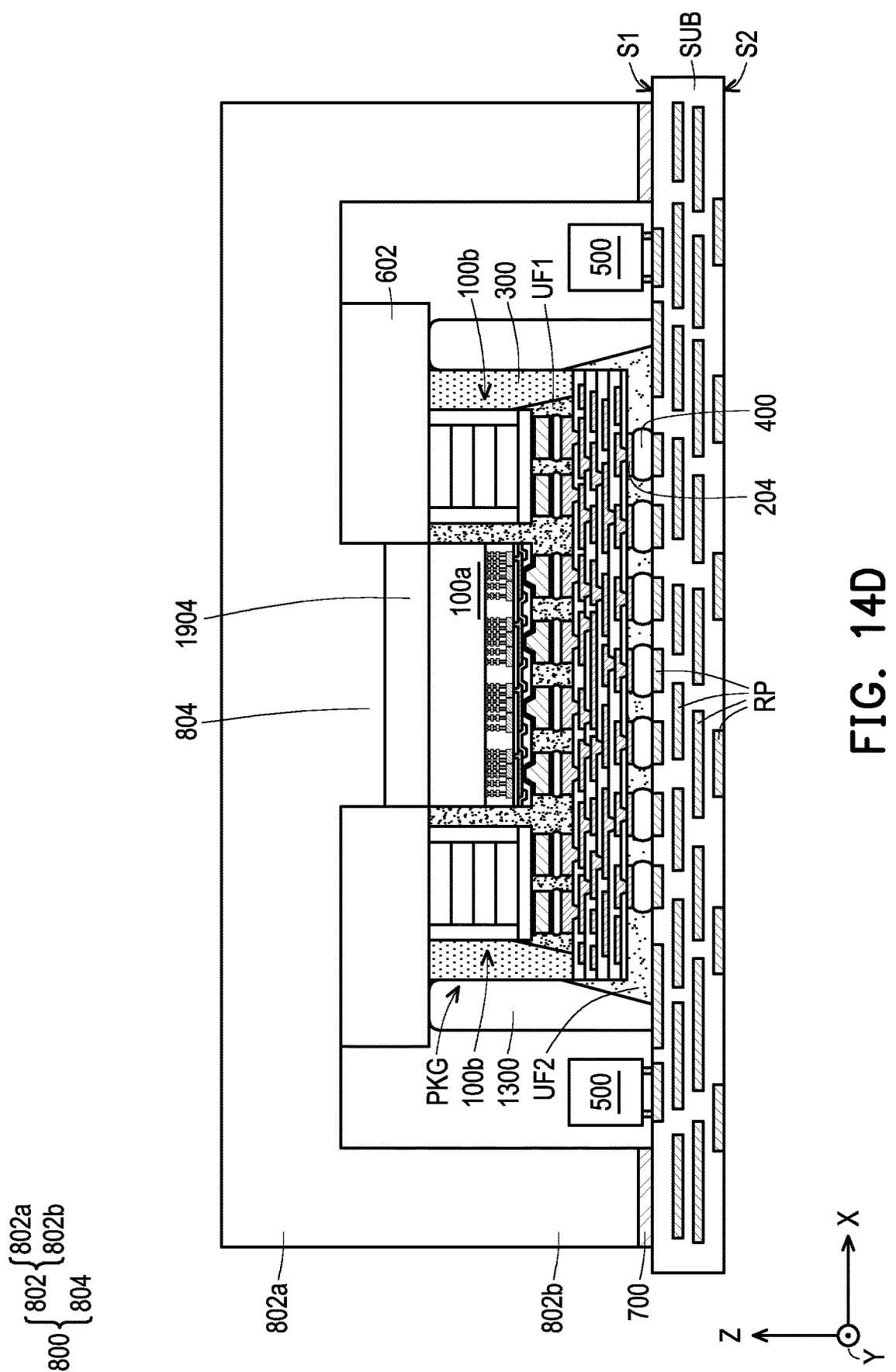

Referring to FIG. 14D, after the metallic TIM layer 1904 and the adhesive layer 700 are provided, the lid structure 800 is attached to the substrate SUB through the adhesive layer 700 and attached to the package structure PKG through the metallic TIM layer 1904 and the non-metallic TIM layer 602.

Figure 14E:
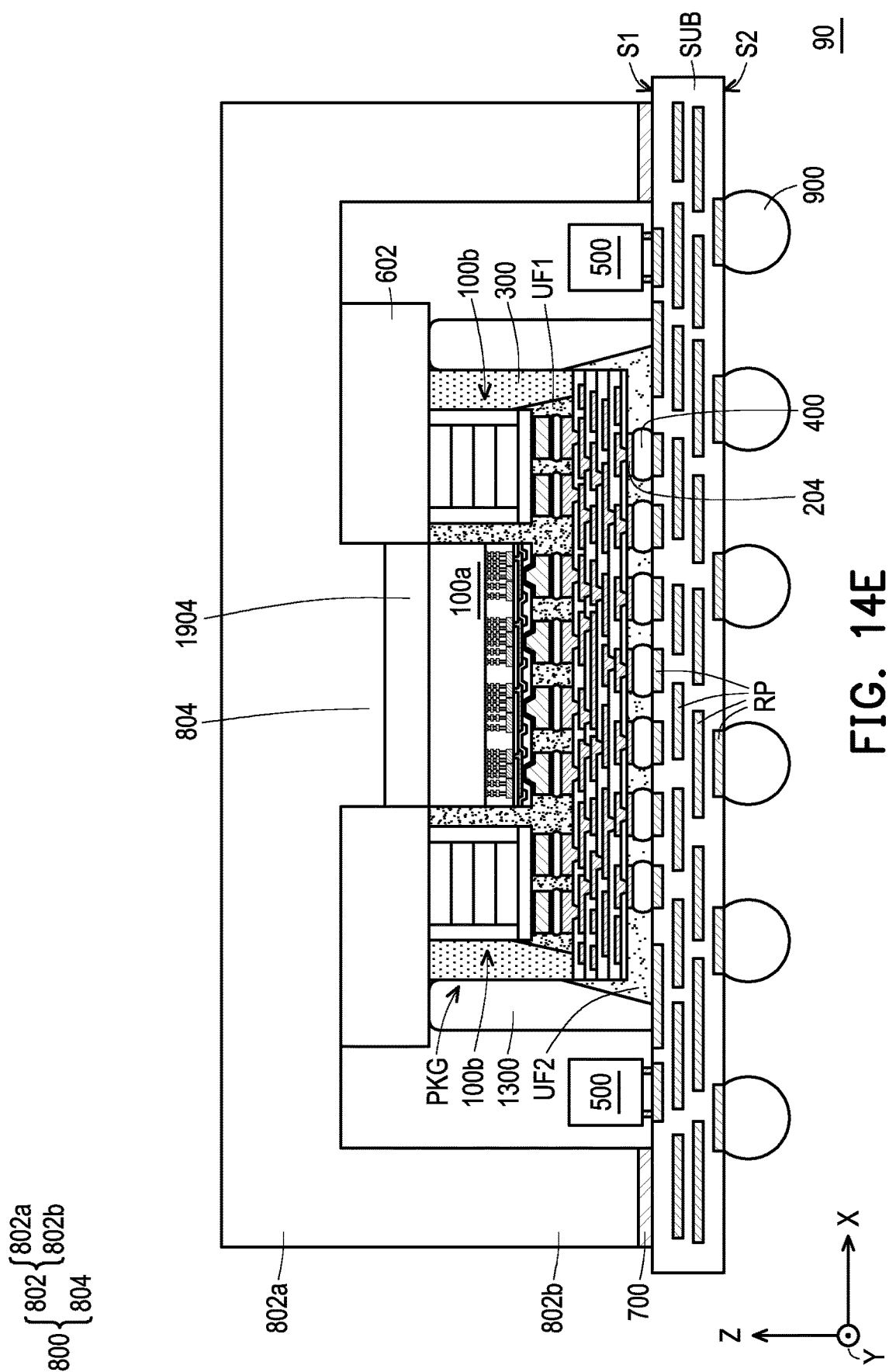

Referring to FIG. 14E, after the lid structure 800 is provided, the conductive terminals 900 are formed on the second surface S2 of the substrate SUB to obtain the semiconductor device 90.

FIG. 15A to FIG. 15E are schematic cross-sectional views illustrating a manufacturing process of a semiconductor device 100 in accordance with some alternative embodiments of the disclosure. The elements similar to or substantially the same as the elements described previously will use the same reference numbers, and certain details or descriptions (e.g., the materials, formation processes, positioning configurations, etc.) of the same elements would not be repeated herein.

Figure 15A:
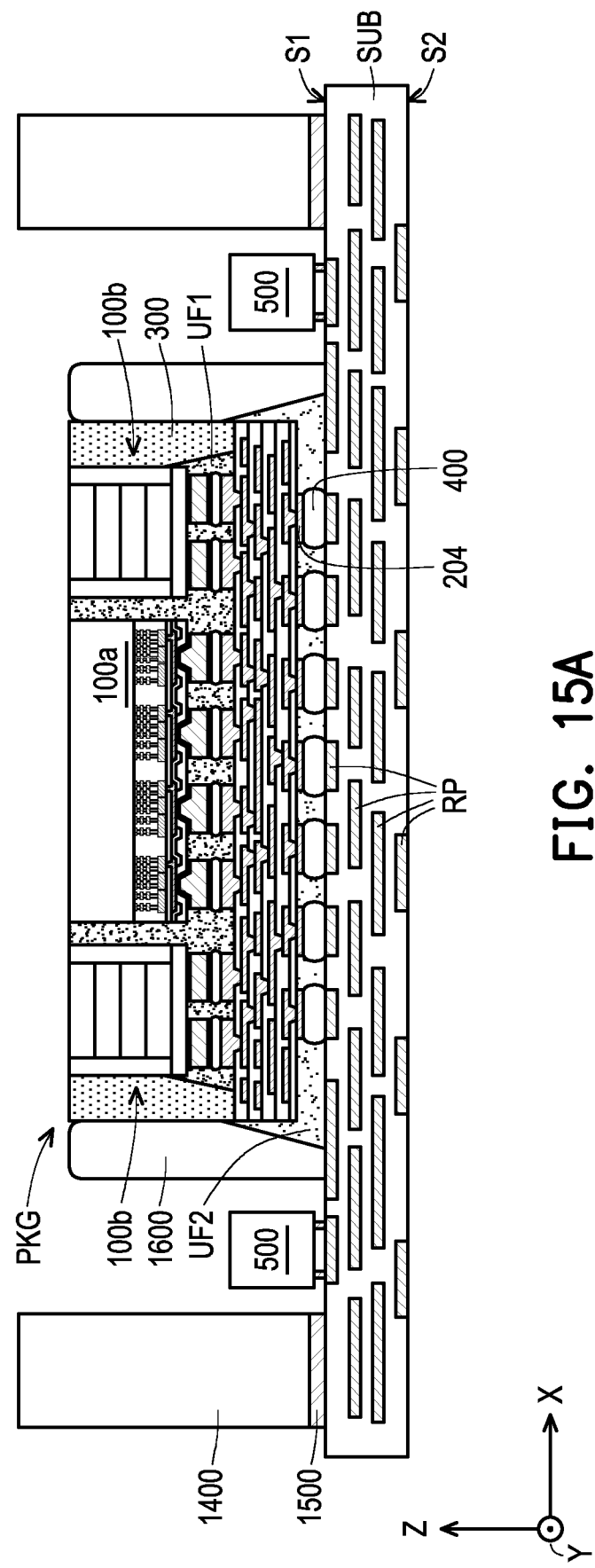
FIG. 15A to FIG. 15E are schematic cross-sectional views illustrating a manufacturing process of a semiconductor device in accordance with some alternative embodiments of the disclosure.

Referring to FIG. 15A, a structure same as the structure of FIG. 12A is provided. Details or descriptions (e.g., the materials, formation processes, positioning configurations, etc.) of the substrate SUB, the package structure PKG, the underfill layer UF2 and the surface devices 500 have been described in conjunction with FIG. 4A and FIG. 12A above, and will not be iterated herein again. Accordingly, for details or descriptions of the substrate SUB, the package structure PKG, the underfill layer UF2 and the surface devices 500 not iterated herein, please refer to the aforesaid embodiments.

Continued on FIG. 15A, the stiffener ring 1400 is attached to the substrate SUB through the adhesive layer 1500. In detail, as shown in FIG. 15A, the top surface of the stiffener ring 1400 is located at a level height higher than the top surface of the package structure PKG.

Still continued on FIG. 15A, the gel ring 1600 is formed on the substrate SUB. In detail, as shown in FIG. 15A, the top surface of the gel ring 1600 is substantially coplanar with the top surface of the package structure PKG. However, the disclosure is not limited thereto. In some alternative embodiments, the top surface of the gel ring 1600 may be located at a level height higher than or lower than that of the top surface of the package structure PKG.

Figure 15B:
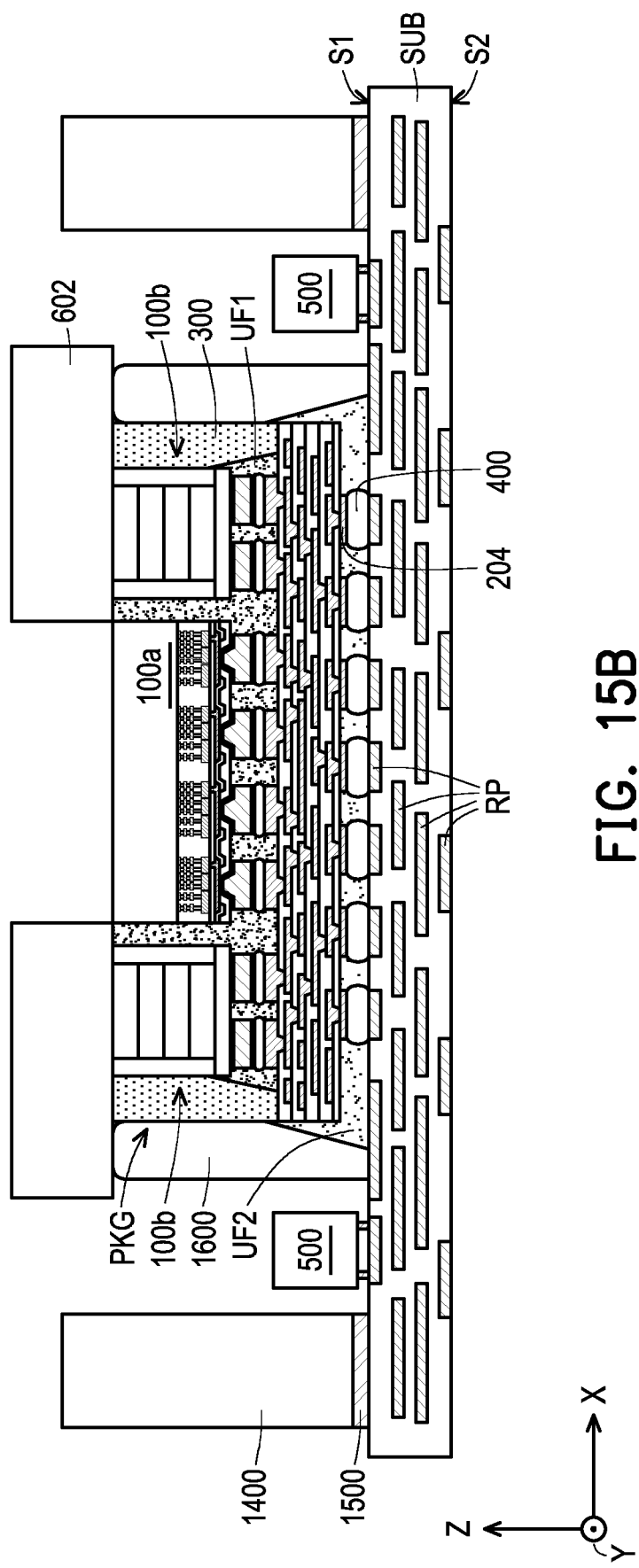

Referring to FIG. 15B, after the stiffener ring 1400 and the gel ring 1600 are provided on the substrate SUB, the non-TIM layer 602 is formed. In some embodiments, as shown in FIG. 15B, the non-TIM layer 602 is in physical contact with the package structure PKG. In some embodiments, as shown in FIG. 15B, the non-TIM layer 602 is in contact with the gel ring 1600. For example, as shown in FIG. 15B, the non-TIM layer 602 is in physical contact with the top surface of the gel ring 1600. From another point of view, as shown in FIG. 15B, the outer side surface of the non-metallic TIM layer 602 is laterally spaced a distance from the outer side surface of the encapsulant 300 in the package structure PKG. It is noted that by arranging the gel ring 1600, the non-metallic TIM layer 602 can extend laterally past the outer side surface of the package structure PKG. That is to say, the gel ring 1600 provides a wider process window for forming the non-metallic TIM layer 602. Further, as shown in FIG. 15B, the non-metallic TIM layer 602 extends laterally past the outer side surface of the gel ring 1600. However, the disclosure is not limited to. In some alternative embodiments, the outer side surface of the non-metallic TIM layer 602 may be substantially aligned with the outer side surface of the gel ring 1600.

Figure 15C:
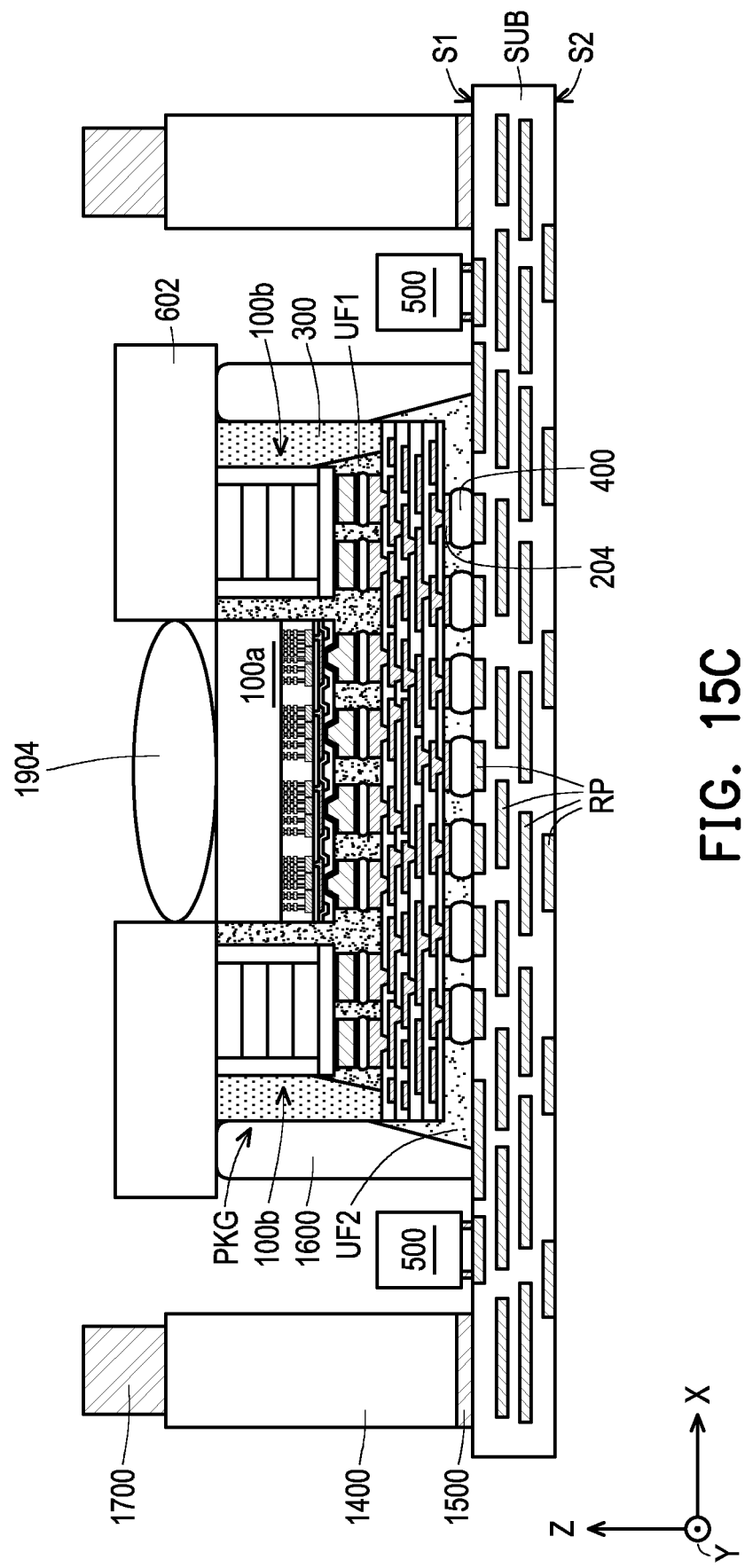

Referring to FIG. 15C, after the non-metallic TIM layer 602 is formed, the metallic TIM layer 1904 is formed on the package structure PKG, and then the adhesive layer 1700 is formed on the stiffener ring 1400. In some embodiments, the adhesive layer 1700 is disposed on the top surface of the stiffener ring 1400 to surround the non-metallic TIM layer 602 and the metallic TIM layer 1904.

Figure 15D:
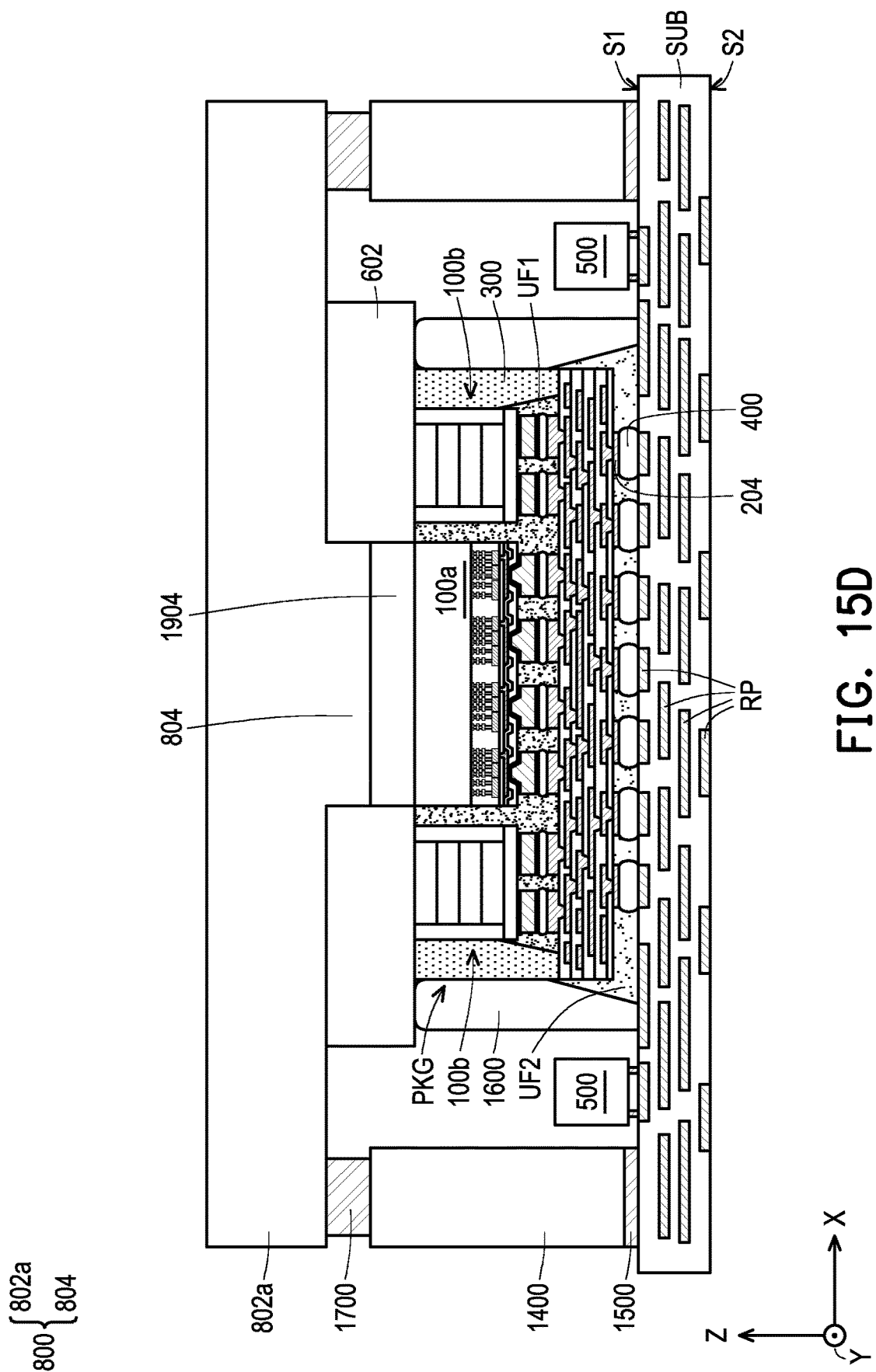

Referring to FIG. 15D, the lid structure 800 is attached to the stiffener ring 1400 and the package structure PKG such that the non-metallic TIM layer 602 and the metallic TIM layer 1904 are located between the package structure PKG and the lid structure 800. The lid structure 800 shown in FIG. 15D includes the cover portion 802*a* and the protruding portion 804 without including the leg portion 802*b*. As such, as shown in FIG. 15D, the lid structure 800 is securely fixed onto the stiffener ring 1400 through attaching the cover portion 802*a* to the adhesive layer 1700.

Figure 15E:
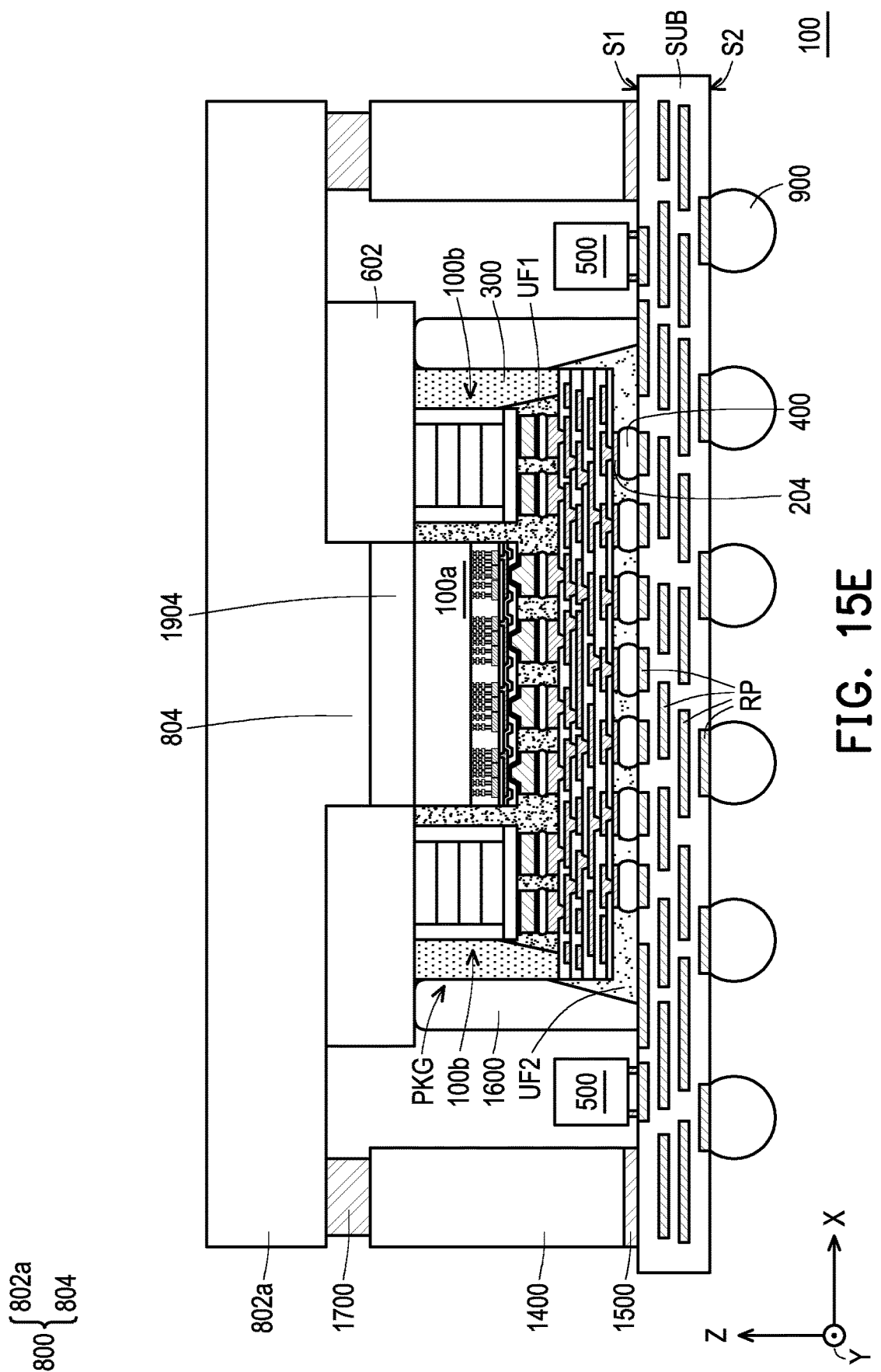

Referring to FIG. 15E, after the lid structure 800 is attached to the stiffener ring 1400, the conductive terminals 900 are formed on the second surface S2 of the substrate SUB to obtain the semiconductor device 100. In the semiconductor device 100, the lid structure 800 is attached to the substrate SUB through the adhesive layer 1700, the stiffener ring 1400 and the adhesive layer 1500. With such configuration, it is noted that the reliability of the semiconductor device 100 is improved.

Figure 16:
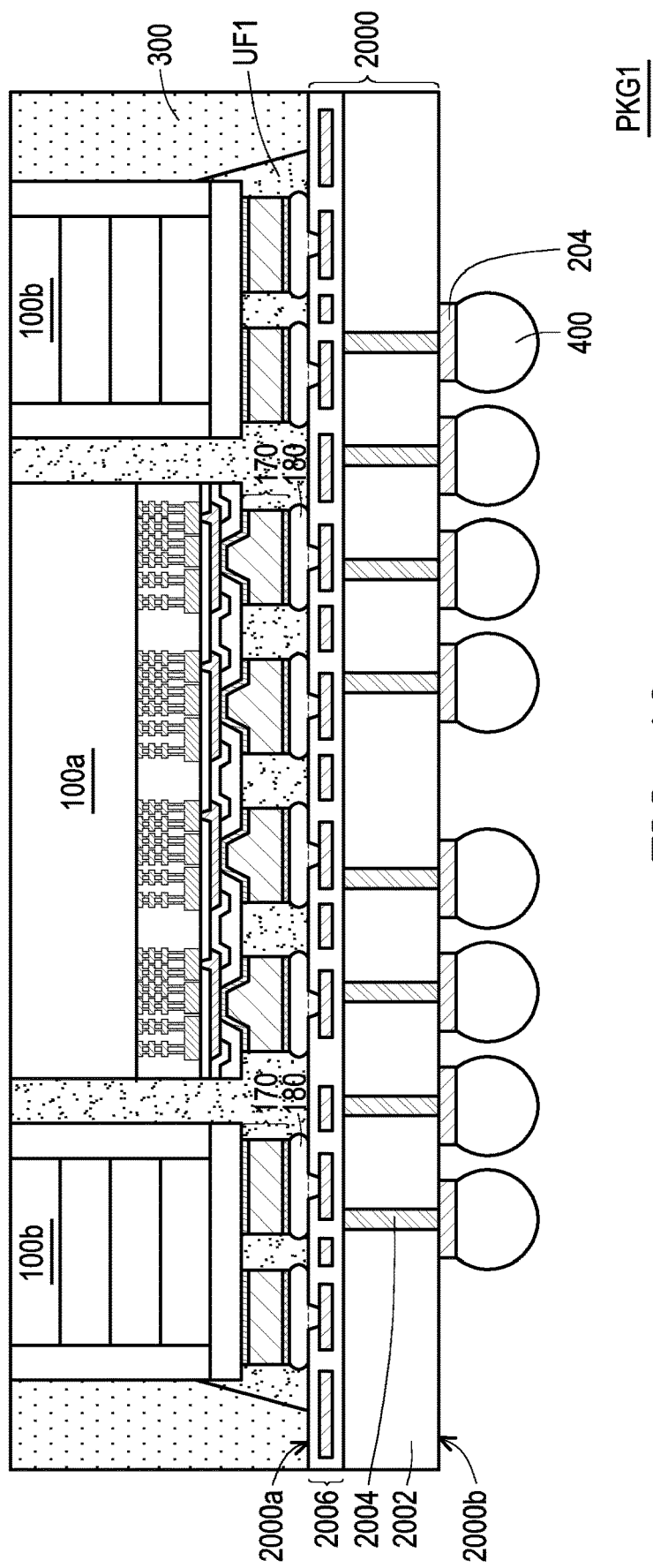
FIG. 16 is a schematic cross-sectional view of a package structure in accordance with some alternative embodiments of the disclosure.

FIG. 16 is a schematic cross-sectional view of a package structure PKG1 in accordance with some alternative embodiments of the disclosure. The package structure PKG1 illustrated in FIG. 16 is similar to the package structure PKG illustrated in FIG. 2F, hence the same reference numerals are used to refer to the same or liked parts, and its detailed description will be omitted herein. The difference between the package structure PKG1 illustrated in FIG. 16 and the package structure PKG illustrated in FIG. 2F lies in that, the interposer 200 of the package structure PKG is an organic interposer, while the interposer 2000 of the package structure PKG1 is a silicon interposer. The silicon interposer is beneficial to integrate one or more passive devices (e.g., capacitors) into the package structure. In some embodiments, the one or more passive devices are embedded and buried in the silicon interposer upon the design requirements.

In some embodiments, the interposer 2000 includes a substrate 2002, through substrate vias 2004 and a conductive structure 2006. The substrate 2002 may include elementary semiconductor such as silicon. The substrate 2002 may be doped as needed. The through substrate vias 2004 (also called "through silicon vias" in some examples) extend from a side (e.g., front side) of the substrate 2002 toward another side (e.g., back side) of the substrate 2002.

In some embodiments, the conductive structure 2006 is optionally disposed over the substrate 2002. In some embodiments, the conductive structure 2006 includes dielectric layers and conductive features embedded in the dielectric layers. The conductive features include metal lines, metal vias, metal pads and/or metal connectors. In some embodiments, the material of each conductive feature includes Cu, Al, Ti, Ta, W, Ru, Co, Ni, the like, or a combination thereof. In some embodiments, a seed layer and/or a barrier layer may be disposed between each conductive feature and the adjacent dielectric layer. The seed layer may include Ti/Cu. The barrier layer may include Ta, TaN, Ti, TiN, CoW or a combination thereof. In some embodiments, the material of each dielectric layer includes silicon oxide, silicon nitride, silicon oxynitirde, SiOC, the like, or a combination thereof. An etching stop layer may be interposed between two adjacent dielectric layers. The dielectric layers of the first conductive structure 2006 may be replaced by polymer layers or insulating layers as needed. In some embodiments, each polymer layer includes a photosensitive material such as PBO, polyimide (PI), BCB, the like, or a combination thereof.

In some embodiments, the interposer 2000 is an active interposer that contains at least one functional device or integrated circuit device included in the conductive structure 2006. Such active interposer is referred to as a "device-containing silicon interposer" in some examples. In some embodiments, the functional device includes an active device, a passive device, or a combination thereof. The functional device includes, for example but not limited to, transistors, capacitors, resistors, diodes, photodiodes, fuse devices and/or other similar components. In other embodiments, the interposer 2000 is a passive interposer, which is used to convey a lack of a functional device or integrated circuit device. Such passive interposer is referred to as a "device-free silicon interposer" in some examples.

In some embodiments, as shown in FIG. 16, the conductive terminals 180 of the semiconductor die 100*a* and the semiconductor dies 100*b* are bonded to the exposed conductive features of the conductive structure 2006 at the surface 2000*a* (i.e., the illustrated top surface) of the interposer 2000 to render electrical connection between the semiconductor die 100*a* and the interposer 200 and electrical connection between the semiconductor dies 100*b* and the interposer 200. In some embodiments, as shown in FIG. 16, the conductive pattern layer 204 and the conductive terminals 400 are arranged on the surface 2000*b* (i.e., the illustrated bottom surface) of the interposer 2000 opposite to the surface 2000*a*. Further, in some embodiments, as shown in FIG. 16, the conductive pattern layer 204 and the conductive terminals 400 are electrically connected with the exposed through substrate vias 2004 at the surface 200*b*.

In accordance with an embodiment, a semiconductor device includes a substrate; a package structure disposed on the substrate; a thermal interface material (TIM) structure disposed on the package structure, wherein the TIM structure comprises a metallic TIM layer and a non-metallic TIM layer in contact with the metallic TIM layer, the non-metallic TIM layer surrounds the metallic TIM layer; and a lid structure disposed on the substrate and the TIM structure.

In accordance with an embodiment, a semiconductor device includes a substrate; a package structure disposed on the substrate; a lid structure disposed over a rear surface of the package structure face away from the substrate; and a thermal interface material (TIM) structure, sandwiched between the rear surface of the package structure and the lid structure, wherein the lid structure is thermally coupled to the package structure through the TIM structure, and the TIM structure comprises: a metallic portion disposed on the package structure; and a non-metallic portion surrounding the metallic portion, wherein a thermal conductivity of the metallic portion is higher from a thermal conductivity of the non-metallic portion.

In accordance with an embodiment, a manufacturing method of a semiconductor device includes providing a substrate; bonding a package structure to the substrate; forming a non-metallic TIM layer having at least one opening on the package structure; forming a metallic TIM layer into the at least one opening of the non-metallic TIM layer; forming an adhesive layer over the substrate; placing a lid structure on the adhesive layer, the non-metallic TIM layer and the metallic TIM layer; and attaching the lid structure to the substrate and the package structure through the adhesive layer, the non-metallic TIM layer and the metallic TIM layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a package structure disposed on the substrate;
a thermal interface material (TIM) structure disposed on the package structure, wherein the TIM structure comprises a metallic TIM layer and a non-metallic TIM layer in contact with the metallic TIM layer, the non-metallic TIM layer surrounds the metallic TIM layer, and a thickness of the non-metallic TIM layer is different from a thickness of the metallic TIM layer; and
a lid structure disposed on the substrate and the TIM structure.

2. The semiconductor device of claim 1, wherein the package structure comprises a semiconductor die and an encapsulant encapsulating the semiconductor die, wherein the metallic TIM layer is overlapped with the semiconductor die, and the non-metallic TIM layer is overlapped with the encapsulant.

3. The semiconductor device of claim 2, wherein a vertical projection of the metallic TIM layer onto the substrate is partially overlapped with a vertical projection of the semiconductor die onto the substrate.

4. The semiconductor device of claim 2, wherein a vertical projection of the metallic TIM layer onto the substrate is completely overlapped with a vertical projection of the semiconductor die onto the substrate.

5. The semiconductor device of claim 2, wherein an outer side surface of the non-metallic TIM layer is aligned with an outer side surface of the encapsulant.

6. The semiconductor device of claim 2, wherein an outer side surface of the non-metallic TIM layer is laterally spaced a distance from an outer side surface of the encapsulant.

7. The semiconductor device of claim 1, wherein the non-metallic TIM layer has at least one opening, and the metallic TIM layer is disposed in the at least one opening.

8. The semiconductor device of claim 7, wherein the lid structure includes at least one protruding portion extending into the at least one opening of the non-metallic TIM layer where the metallic TIM layer is disposed.

9. The semiconductor device of claim 1, wherein at least one side surface of the metallic TIM layer is a vertical side surface, a tilt side surface, a convex side surface or a concave side surface.

10. A semiconductor device, comprising:
a substrate;
a package structure disposed on the substrate;
a lid structure disposed over a rear surface of the package structure face away from the substrate; and
a thermal interface material (TIM) structure, sandwiched between the rear surface of the package structure and the lid structure, wherein the lid structure is thermally coupled to the package structure through the TIM structure, and the TIM structure comprises:
a metallic portion disposed on the package structure; and
a non-metallic portion surrounding the metallic portion, wherein a thermal conductivity of the metallic portion is higher from a thermal conductivity of the non-metallic portion, and a thickness of the non-metallic TIM layer is different from a thickness of the metallic TIM layer.

11. The semiconductor device of claim 10, wherein the package structure comprises:
a first semiconductor die and a second semiconductor die disposed aside the first semiconductor die;
an encapsulant encapsulating the first semiconductor die and the second semiconductor die; and
an interposer, disposed on the encapsulant and electrically coupled to the first semiconductor die and the second semiconductor die, wherein the encapsulant is disposed between the interposer and the TIM structure.

12. The semiconductor device of claim 11, wherein the first semiconductor die comprises a logic die, the second semiconductor die comprises a memory die, a vertical projection of the first metallic of the TIM structure onto the substrate is overlapped with a vertical projection of the first semiconductor die onto the substrate, and a vertical projection of the non-metallic portion of the TIM structure onto the substrate is overlapped with a vertical projection of the second semiconductor die onto the substrate.

13. The semiconductor device of claim 10, further comprising a stiffener ring disposed on the substrate and under the lid structure, and surrounding the package structure.

14. The semiconductor device of claim 13, wherein a portion of the stiffener ring is in contact with the non-metallic portion of the TIM structure.

15. The semiconductor device of claim 10, further comprising a gel ring disposed on the substrate and surrounding the package structure, wherein a top surface of the gel ring is in contact with the non-metallic portion of the TIM structure.

16. The semiconductor device of claim 10, further comprising a backside metal layer, wherein the backside metal layer is disposed between the package structure and the metallic portion of the TIM structure or disposed between the metallic portion of the TIM structure and the lid structure.

17. The semiconductor device of claim 16, further comprising an inter-metallic compound (IMC) layer disposed between the backside metal layer and the metallic portion of the TIM structure.

18. The semiconductor device of claim 10, further comprising inter-metallic compound (IMC) structures distributing within the metallic portion of the TIM structure.

19. A manufacturing method of a semiconductor device, comprising:
providing a substrate;
bonding a package structure to the substrate;
forming a non-metallic TIM layer having at least one opening on the package structure;

forming a metallic TIM layer into the at least one opening of the non-metallic TIM layer, wherein a thickness of the non-metallic TIM layer is different from a thickness of the metallic TIM layer;

forming an adhesive layer over the substrate;

placing a lid structure on the adhesive layer, the non-metallic TIM layer and the metallic TIM layer; and attaching the lid structure to the substrate and the package structure through the adhesive layer, the non-metallic TIM layer and the metallic TIM layer.

20. The method of claim 19, wherein forming a non-metallic TIM layer comprises performing a lamination process, a pick-and-place process, or a dispensing process, and forming a metallic TIM layer includes performing a pick-and-place process, or a dispensing process.

* * * * *